(12) United States Patent
Xia

(10) Patent No.: US 10,957,869 B2
(45) Date of Patent: Mar. 23, 2021

(54) ORGANIC LUMINESCENT MATERIALS CONTAINING CYCLOALKYL ANCILLARY LIGANDS

(71) Applicant: BEIJING SUMMER SPROUT TECHNOLOGY CO., LTD., Beijing (CN)

(72) Inventor: Chuanjun Xia, Lawrenceville, NJ (US)

(73) Assignee: BEIJING SUMMER SPROUT TECHNOLOGY CO., LTD., Beijing (CN)

( * ) Notice: Subject to any disclaimer, the term of this patent is extended or adjusted under 35 U.S.C. 154(b) by 265 days.

(21) Appl. No.: 16/044,534

(22) Filed: Jul. 25, 2018

(65) Prior Publication Data
US 2019/0103574 A1    Apr. 4, 2019

Related U.S. Application Data

(60) Provisional application No. 62/566,233, filed on Sep. 29, 2017.

(51) Int. Cl.
| | |
|---|---|
| *H01L 51/50* | (2006.01) |
| *H01L 51/00* | (2006.01) |
| *C09K 11/06* | (2006.01) |
| *C07F 13/00* | (2006.01) |
| *C07F 15/00* | (2006.01) |

(52) U.S. Cl.
CPC ......... *H01L 51/5016* (2013.01); *C07F 13/00* (2013.01); *C07F 15/0033* (2013.01); *C09K 11/06* (2013.01); *H01L 51/0051* (2013.01); *H01L 51/0085* (2013.01); *H01L 51/0088* (2013.01); *H01L 51/5056* (2013.01); *H01L 51/5072* (2013.01)

(58) Field of Classification Search
None
See application file for complete search history.

(56) References Cited

U.S. PATENT DOCUMENTS

| | | |
|---|---|---|
| 5,703,436 A | 12/1997 | Forrest et al. |
| 5,707,745 A | 1/1998 | Forrest et al. |
| 5,844,363 A | 12/1998 | Gu et al. |

(Continued)

FOREIGN PATENT DOCUMENTS

| | | |
|---|---|---|
| CN | 103068833 A | 4/2013 |
| CN | 103159798 A | 6/2013 |

(Continued)

OTHER PUBLICATIONS

Lopez et al. (An. Quim. 1978, 74, p. 1561).*

(Continued)

*Primary Examiner* — Jay Yang
(74) *Attorney, Agent, or Firm* — Brown Rudnick LLP

(57) ABSTRACT

Organic luminescent materials containing cycloalkyl ancillary ligands is disclosed, which can be used as emitters in the emissive layer of an organic electroluminescent device. The organic luminescent materials is metal complexes which comprise a new series of cycloalkyl containing acetylacetone type ancillary ligands. These novel ligands can effectively improve the lifetime of the device, change the sublimation characteristics and improve device performance. Also disclosed are an electroluminescent device and a formulation.

21 Claims, 3 Drawing Sheets

(56) References Cited

U.S. PATENT DOCUMENTS

Figure 1:
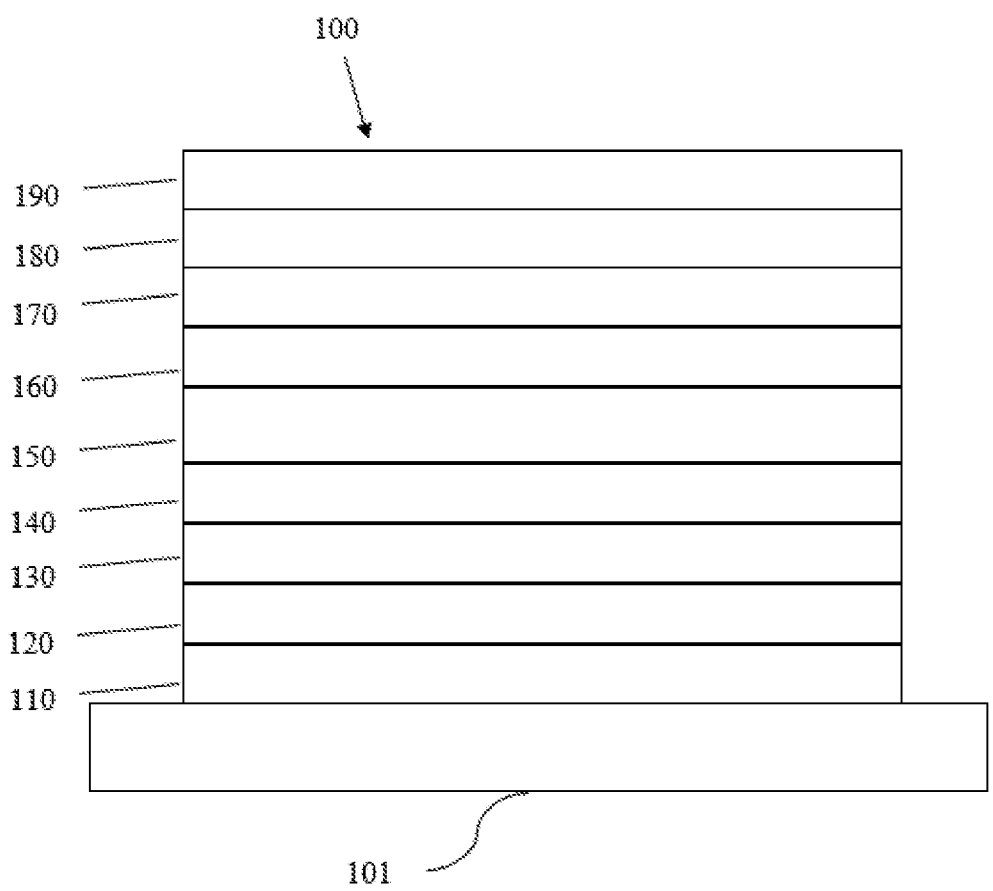

| | | | |
|---|---|---|---|
| 6,097,147 | A | 8/2000 | Baldo et al. |
| 6,303,238 | B1 | 10/2001 | Thompson et al. |
| 7,279,704 | B2 | 10/2007 | Walters et al. |
| 7,968,146 | B2 | 6/2011 | Wagner et al. |
| 9,929,353 | B2 | 3/2018 | Kottas et al. |
| 10,038,151 | B2 | 7/2018 | Boudreault et al. |
| 10,454,046 | B2 | 10/2019 | Ma et al. |
| 2003/0230980 | A1 | 12/2003 | Forrest et al. |
| 2004/0174116 | A1 | 9/2004 | Lu et al. |
| 2010/0001637 | A1* | 1/2010 | Satou ................. H01L 51/5265 313/504 |
| 2013/0146848 | A1 | 6/2013 | Ma et al. |
| 2015/0001472 | A1 | 1/2015 | Boudreault et al. |
| 2015/0287933 | A1* | 10/2015 | Kottas ................. H01L 51/0085 257/40 |
| 2015/0349273 | A1 | 12/2015 | Hung et al. |
| 2016/0093808 | A1 | 3/2016 | Adamovich et al. |
| 2016/0190486 | A1 | 6/2016 | Lin et al. |
| 2016/0336520 | A1 | 11/2016 | Boudreault et al. |
| 2016/0359122 | A1 | 12/2016 | Boudreault et al. |
| 2017/0098789 | A1 | 4/2017 | Boudreault et al. |
| 2018/0190914 | A1 | 7/2018 | Tsai et al. |
| 2018/0287070 | A1 | 10/2018 | Ji et al. |
| 2019/0341564 | A1 | 11/2019 | Boudreault et al. |
| 2019/0389891 | A1 | 12/2019 | Boudreault et al. |
| 2020/0006675 | A1 | 1/2020 | Ma et al. |

FOREIGN PATENT DOCUMENTS

| | | |
|---|---|---|
| CN | 104277075 A | 1/2015 |
| CN | 104844659 A | 8/2015 |
| CN | 104974166 A | 10/2015 |
| RU | 2485163 C1 * | 11/2011 |

OTHER PUBLICATIONS

Machine English translation of Taidakov et al. (RU 2 485 163 C1). Jul. 15, 2020.*

Tang, C. W. et al., "Organic electroluminescent diodes", Applied Physics Letters, 51(12): 913-915 (1987).

Chinese Search Report issued in Chinese Application No. 2018106279312, dated Oct. 15, 2020, 2 pages.

English translation of Chinese Search Report issued in Chinese Application No. 2018106279312, dated Oct. 15, 2020, 1 page.

* cited by examiner

ORGANIC LUMINESCENT MATERIALS CONTAINING CYCLOALKYL ANCILLARY LIGANDS

This application claims the benefit of U.S. Provisional Application No. 62/566,233, filed Sep. 29, 2017, the entire content of which is incorporated herein by reference.

1 FIELD OF THE INVENTION

The present invention relates to a compound for organic electronic devices, such as organic light emitting devices. More specifically, the present invention relates to a metal complex containing cycloalkyl ancillary ligands and a formulation comprising the metal complex. More specifically, the present invention relates to a metal complex containing spiro structure ancillary ligands and a formulation comprising the metal complex.

2 BACKGROUND ART

An organic electronic device is preferably selected from the group consisting of organic light-emitting diodes (OLEDs), organic field-effect transistors (O-FETs), organic light-emitting transistors (OLETs), organic photovoltaic devices (OPVs), dye-sensitized solar cells (DSSCs), organic optical detectors, organic photoreceptors, organic field-quench devices (OFQDs), light-emitting electrochemical cells (LECs), organic laser diodes and organic plasmon emitting devices.

In 1987, Tang and Van Slyke of Eastman Kodak reported a bilayer organic electroluminescent device, which comprises an arylamine hole transporting layer and a tris-8-hydroxyquinolato-aluminum layer as the electron and emitting layer (*Applied Physics Letters,* 1987, 51 (12): 913-915). Once a bias is applied to the device, green light was emitted from the device. This invention laid the foundation for the development of modern organic light-emitting diodes (OLEDs). State-of-the-art OLEDs may comprise multiple layers such as charge injection and transporting layers, charge and exciton blocking layers, and one or multiple emissive layers between the cathode and anode. Since OLED is a self-emitting solid state device, it offers tremendous potential for display and lighting applications. In addition, the inherent properties of organic materials, such as their flexibility, may make them well suited for particular applications such as fabrication on flexible substrates.

OLED can be categorized as three different types according to its emitting mechanism. The OLED invented by Tang and van Slyke is a fluorescent OLED. It only utilizes singlet emission. The triplets generated in the device are wasted through nonradiative decay channels. Therefore, the internal quantum efficiency (IQE) of a fluorescent OLED is only 25%. This limitation hindered the commercialization of OLED. In 1997, Forrest and Thompson reported phosphorescent OLED, which uses triplet emission from heave metal containing complexes as the emitter. As a result, both singlet and triplets can be harvested, achieving 100% IQE. The discovery and development of phosphorescent OLED contributed directly to the commercialization of active-matrix OLED (AMOLED) due to its high efficiency. Recently, Adachi achieved high efficiency through thermally activated delayed fluorescence (TADF) of organic compounds. These emitters have small singlet-triplet gap that makes the transition from triplet back to singlet possible. In the TADF device, the triplet excitons can go through reverse intersystem crossing to generate singlet excitons, resulting in high IQE.

OLEDs can also be classified as small molecule and polymer OLEDs according to the forms of the materials used. Small molecule refers to any organic or organometallic material that is not a polymer. The molecular weight of a small molecule can be large as long as it has well defined structure. Dendrimers with well-defined structures are considered as small molecules. Polymer OLEDs include conjugated polymers and non-conjugated polymers with pendant emitting groups. Small molecule OLED can become a polymer OLED if post polymerization occurred during the fabrication process.

There are various methods for OLED fabrication. Small molecule OLEDs are generally fabricated by vacuum thermal evaporation. Polymer OLEDs are fabricated by solution process, such as spin-coating, ink-jet printing, and nozzle printing. Small molecule OLEDs can also be fabricated by solution process if the materials can be dissolved or dispersed in solvents.

The emitting color of an OLED can be achieved by emitter structural design. An OLED may comprise one emitting layer or a plurality of emitting layers to achieve desired spectrum. In the case of green, yellow, and red OLEDs, phosphorescent emitters have successfully reached commercialization. Blue phosphorescent emitters still suffer from non-saturated blue color, short device lifetime, and high operating voltage. Commercial full-color OLED displays normally adopt a hybrid strategy, using fluorescent blue and phosphorescent yellow, or red and green. At present, efficiency roll-off of phosphorescent OLEDs at high brightness remains a problem. In addition, it is desirable to have more saturated emitting color, higher efficiency, and longer device lifetime.

Ancillary ligands in phosphorescent material can be used to fine tune the emission wavelength, improve the sublimation properties, and improve the efficiency of the material. Existing ancillary ligands such as acetylacetone type ligands, particularly acetylacetone type ligands containing branched-chain alkyl groups, have achieved some effect in controlling properties as described above, but their properties need to be further improved to meet the increasing performance requirements. The present invention provides a new cycloalkyl containing acetylacetone type ancillary ligand.

3 SUMMARY OF THE INVENTION

The present invention aims to provide a new series of cycloalkyl containing acetylacetone type ancillary ligands to solve the above problems. The ligands can be used in emitters in the emissive layer of an organic electroluminescent device. By incorporating these ligands to metal complexes, the sublimation properties of materials are improved and the lifetime of devices can be enhanced.

According to an embodiment of the present invention, a metal complex is disclosed, which comprising a ligand $L_a$ represented by Formula 1:

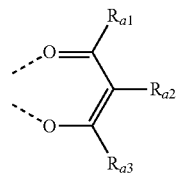

Formula 1

Wherein $R_{a1}$, $R_{a2}$, and $R_{a3}$ are each independently selected from the group consisting of hydrogen, deuterium, halogen, a substituted or unsubstituted alkyl group having 1 to 20 carbon atoms, a substituted or unsubstituted cycloalkyl group having 3 to 20 ring carbon atoms, a substituted or unsubstituted heteroalkyl group having 1 to 20 carbon atoms, a substituted or unsubstituted arylalkyl group having 7 to 30 carbon atoms, a substituted or unsubstituted alkoxy group having 1 to 20 carbon atoms, a substituted or unsubstituted aryloxy group having 6 to 30 carbon atoms, a substituted or unsubstituted alkenyl group having 2 to 20 carbon atoms, a substituted or unsubstituted aryl group having 6 to 30 carbon atoms, a substituted or unsubstituted heteroaryl group having 3 to 30 carbon atoms, a substituted or unsubstituted alkylsilyl group having 3 to 20 carbon atoms, a substituted or unsubstituted arylsilyl group having 6 to 20 carbon atoms, a substituted or unsubstituted amino group having 0 to 20 carbon atoms, an acyl group, a carbonyl group, a carboxylic acid group, an ester group, a nitrile group, an isonitrile group, a sulfanyl group, a sulfinyl group, a sulfonyl group, a phosphino group, and combinations thereof;

At least one of $R_{a1}$, $R_{a2}$, and $R_{a3}$ has a structure represented by formula 2:

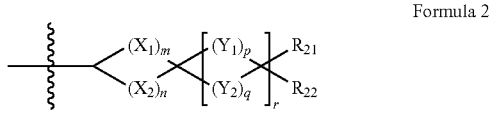

Formula 2

Wherein $X_1$, $X_2$, $Y_1$, $Y_2$ are each independently selected from the group consisting of CRR', NR", O, S, and combinations thereof;

m, n, p, q are 1, 2, 3, or 4;

When m, n, p, q are each independently selected from 2, 3 or 4, the corresponding plurality of $X_1$ can be the same or different, the corresponding plurality of $X_2$ can be the same or different, the corresponding plurality of $Y_1$ can be the same or different, the corresponding plurality of $Y_2$ can be the same or different;

r is 0, 1, 2, or 3;

R, R', R", $R_{21}$ and $R_{22}$ are each independently selected from the group consisting of hydrogen, deuterium, halogen, a substituted or unsubstituted alkyl group having 1 to 20 carbon atoms, a substituted or unsubstituted cycloalkyl group having 3 to 20 ring carbon atoms, a substituted or unsubstituted heteroalkyl group having 1 to 20 carbon atoms, a substituted or unsubstituted arylalkyl group having 7 to 30 carbon atoms, a substituted or unsubstituted alkoxy group having 1 to 20 carbon atoms, a substituted or unsubstituted aryloxy group having 6 to 30 carbon atoms, a substituted or unsubstituted alkenyl group having 2 to 20 carbon atoms, a substituted or unsubstituted aryl group having 6 to 30 carbon atoms, a substituted or unsubstituted heteroaryl group having 3 to 30 carbon atoms, a substituted or unsubstituted alkylsilyl group having 3 to 20 carbon atoms, a substituted or unsubstituted arylsilyl group having 6 to 20 carbon atoms, a substituted or unsubstituted amino group having 0 to 20 carbon atoms, an acyl group, a carbonyl group, a carboxylic acid group, an ester group, a nitrile group, an isonitrile group, a sulfanyl group, a sulfinyl group, a sulfonyl group, a phosphino group, and combinations thereof;

When r is 0, at least one of $R_{21}$ and $R_{22}$ is not hydrogen or deuterium.

According to another embodiment, an electroluminescent device is disclosed, which comprising:
an anode,
a cathode,
and an organic layer, disposed between the anode and the cathode, comprising a meal complex comprising a ligand. $L_a$ with formula 1:

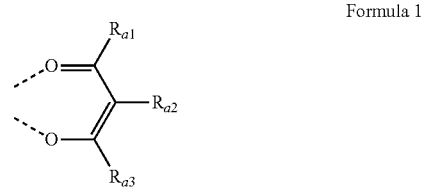

Formula 1

Wherein $R_{a1}$, $R_{a2}$, and $R_{a3}$ are each independently selected from the group consisting of hydrogen, deuterium, halogen, a substituted or unsubstituted alkyl group having 1 to 20 carbon atoms, a substituted or unsubstituted cycloalkyl group having 3 to 20 ring carbon atoms, a substituted or unsubstituted heteroalkyl group having 1 to 20 carbon atoms, a substituted or unsubstituted arylalkyl group having 7 to 30 carbon atoms, a substituted or unsubstituted alkoxy group having 1 to 20 carbon atoms, a substituted or unsubstituted aryloxy group having 6 to 30 carbon atoms, a substituted or unsubstituted alkenyl group having 2 to 20 carbon atoms, a substituted or unsubstituted aryl group having 6 to 30 carbon atoms, a substituted or unsubstituted heteroaryl group having 3 to 30 carbon atoms, a substituted or unsubstituted alkylsilyl group having 3 to 20 carbon atoms, a substituted or unsubstituted arylsilyl group having 6 to 20 carbon atoms, a substituted or unsubstituted amino group having 0 to 20 carbon atoms, an acyl group, a carbonyl group, a carboxylic acid group, an ester group, a nitrile group, an isonitrile group, a sulfanyl group, a sulfinyl group, a sulfonyl group, a phosphino group, and combinations thereof;

At least one of $R_{a1}$, $R_{a2}$, and $R_{a3}$ has a structure represented by formula 2:

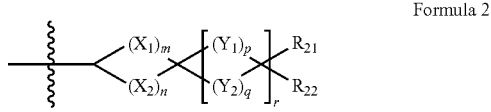

Formula 2

Wherein $X_1$, $X_2$, $Y_1$, $Y_2$ are each independently selected from the group consisting of CRR', NR", O, S, and combinations thereof;

m, n, p, q are 1, 2, 3, or 4;

When m, n, p, q are each independently selected from 2, 3 or 4, the corresponding plurality of $X_1$ can be the same or different, the corresponding plurality of $X_2$ can be the same or different, the corresponding plurality of $Y_1$ can be the same or different, the corresponding plurality of $Y_2$ can be the same or different;

r is 0, 1, 2, or 3;

R, R', R", $R_{21}$ and $R_{22}$ are each independently selected from the group consisting of hydrogen, deuterium, halogen, a substituted or unsubstituted alkyl group having 1 to 20 carbon atoms, a substituted or unsubstituted cycloalkyl group having 3 to 20 ring carbon atoms, a substituted or unsubstituted heteroalkyl group having 1 to 20 carbon atoms, a substituted or unsubstituted arylalkyl group having 7 to 30 carbon atoms, a substituted or unsubstituted alkoxy group having 1 to 20 carbon atoms, a substituted or unsubstituted aryloxy group having 6 to 30 carbon atoms, a substituted or unsubstituted alkenyl group having 2 to 20 carbon atoms, a substituted or unsubstituted aryl group having 6 to 30 carbon atoms, a substituted or unsubstituted heteroaryl group having 3 to 30 carbon atoms, a substituted or unsubstituted alkylsilyl group having 3 to 20 carbon atoms, a substituted or unsubstituted arylsilyl group having 6 to 20 carbon atoms, a substituted or unsubstituted amino group having 0 to 20 carbon atoms, an acyl group, a carbonyl group, a carboxylic acid group, an ester group, a nitrile group, an isonitrile group, a sulfanyl group, a sulfinyl group, a sulfonyl group, a phosphino group, and combinations thereof;

When r is 0, at least one of $R_{21}$ and $R_{22}$ is not hydrogen or deuterium.

According to yet another embodiment, a formulation comprising a metal complex is also disclosed. Said metal complex comprises a ligand $L_a$ represented by Formula 1.

The metal complex comprising new cycloalkyl containing ancillary ligands disclosed in the present invention can be used as emitters in the emissive layer of the organic electroluminescent device. These new ligands can effectively improve the lifetime of devices and change the sublimation characteristics. The ligands and compounds can be easily used in the manufacture of OLEDs, which can provide efficient OLEDs and long lifetime.

4 BRIEF DESCRIPTION OF THE DRAWINGS

FIG. 1 schematically shows an organic light emitting device that can incorporate the ligands, metal complex and formulation disclosed herein.

Figure 2:
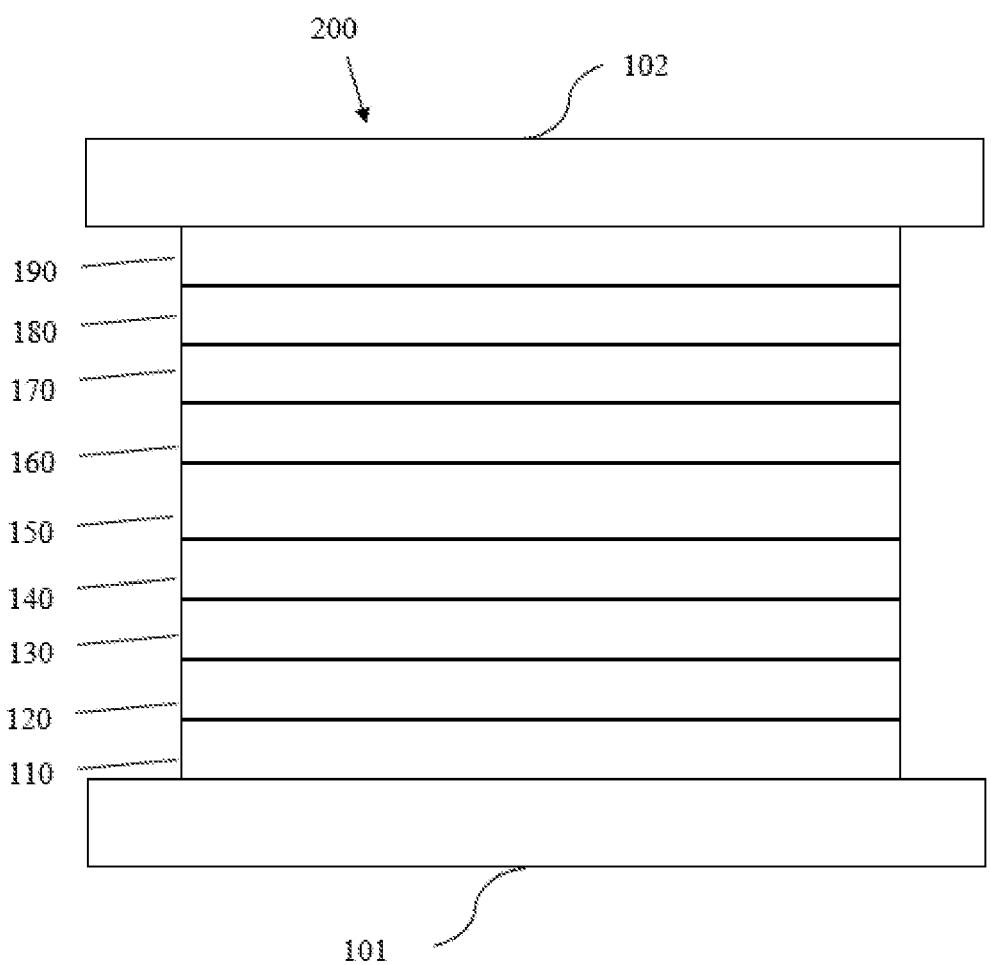

FIG. 2 schematically shows another organic light emitting device that can incorporate the ligands, metal complex and formulation disclosed herein.

Figure 3:
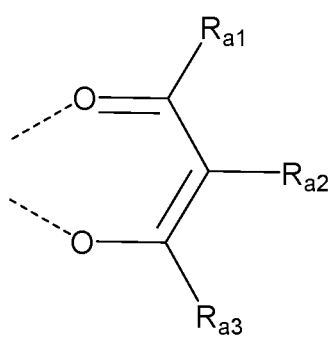

FIG. 3 shows the Formula 1 of ligand compound $L_a$ disclosed herein.

5 DETAILED DESCRIPTION

OLEDs can be fabricated on various types of substrates such as glass, plastic, and metal foil. FIG. 1 schematically shows the organic light emitting device 100 without limitation. The figures are not necessarily drawn to scale. Some of the layer in the figure can also be omitted as needed. Device 100 may include a substrate 101, an anode 110, a hole injection layer 120, a hole transport layer 130, an electron blocking layer 140, an emissive layer 150, a hole blocking layer 160, an electron transport layer 170, an electron injection layer 180 and a cathode 190. Device 100 may be fabricated by depositing the layers described in order. The properties and functions of these various layers, as well as example materials, are described in more detail in U.S. Pat. No. 7,279,704 at cols. 6-10, which are incorporated by reference in its entirety.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with F4-TCNQ at a molar ratio of 50:1, as disclosed in U.S. Patent Application Publication No. 2003/0230980, which is incorporated by reference in its entirety. Examples of host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

The layered structure described above is provided by way of non-limiting example. Functional OLEDs may be achieved by combining the various layers described in different ways, or layers may be omitted entirely. It may also include other layers not specifically described. Within each layer, a single material or a mixture of multiple materials can be used to achieve optimum performance. Any functional layer may include several sublayers. For example, the emissive layer may have a two layers of different emitting materials to achieve desired emission spectrum.

In one embodiment, an OLED may be described as having an "organic layer" disposed between a cathode and an anode. This organic layer may comprise a single layer or multiple layers.

An OLED can be encapsulated by a barrier layer to protect it from harmful species from the environment such as moisture and oxygen. FIG. 2 schematically shows the organic light emitting device 200 without limitation. FIG. 2 differs from FIG. 1 in that the organic light emitting device 200 include a barrier layer 102, which is above the cathode 190. Any material that can provide the barrier function can be used as the barrier layer such as glass and organic-inorganic hybrid layers. The barrier layer should be placed directly or indirectly outside of the OLED device. Multi-layer thin film encapsulation was described in U.S. Pat. No. 7,968,146, which is herein incorporated by reference in its entirety.

Devices fabricated in accordance with embodiments of the invention can be incorporated into a wide variety of consumer products that have one or more of the electronic component modules (or units) incorporated therein. Some examples of such consumer products include flat panel displays, monitors, medical monitors, televisions, billboards, lights for interior or exterior illumination and/or signaling, heads-up displays, fully or partially transparent displays, flexible displays, smart phones, tablets, phablets, wearable devices, smart watches, laptop computers, digital cameras, camcorders, viewfinders, micro-displays, 3-D displays, vehicles displays, and vehicle tail lights.

The materials and structures described herein may be used in other organic electronic devices listed above.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

It is believed that the internal quantum efficiency (IQE) of fluorescent OLEDs can exceed the 25% spin statistics limit through delayed fluorescence. As used herein, there are two types of delayed fluorescence, i.e. P-type delayed fluorescence and E-type delayed fluorescence. P-type delayed fluorescence is generated from triplet-triplet annihilation (TTA).

On the other hand, E-type delayed fluorescence does not rely on the collision of two triplets, but rather on the transition between the triplet states and the singlet excited states. Compounds that are capable of generating E-type delayed fluorescence are required to have very small singlet-triplet gaps to convert between energy states. Thermal energy can activate the transition from the triplet state back to the singlet state. This type of delayed fluorescence is also known as thermally activated delayed fluorescence (TADF). A distinctive feature of TADF is that the delayed component increases as temperature rises. If the reverse intersystem crossing rate is fast enough to minimize the non-radiative decay from the triplet state, the fraction of back populated singlet excited states can potentially reach 75%. The total singlet fraction can be 100%, far exceeding 25% of the spin statistics limit for electrically generated excitons.

E-type delayed fluorescence characteristics can be found in an exciplex system or in a single compound. Without being bound by theory, it is believed that E-type delayed fluorescence requires the luminescent material to have a small singlet-triplet energy gap ($\Delta E_{S-T}$). Organic, non-metal containing, donor-acceptor luminescent materials may be able to achieve this. The emission in these materials is often characterized as a donor-acceptor charge-transfer (CT) type emission. The spatial separation of the HOMO and LUMO in these donor-acceptor type compounds often results in small $\Delta E_{S-T}$. These states may involve CT states. Often, donor-acceptor luminescent materials are constructed by connecting an electron donor moiety such as amino- or carbazole-derivatives and an electron acceptor moiety such as N-containing six-membered aromatic rings.

Definition of Terms of Substituents halogen or halide—as used herein includes fluorine, chlorine, bromine, and iodine.

Alkyl—contemplates both straight and branched chain alkyl groups. Examples of the alkyl group include methyl group, ethyl group, propyl group, isopropyl group, n-butyl group, s-butyl group, isobutyl group, t-butyl group, n-pentyl group, n-hexyl group, n-heptyl group, n-octyl group, n-nonyl group, n-decyl group, n-undecyl group, n-dodecyl group, n-tridecyl group, n-tetradecyl group, n-pentadecyl group, n-hexadecyl group, n-heptadecyl group, n-octadecyl group, neopentyl group, 1-methylpentyl group, 2-methylpentyl group, 1-pentylhexyl group, 1-butylpentyl group, 1-heptyloctyl group, 3-methylpentyl group. Additionally, the alkyl group may be optionally substituted. The carbons in the alkyl chain can be replaced by other hetero atoms. Of the above, preferred are methyl group, ethyl group, propyl group, isopropyl group, n-butyl group, s-butyl group, isobutyl group, t-butyl group, n-pentyl group, and neopentyl group.

Cycloalkyl—as used herein contemplates cyclic alkyl groups. Preferred cycloalkyl groups are those containing 4 to 10 ring carbon atoms and includes cyclobutyl, cyclopentyl, cyclohexyl, 4-methylcyclohexyl, 4,4-dimethylcylcohexyl, 1-adamantyl, 2-adamantyl, 1-norbornyl, 2-norbornyl and the like. Additionally, the cycloalkyl group may be optionally substituted. The carbons in the ring can be replaced by other hetero atoms.

Alkenyl—as used herein contemplates both straight and branched chain alkene groups. Preferred alkenyl groups are those containing two to fifteen carbon atoms. Examples of the alkenyl group include vinyl group, allyl group, 1-butenyl group, 2-butenyl group, 3-butenyl group, 1,3-butandienyl group, 1-methylvinyl group, styryl group, 2,2-diphenylvinyl group, 1,2-diphenylvinyl group, 1-methylallyl group, 1,1-dimethylallyl group, 2-methylallyl group, 1-phenylallyl group, 2-phenylallyl group, 3-phenylallyl group, 3,3-diphenylallyl group, 1,2-dimethylallyl group, 1-phenyl1-butenyl group, and 3-phenyl-1-butenyl group. Additionally, the alkenyl group may be optionally substituted.

Alkynyl—as used herein contemplates both straight and branched chain alkyne groups. Preferred alkynyl groups are those containing two to fifteen carbon atoms. Additionally, the alkynyl group may be optionally substituted.

Aryl or aromatic group—as used herein contemplates noncondensed and condensed systems. Preferred aryl groups are those containing six to sixty carbon atoms, preferably six to twenty carbon atoms, more preferably six to twelve carbon atoms. Examples of the aryl group include phenyl, biphenyl, terphenyl, triphenylene, tetraphenylene, naphthalene, anthracene, phenalene, phenanthrene, fluorene, pyrene, chrysene, perylene, and azulene, preferably phenyl, biphenyl, terphenyl, triphenylene, fluorene, and naphthalene. Additionally, the aryl group may be optionally substituted. Examples of the non-condensed aryl group include phenyl group, biphenyl-2-yl group, biphenyl-3-yl group, biphenyl-4-yl group, p-terphenyl-4-yl group, p-terphenyl-3-yl group, p-terphenyl-2-yl group, m-terphenyl-4-yl group, m-terphenyl-3-yl group, m-terphenyl-2-yl group, o-tolyl group, m-tolyl group, p-tolyl group, p-t-butylphenyl group, p-(2-phenylpropyl)phenyl group, 4'-methylbiphenylyl group, 4"-t-butyl p-terphenyl-4-yl group, o-cumenyl group, m-cumenyl group, p-cumenyl group, 2,3-xylyl group, 3,4-xylyl group, 2,5-xylyl group, mesityl group, and m-quarterphenyl group.

Heterocyclic group or heterocycle—as used herein contemplates aromatic and non-aromatic cyclic groups. Heteroaromatic also means heteroaryl. Preferred non-aromatic heterocyclic groups are those containing 3 to 7 ring atoms which includes at least one hetero atom such as nitrogen, oxygen, and sulfur. The heterocyclic group can also be an aromatic heterocyclic group having at least one heteroatom selected from nitrogen atom, oxygen atom, sulfur atom, and selenium atom.

Heteroaryl—as used herein contemplates noncondensed and condensed hetero-aromatic groups that may include from one to five heteroatoms. Preferred heteroaryl groups are those containing three to thirty carbon atoms, preferably three to twenty carbon atoms, more preferably three to twelve carbon atoms. Suitable heteroaryl groups include dibenzothiophene, dibenzofuran, dibenzoselenophene, furan, thiophene, benzofuran, benzothiophene, benzoselenophene, carbazole, indolocarbazole, pyridylindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, phenoxazine, benzofuropyridine, furodipyridine, benzothienopyridine, thienodipyridine, benzoselenophenopyridine, and selenophenodipyridine, preferably dibenzothiophene, dibenzofuran, dibenzoselenophene, carbazole, indolocarbazole, imidazole, pyridine, triazine, benzimidazole, 1,2-azaborine, 1,3-azaborine, 1,4-azaborine, borazine, and aza-analogs thereof. Additionally, the heteroaryl group may be optionally substituted.

Alkoxy—it is represented by —O-Alkyl. Examples and preferred examples thereof are the same as those described above. Examples of the alkoxy group having 1 to 20 carbon atoms, preferably 1 to 6 carbon atoms include methoxy group, ethoxy group, propoxy group, butoxy group, pentyloxy group, and hexyloxy group. The alkoxy group having 3 or more carbon atoms may be linear, cyclic or branched.

Aryloxy—it is represented by —O-Aryl or —O-heteroaryl. Examples and preferred examples thereof are the same as those described above. Examples of the aryloxy group having 6 to 40 carbon atoms include phenoxy group and biphenyloxy group.

Arylalkyl—as used herein contemplates an alkyl group that has an aryl substituent. Additionally, the arylalkyl group may be optionally substituted. Examples of the arylalkyl group include benzyl group, 1-phenylethyl group, 2-phenylethyl group, 1-phenylisopropyl group, 2-phenylisopropyl group, phenyl-t-butyl group, alpha.-naphthylmethyl group, 1-alpha.-naphthylethyl group, 2-alpha-naphthylethyl group, 1-alpha-naphthylisopropyl group, 2-alpha-naphthylisopropyl group, beta-naphthylmethyl group, 1-beta-naphthylethyl group, 2-beta-naphthylethyl group, 1-beta-naphthylisopropyl group, 2-beta-naphthylisopropyl group, p-methylbenzyl group, m-methylbenzyl group, o-methylbenzyl group, p-chlorobenzyl group, m-chlorobenzyl group, o-chlorobenzyl group, p-bromobenzyl group, m-bromobenzyl group, o-bromobenzyl group, p-iodobenzyl group, m-iodobenzyl group, o-iodobenzyl group, p-hydroxybenzyl group, m-hydroxybenzyl group, o-hydroxybenzyl group, p-aminobenzyl group, m-aminobenzyl group, o-aminobenzyl group, p-nitrobenzyl group, m-nitrobenzyl group, o-nitrobenzyl group, p-cyanobenzyl group, m-cyanobenzyl group, o-cyanobenzyl group, 1-hydroxy-2-phenylisopropyl group, and 1-chloro2-phenylisopropyl group. Of the above, preferred are benzyl group, p-cyanobenzyl group, m-cyanobenzyl group, o-cyanobenzyl group, 1-phenylethyl group, 2-phenylethyl group, 1-phenylisopropyl group, and 2-phenylisopropyl group.

The term "aza" in azadibenzofuran, aza-dibenzothiophene, etc. means that one or more of the C—H groups in the respective aromatic fragment are replaced by a nitrogen atom. For example, azatriphenylene encompasses dibenzo [f,h]quinoxaline,dibenzo[f,h]quinoline and other analogues with two or more nitrogens in the ring system. One of ordinary skill in the art can readily envision other nitrogen analogs of the aza-derivatives described above, and all such analogs are intended to be encompassed by the terms as set forth herein.

The alkyl, cycloalkyl, alkenyl, alkynyl, aralkyl, heterocyclic group, aryl, and heteroaryl may be unsubstituted or may be substituted with one or more substituents selected from the group consisting of deuterium, halogen, alkyl, cycloalkyl, arylalkyl, alkoxy, aryloxy, amino, cyclic amino, silyl, alkenyl, cycloalkenyl, heteroalkenyl, alkynyl, aryl, heteroaryl, an acyl group, a carbonyl group, a carboxylic acid group, an ether group, an ester group, a nitrile group, an isonitrile group, a sulfanyl group, a sulfinyl group, a sulfonyl group, a phosphino group, and combinations thereof.

It is to be understood that when a molecular fragment is described as being a substituent or otherwise attached to another moiety, its name may be written as if it were a fragment (e.g. phenyl, phenylene, naphthyl, dibenzofuryl) or as if it were the whole molecule (e.g. benzene, naphthalene, dibenzofuran). As used herein, these different ways of designating a substituent or attached fragment are considered to be equivalent.

In the compounds mentioned in this disclosure, the hydrogen atoms can be partially or fully replaced by deuterium. Other atoms such as carbon and nitrogen, can also be replaced by their other stable isotopes. The replacement by other stable isotopes in the compounds may be preferred due to its enhancements of device efficiency and stability.

In the compounds mentioned in this disclosure, multiple substitutions refer to a range that includes a double substitution, up to the maximum available substitutions.

According to an embodiment of the present invention, a metal complex comprising a ligand $L_a$ represented by Formula 1 is disclosed:

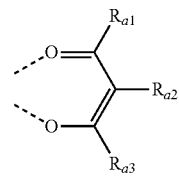

Formula 1

Wherein $R_{a1}$, $R_{a2}$, and $R_{a3}$ are each independently selected from the group consisting of hydrogen, deuterium, halogen, a substituted or unsubstituted alkyl group having 1 to 20 carbon atoms, a substituted or unsubstituted cycloalkyl group having 3 to 20 ring carbon atoms, a substituted or unsubstituted heteroalkyl group having 1 to 20 carbon atoms, a substituted or unsubstituted arylalkyl group having 7 to 30 carbon atoms, a substituted or unsubstituted alkoxy group having 1 to 20 carbon atoms, a substituted or unsubstituted aryloxy group having 6 to 30 carbon atoms, a substituted or unsubstituted alkenyl group having 2 to 20 carbon atoms, a substituted or unsubstituted aryl group having 6 to 30 carbon atoms, a substituted or unsubstituted heteroaryl group having 3 to 30 carbon atoms, a substituted or unsubstituted alkylsilyl group having 3 to 20 carbon atoms, a substituted or unsubstituted arylsilyl group having 6 to 20 carbon atoms, a substituted or unsubstituted amino group having 0 to 20 carbon atoms, an acyl group, a carbonyl group, a carboxylic acid group, an ester group, a nitrile group, an isonitrile group, a sulfanyl group, a sulfinyl group, a sulfonyl group, a phosphino group, and combinations thereof;

At least one of $R_{a1}$, $R_{a2}$, and $R_{a3}$ has a structure represented by formula 2:

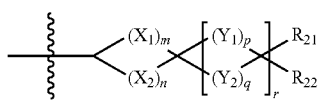

Formula 2

Wherein $X_1$, $X_2$, $Y_1$, $Y_2$ are each independently selected from the group consisting of CRR', NR, O, S, and combinations thereof;

m, n, p, q are 1, 2, 3, or 4;

When m, n, p, q are each independently selected from 2, 3 or 4, the corresponding plurality of $X_1$ can be the same or different, the corresponding plurality of $X_2$ can be the same or different, the corresponding plurality of $Y_1$ can be the same or different, the corresponding plurality of $Y_2$ can be the same or different;

r is 0, 1, 2, or 3;

R, R', $R_{21}$ and $R_{22}$ are each independently selected from the group consisting of hydrogen, deuterium, halogen, a substituted or unsubstituted alkyl group having 1 to 20 carbon atoms, a substituted or unsubstituted cycloalkyl group having 3 to 20 ring carbon atoms, a substituted or unsubstituted heteroalkyl group having 1 to 20 carbon atoms, a substituted or unsubstituted arylalkyl group having 7 to 30 carbon atoms, a substituted or unsubstituted alkoxy group having 1 to 20 carbon atoms, a substituted or unsubstituted aryloxy group having 6 to 30 carbon atoms, a substituted or unsubstituted alkenyl group having 2 to 20 carbon atoms, a substituted or unsubstituted aryl group having 6 to 30 carbon atoms, a substituted or unsubstituted heteroaryl group having 3 to 30 carbon atoms, a substituted or unsubstituted alkylsilyl group having 3 to 20 carbon atoms, a substituted or unsubstituted arylsilyl group having 6 to 20 carbon atoms, a substituted or unsubstituted amino group having 0 to 20 carbon atoms, an acyl group, a carbonyl group, a carboxylic acid group, an ester group, a nitrile group, an isonitrile group, a sulfanyl group, a sulfinyl group, a sulfonyl group, a phosphino group, and combinations thereof;

When r is 0, at least one of $R_{21}$ and $R_{22}$ is not hydrogen or deuterium.

In the structural of formula 2, the bond with the leftmost wavy line represents the bond between $R_{a1}$, $R_{a2}$, or $R_{a1}$ and the main group. For example, when $R_{a1}$ has the structure represented by formula 2, the bond whit the leftmost wavy line corresponds to the bond between $R_{a1}$ and the C atom which is on the right side of the upper O atom of the formula 1.

In one embodiment, wherein the metal is selected from the group consisting of Cu, Ag, Au, Ru, Rh, Pd, Pt, Os, and Ir.

In one embodiment, wherein the metal is selected from the group consisting of Pt and Ir.

In one embodiment, wherein $X_1$, $X_2$, $Y_1$, and $Y_2$ are CRR'.

In one embodiment, wherein r is 0.

In one embodiment, wherein r is 1.

In one embodiment, wherein $R_{21}$ and $R_{22}$ are each independently selected from the group consisting of a substituted or unsubstituted alkyl group having 1 to 20 carbon atoms, a substituted or unsubstituted cycloalkyl group having 3 to 20 ring carbon atoms, a substituted or unsubstituted heteroalkyl group having 1 to 20 carbon atoms, and combinations thereof.

In one embodiment, wherein $R_{21}$ and $R_{22}$ are selected from the group consisting of methyl, ethyl, propyl, isopropyl, isobutyl, trifluoromethyl, and neopentyl.

In one embodiment, wherein the complex has the formula of $M(L_a)_u(L_b)_v(L_c)_w$, wherein $L_b$ and $L_c$ are the second and third ligand coordinating to M, $L_b$ and $L_c$ can be the same of different;

$L_a$, $L_b$, and $L_c$ can be optionally joined to form a multidentate ligand;

Wherein u is 1, 2, or 3, v is 0, 1, or 2, w is 0, 1, or 2; u+v+w is the oxidation state of M;

Wherein $L_b$ and $L_c$ are independently selected from the group consisting of:

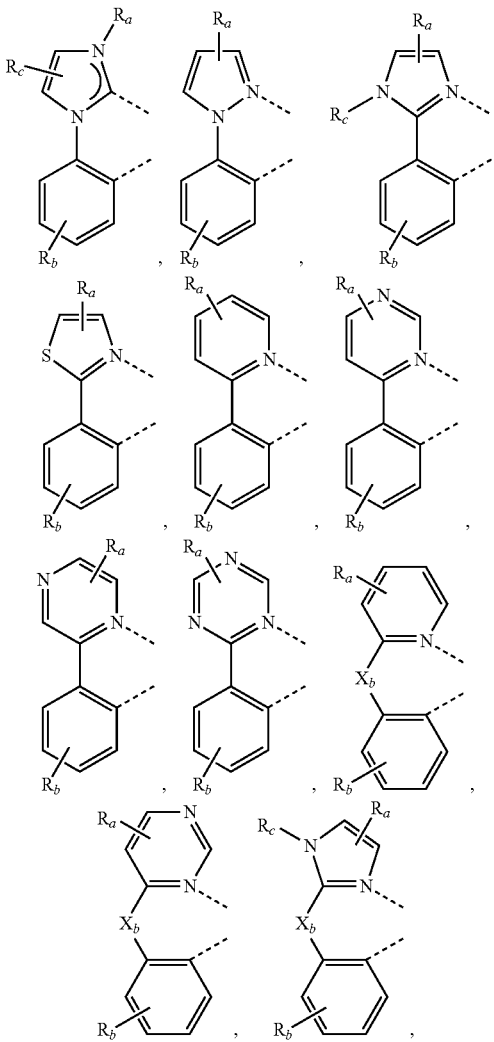

Wherein $R_a$, $R_b$, and $R_c$ can represent mono, di, tri, or tetra substitution or no substitution;

$R_a$, $R_b$, and $R_c$ are each independently selected from the group consisting of hydrogen, deuterium, halogen, a substituted or unsubstituted alkyl group having 1 to 20 carbon atoms, a substituted or unsubstituted cycloalkyl group having 3 to 20 ring carbon atoms, a substituted or unsubstituted heteroalkyl group having 1 to 20 carbon atoms, a substituted or unsubstituted arylalkyl group having 7 to 30 carbon atoms, a substituted or unsubstituted alkoxy group having 1 to 20 carbon atoms, a substituted or unsubstituted aryloxy group having 6 to 30 carbon atoms, a substituted or unsubstituted alkenyl group having 2 to 20 carbon atoms, a substituted or unsubstituted aryl group having 6 to 30 carbon atoms, a substituted or unsubstituted heteroaryl group having 3 to 30 carbon atoms, a substituted or unsubstituted alkylsilyl group having 3 to 20 carbon atoms, a substituted or unsubstituted arylsilyl group having 6 to 20 carbon atoms, a substituted or unsubstituted amino group having 0 to 20 carbon atoms, an acyl group, a carbonyl group, a carboxylic acid group, an ester group, a nitrile group, an isonitrile group, a sulfanyl group, a sulfinyl group, a sulfonyl group, a phosphino group, and combinations thereof;

$X_b$ is selected from the group consisting of O, S, Se, $NR_{N1}$, and $CR_{C1}R_{C2}$;

$R_{N1}$, $R_{C1}$ and $R_{C2}$ are each independently selected from the group consisting of hydrogen, deuterium, halogen, a substituted or unsubstituted alkyl group having 1 to 20 carbon atoms, a substituted or unsubstituted cycloalkyl group having 3 to 20 ring carbon atoms, a substituted or unsubstituted heteroalkyl group having 1 to 20 carbon atoms, a substituted or unsubstituted arylalkyl group having 7 to 30 carbon atoms, a substituted or unsubstituted alkoxy group having 1 to 20 carbon atoms, a substituted or unsubstituted aryloxy group having 6 to 30 carbon atoms, a substituted or unsubstituted alkenyl group having 2 to 20 carbon atoms, a substituted or unsubstituted aryl group having 6 to 30 carbon atoms, a substituted or unsubstituted heteroaryl group having 3 to 30 carbon atoms, a substituted or unsubstituted alkylsilyl group having 3 to 20 carbon atoms, a substituted or unsubstituted arylsilyl group having 6 to 20 carbon atoms, a substituted or unsubstituted amino group having 0 to 20 carbon atoms, an acyl group, a carbonyl group, a carboxylic acid group, an ester group, a nitrile group, an isonitrile group, a sulfanyl group, a sulfinyl group, a sulfonyl group, a phosphino group, and combinations thereof;

two adjacent substituents are optionally joined to form a ring.

In one preferred embodiment, wherein the complex has the formula of $Ir(L_a)(L_b)_2$.

In one preferred embodiment, wherein the ligand $L_a$ is selected from the group consisting of:

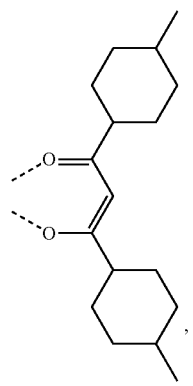

$L_{a1}$

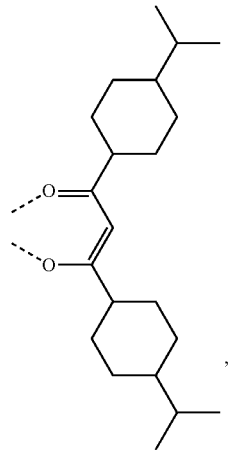

$L_{a2}$

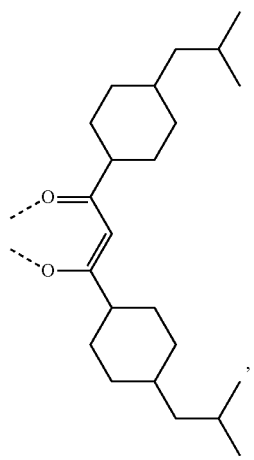

$L_{a3}$

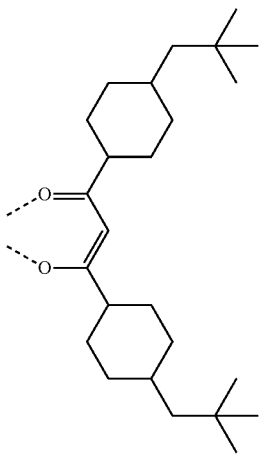

$L_{a4}$

L$_{a5}$
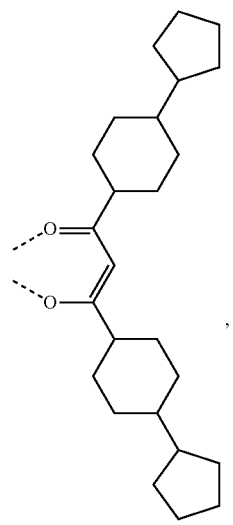
L$_{a6}$
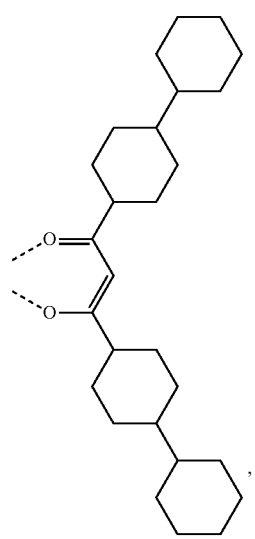
L$_{a7}$
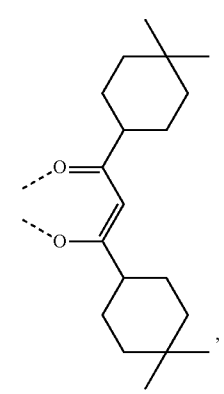
L$_{a8}$
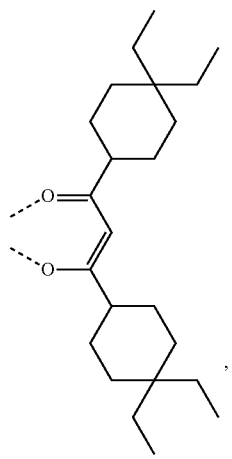
L$_{a9}$
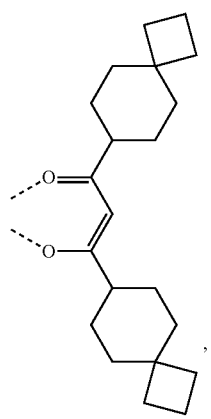
L$_{a10}$
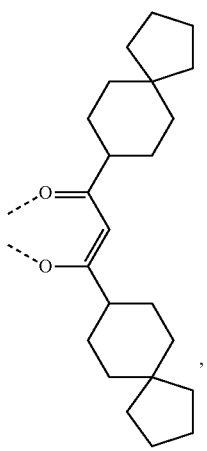

L_{a11}
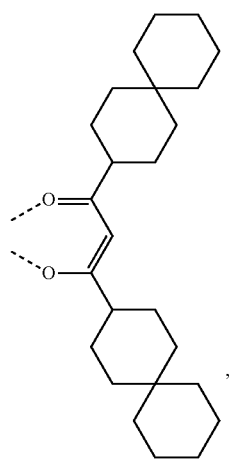
L_{a12}
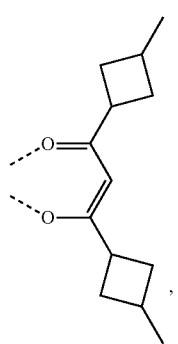
L_{a13}
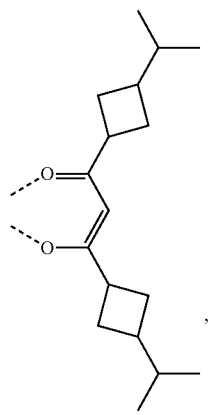
L_{a14}
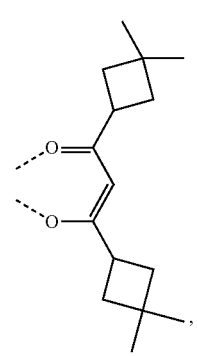
L_{a15}
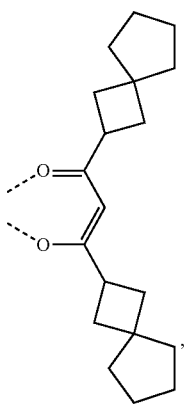
L_{a16}
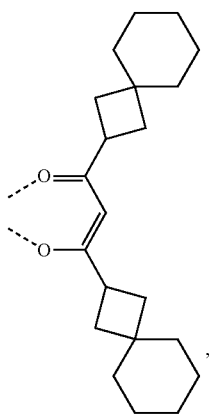
L_{a17}
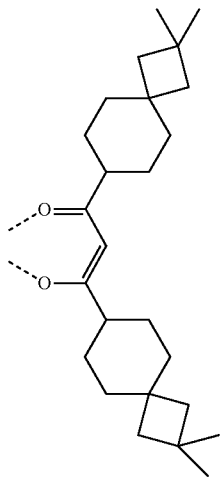

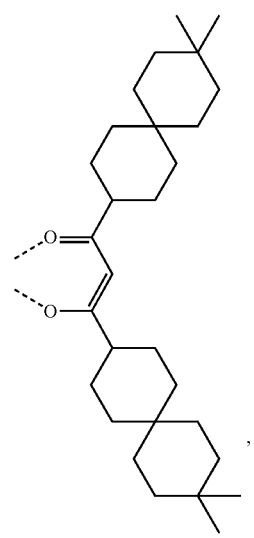
L_{a18}
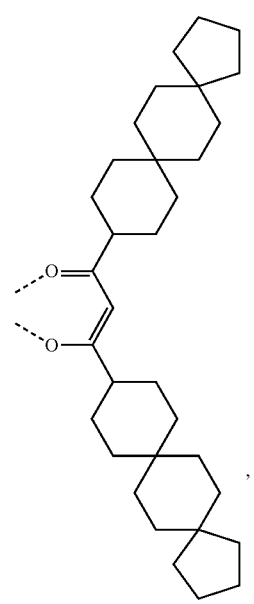
L_{a19}
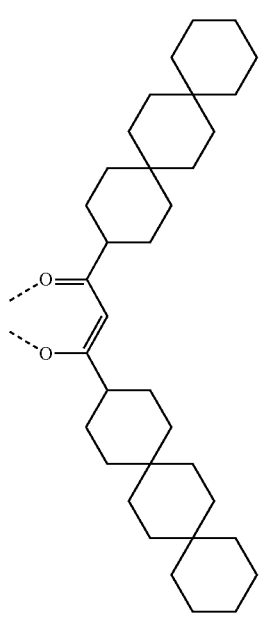
L_{a20}
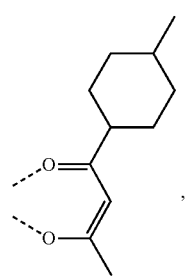
L_{a21}
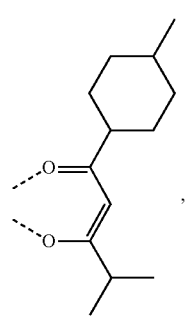
L_{a22}
L_{a23}

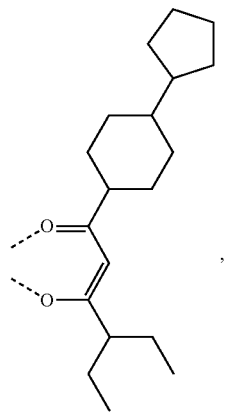
L<sub>a24</sub>
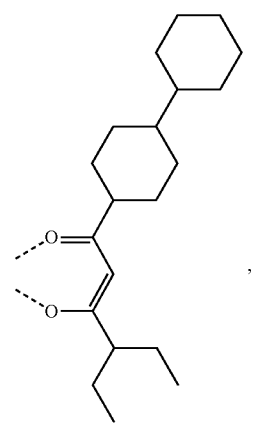
L<sub>a25</sub>
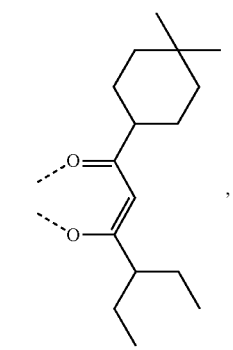
L<sub>a26</sub>
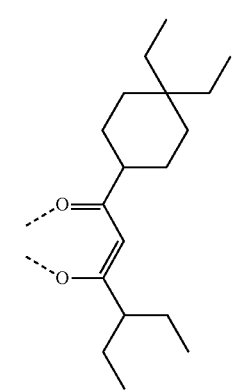
L<sub>a27</sub>
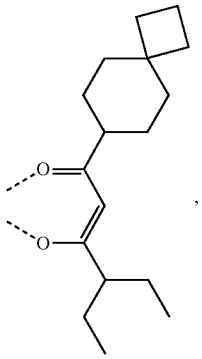
L<sub>a28</sub>
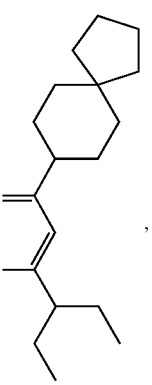
L<sub>a29</sub>
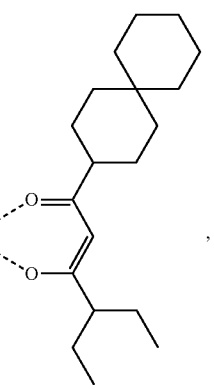
L<sub>a30</sub>
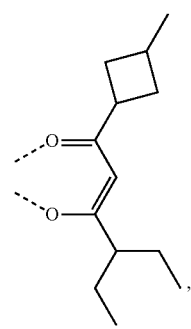
L<sub>a31</sub>

L_{a32}
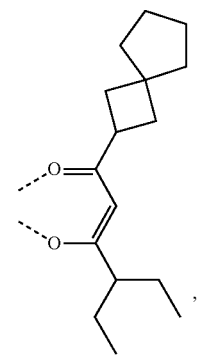
L_{a33}
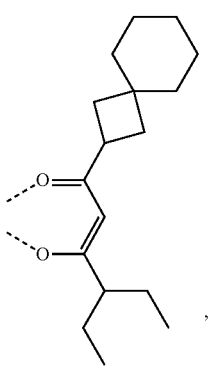
L_{a34}
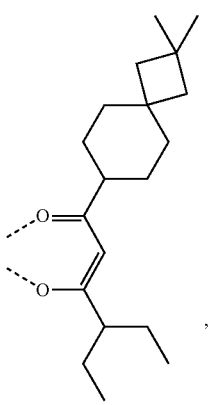
L_{a35}
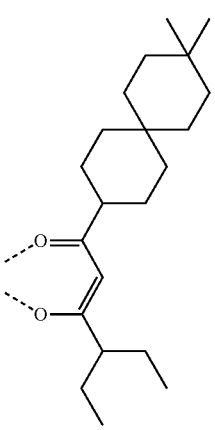
L_{a36}
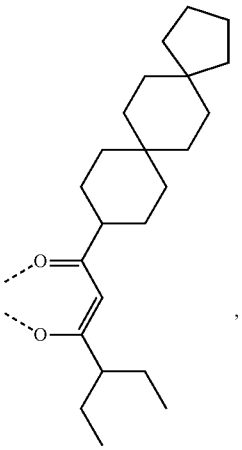
L_{a37}
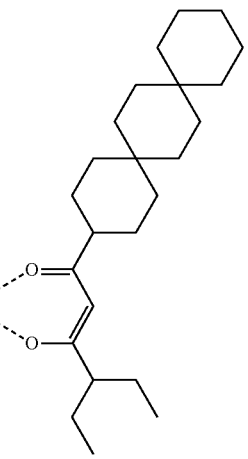
L_{a38}
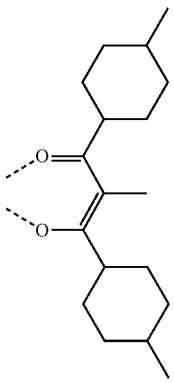

-continued
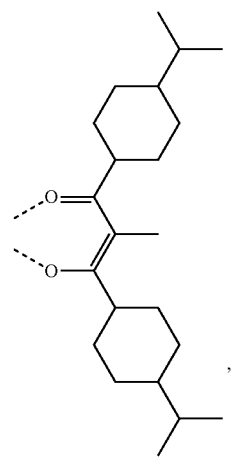
L<sub>a39</sub>
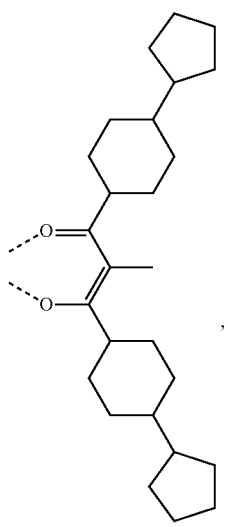
L<sub>a42</sub>
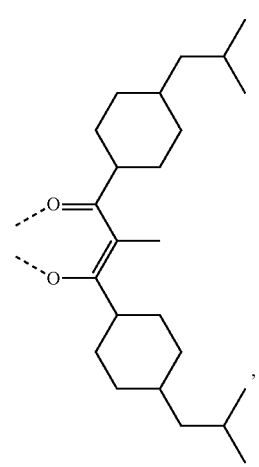
L<sub>a40</sub>
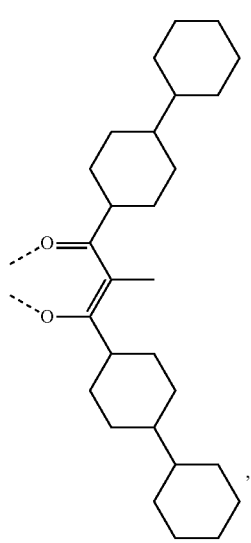
L<sub>a43</sub>
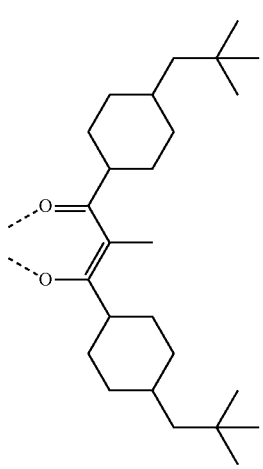
L<sub>a41</sub>
L<sub>a44</sub>

L<sub>a45</sub>
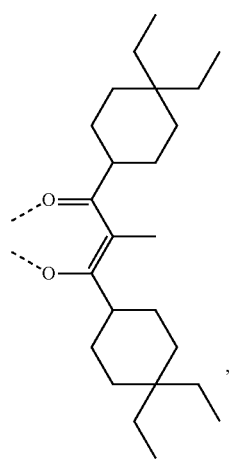
L<sub>a46</sub>
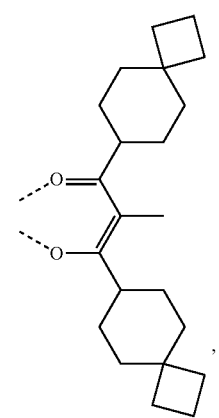
L<sub>a47</sub>
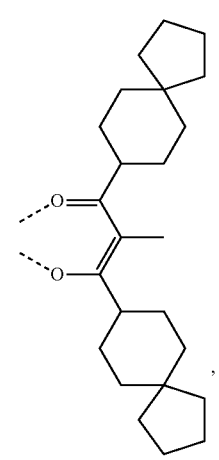
L<sub>a48</sub>
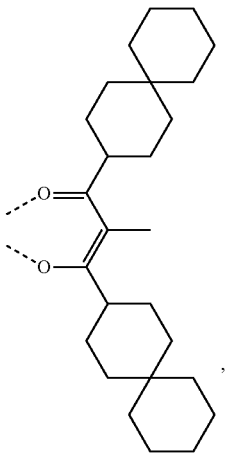
L<sub>a49</sub>
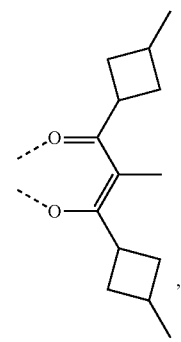
L<sub>a50</sub>
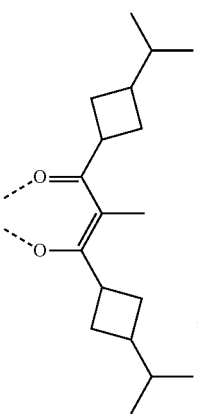
L<sub>a51</sub>
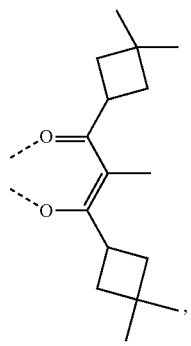

L<sub>a52</sub>
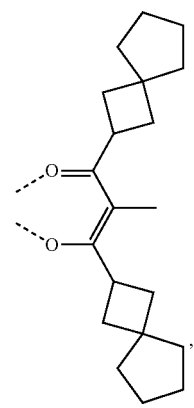
L<sub>a53</sub>
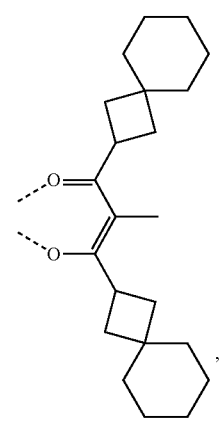
L<sub>a54</sub>
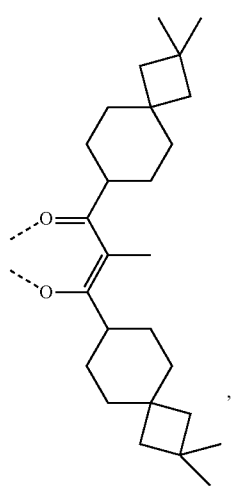
L<sub>a55</sub>
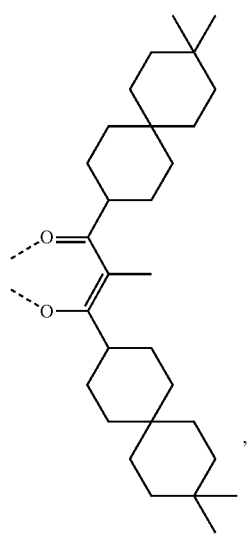
L<sub>a56</sub>
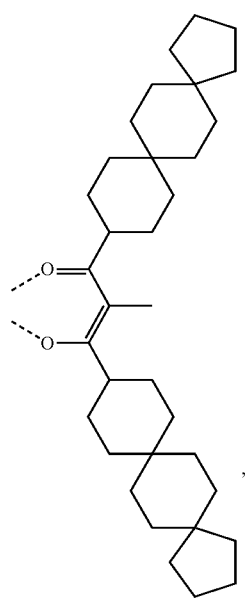

L_{a57}
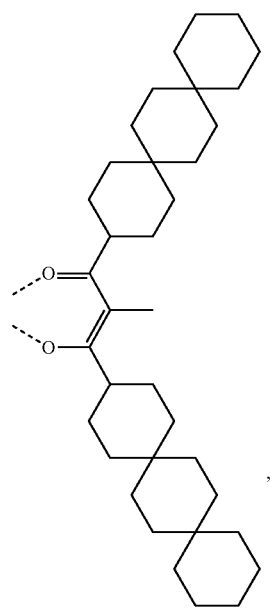
L_{a58}
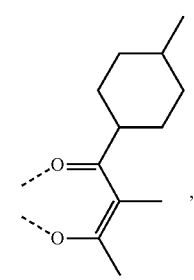
L_{a59}
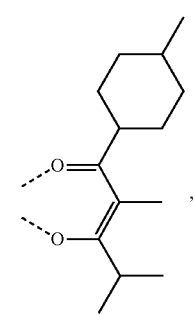
L_{a60}
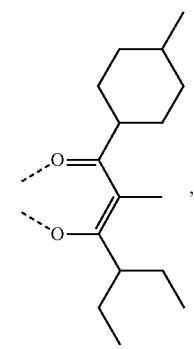
L_{a61}
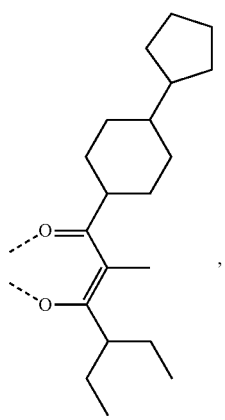
L_{a62}
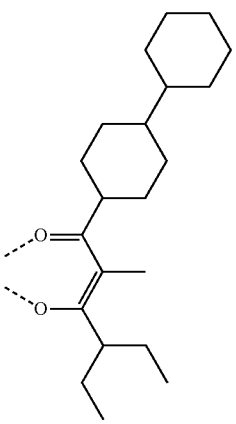
L_{a63}
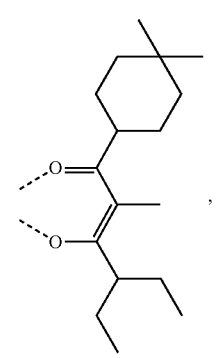
L_{a64}
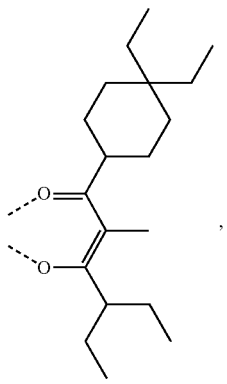

L_{a65}
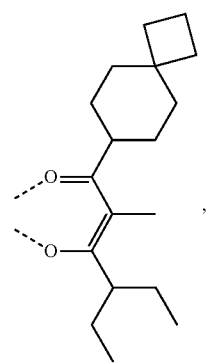
L_{a66}
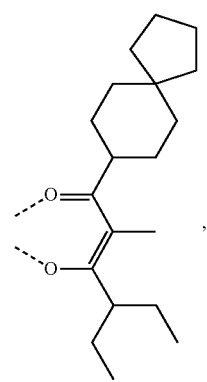
L_{a67}
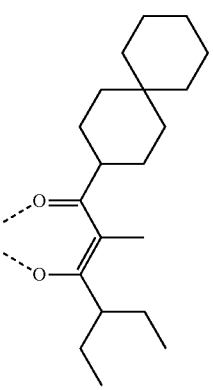
L_{a68}
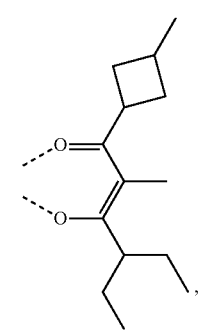
L_{a69}
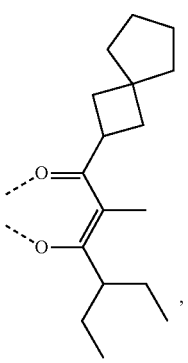
L_{a70}
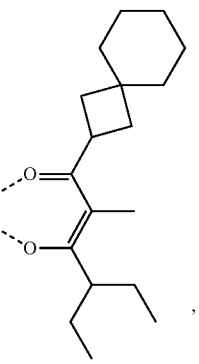
L_{a71}
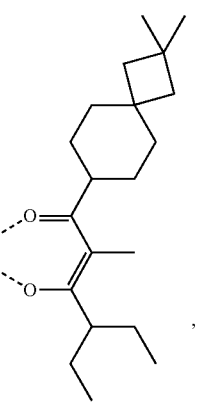
L_{a72}
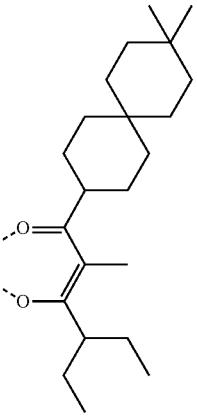

-continued
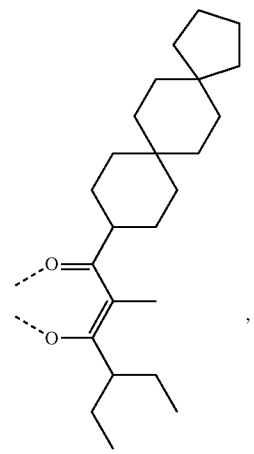
$L_{a73}$
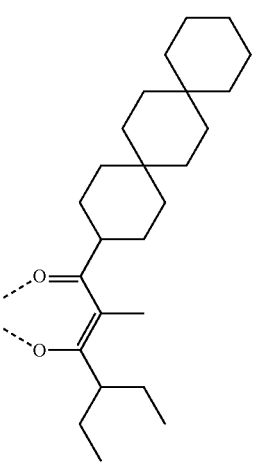
$L_{a74}$
In one preferred embodiment, wherein the ligand $L_b$ is selected from the group consisting of:
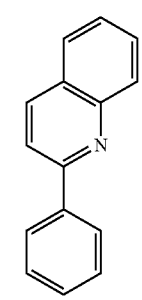
$L_{b1}$
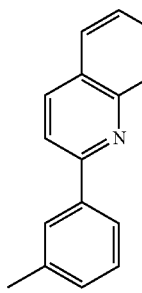
$L_{b2}$
-continued
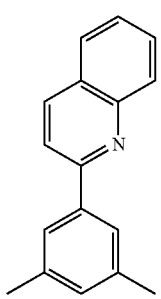
$L_{b3}$
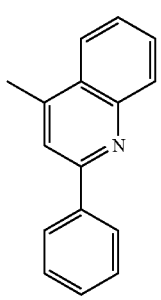
$L_{b4}$
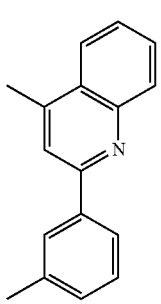
$L_{b5}$
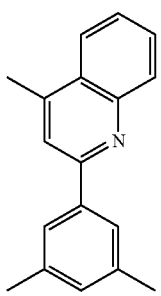
$L_{b6}$
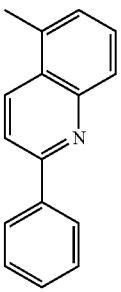
$L_{b7}$ L$_{b8}$
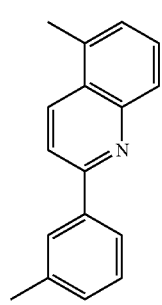
L$_{b9}$
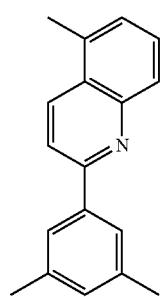
L$_{b10}$
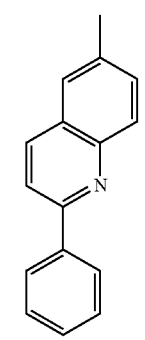
L$_{b11}$
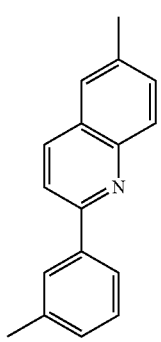
L$_{b12}$
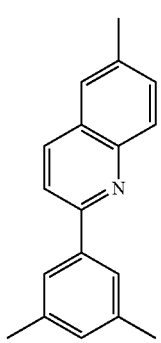
L$_{b13}$
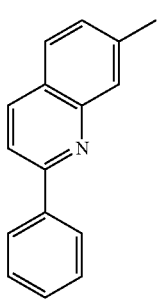
L$_{b14}$
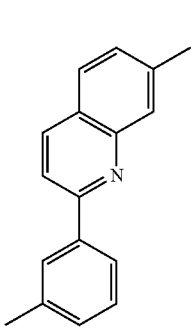
L$_{b15}$
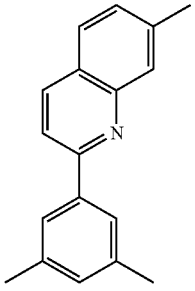
L$_{b16}$
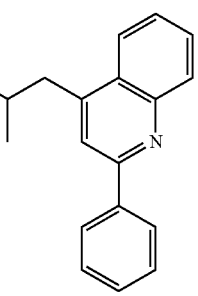
L$_{b17}$
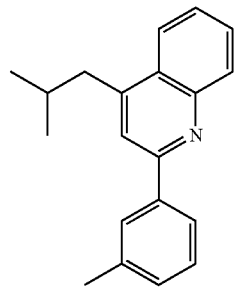

L<sub>b18</sub>
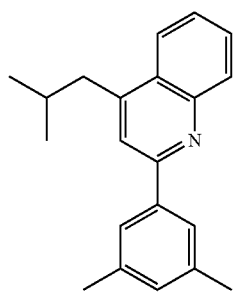
L<sub>b19</sub>
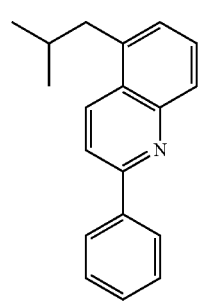
L<sub>b20</sub>
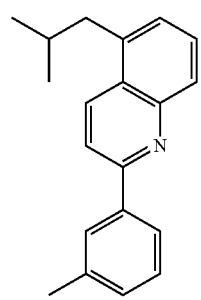
L<sub>b21</sub>
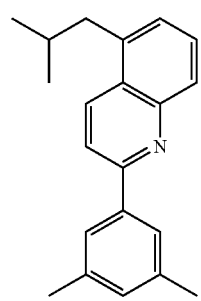
L<sub>b22</sub>
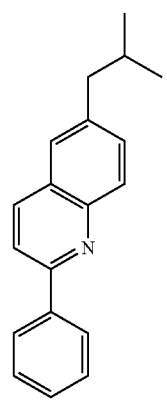
L<sub>b23</sub>
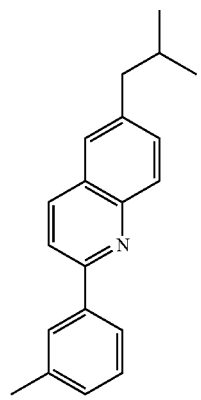
L<sub>b24</sub>
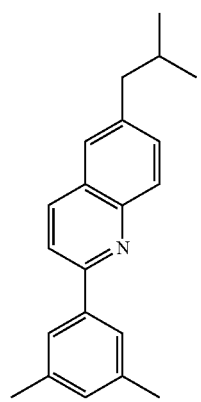
L<sub>b25</sub>
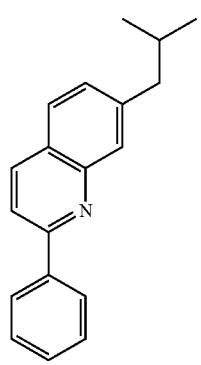
L<sub>b26</sub>
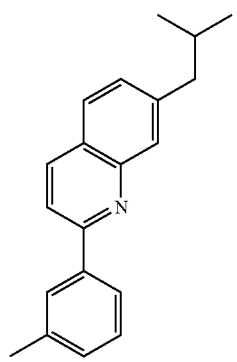

L$_{b27}$ 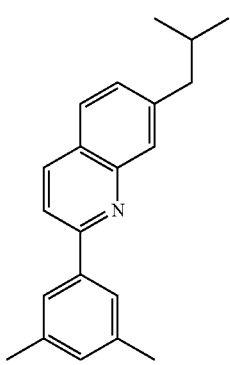
L$_{b28}$ 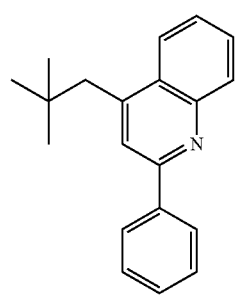
L$_{b29}$ 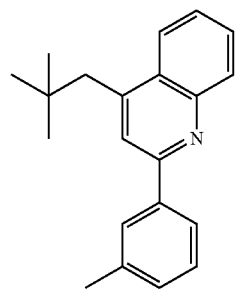
L$_{b30}$ 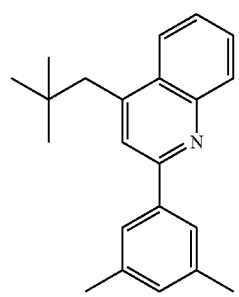
L$_{b31}$ 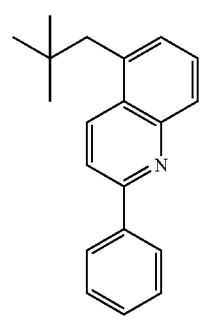
L$_{b32}$ 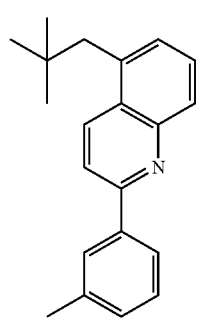
L$_{b33}$ 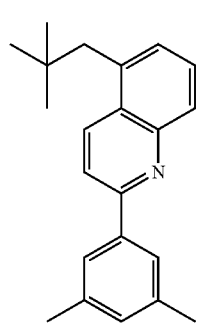
L$_{b34}$ 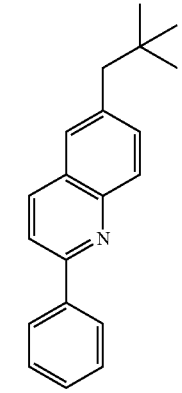
L$_{b35}$ 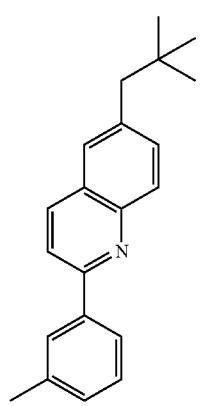

-continued
L<sub>b36</sub>
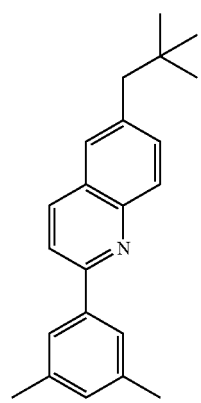
L<sub>b37</sub>
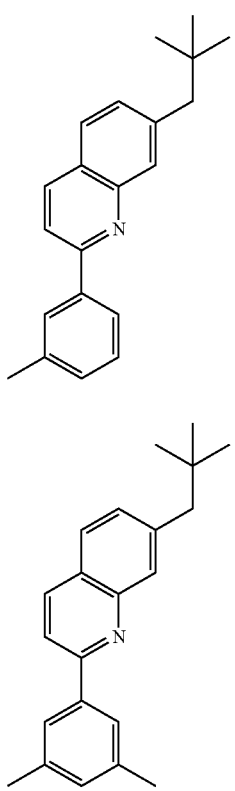
L<sub>b38</sub>
L<sub>b39</sub>
-continued
L<sub>b40</sub>
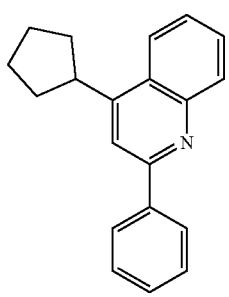
L<sub>b41</sub>
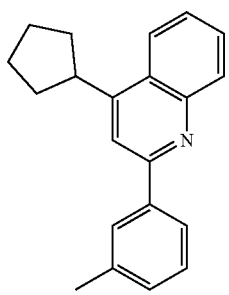
L<sub>b42</sub>
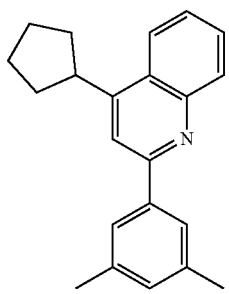
L<sub>b43</sub>
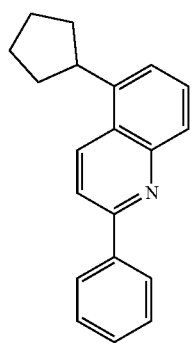
L<sub>b44</sub>
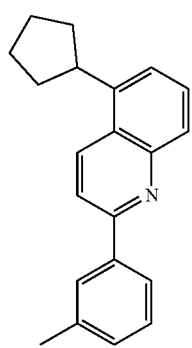

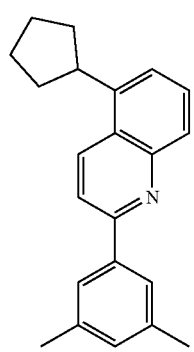 L<sub>b45</sub>
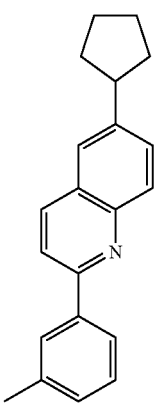 L<sub>b46</sub>
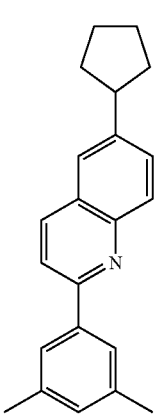 L<sub>b47</sub>
L<sub>b48</sub>
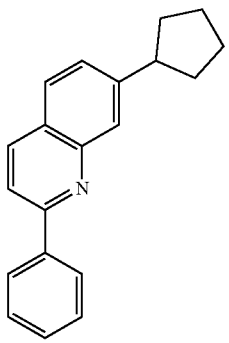 L<sub>b49</sub>
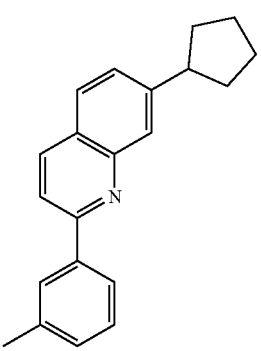 L<sub>b50</sub>
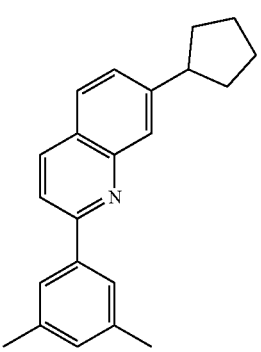 L<sub>b51</sub>
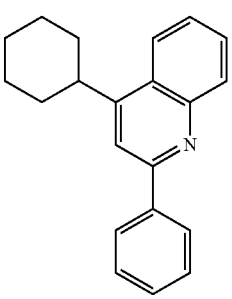 L<sub>b52</sub>
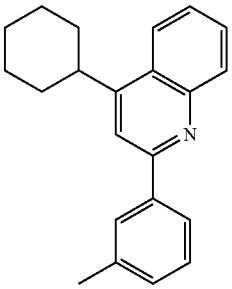 L<sub>b53</sub>

L$_{b54}$
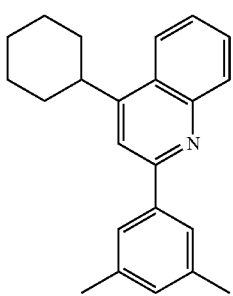
L$_{b55}$
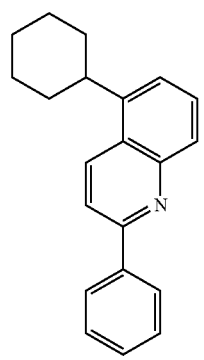
L$_{b56}$
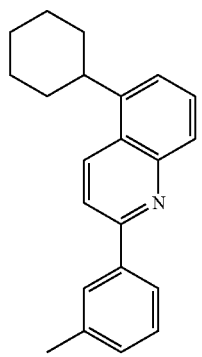
L$_{b57}$
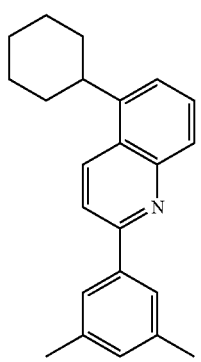
L$_{b58}$
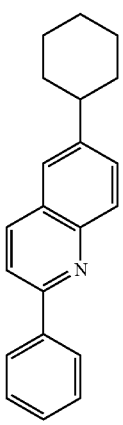
L$_{b59}$
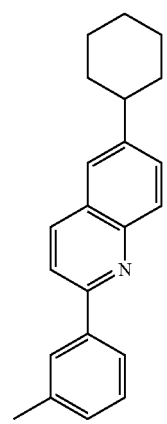
L$_{b60}$
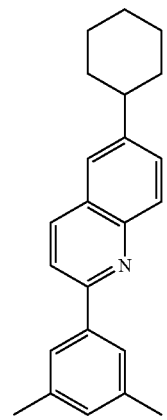
L$_{b61}$
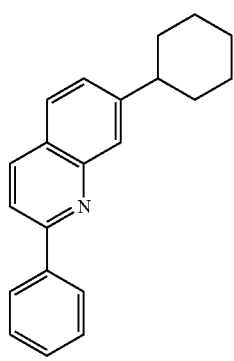

| | |
|---|---|
| L$_{b62}$ | L$_{b67}$ |
| L$_{b63}$ | L$_{b68}$ |
| L$_{b64}$ | L$_{b69}$ |
| L$_{b65}$ | L$_{b70}$ |
| L$_{b66}$ | |

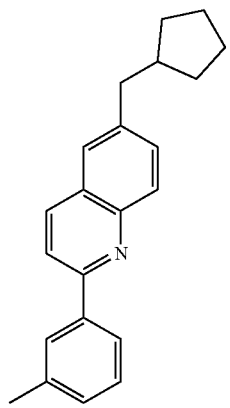 L<sub>b71</sub>
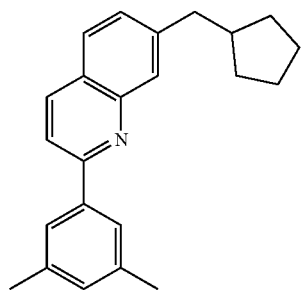 L<sub>b75</sub>
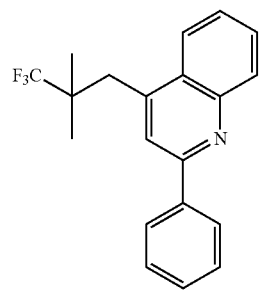 L<sub>b76</sub>
L<sub>b72</sub>
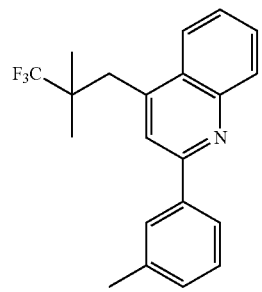 L<sub>b77</sub>
L<sub>b73</sub>
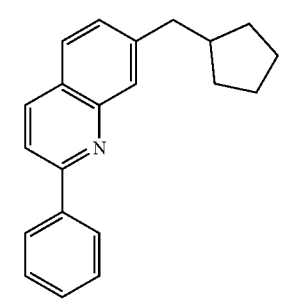
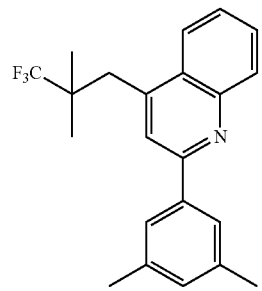 L<sub>b78</sub>
L<sub>b74</sub>
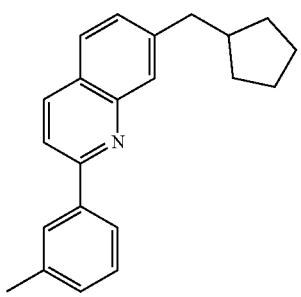
L<sub>b79</sub>

L$_{b80}$
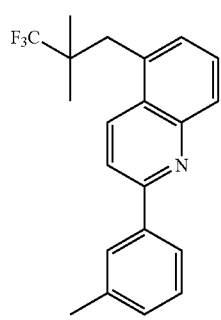
L$_{b81}$
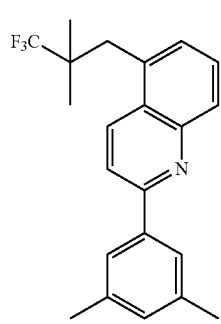
L$_{b82}$
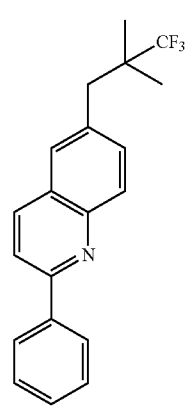
L$_{b83}$
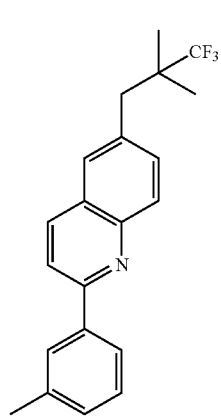
L$_{b84}$
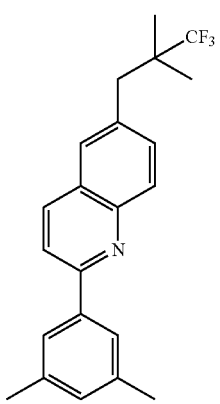
L$_{b85}$
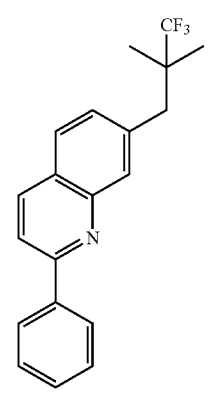
L$_{b86}$
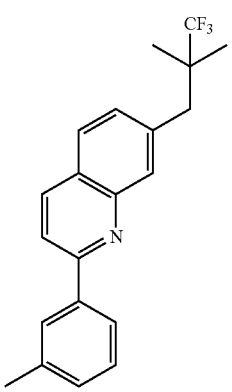
L$_{b87}$
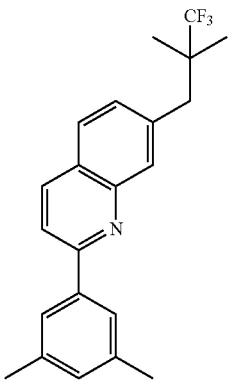

-continued
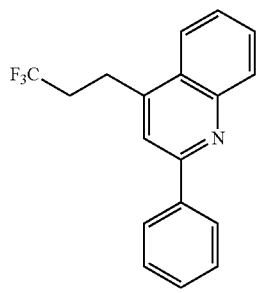
L<sub>b88</sub>
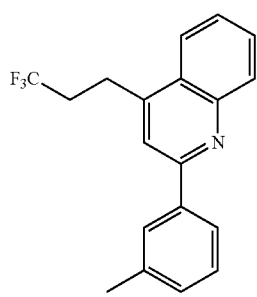
L<sub>b89</sub>
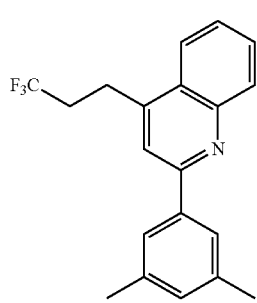
L<sub>b90</sub>
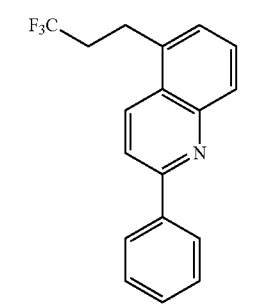
L<sub>b91</sub>
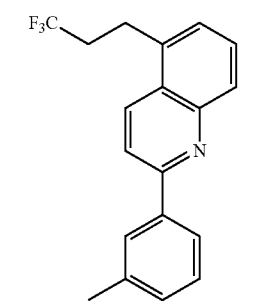
L<sub>b92</sub>
-continued
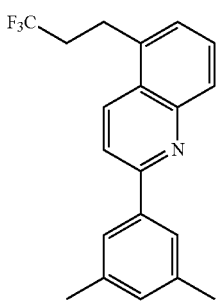
L<sub>b93</sub>
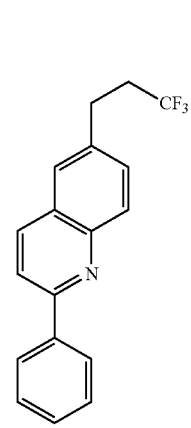
L<sub>b94</sub>
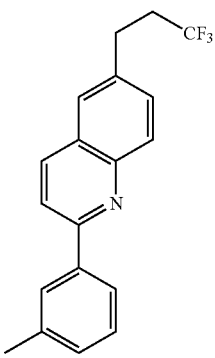
L<sub>b95</sub>
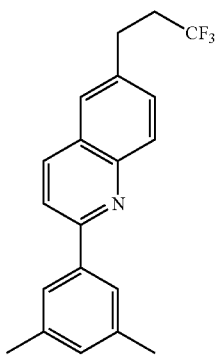
L<sub>b96</sub>

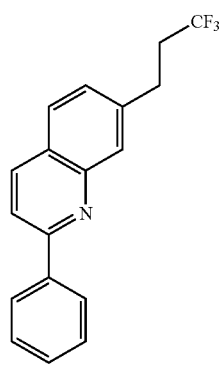
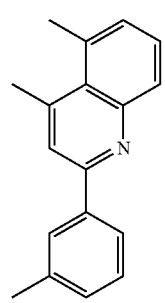

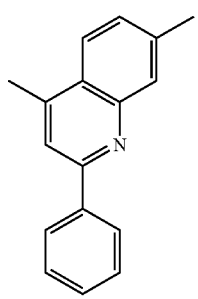 L<sub>b</sub>106
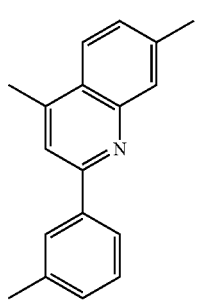 L<sub>b</sub>107
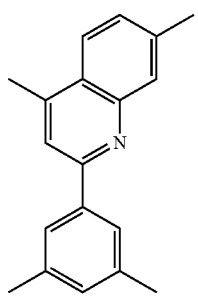 L<sub>b</sub>108
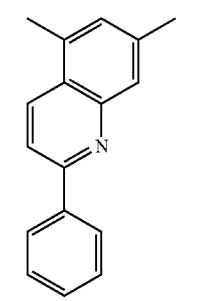 L<sub>b</sub>109
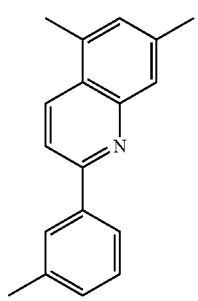 L<sub>b</sub>110
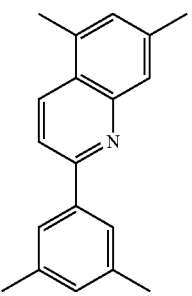 L<sub>b</sub>111
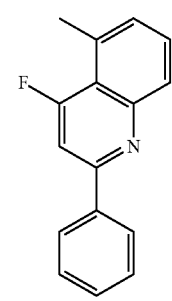 L<sub>b</sub>112
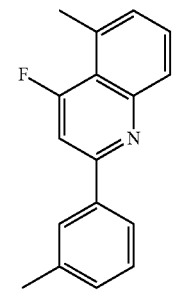 L<sub>b</sub>113
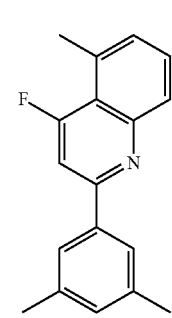 L<sub>b</sub>114
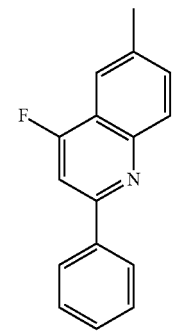 L<sub>b</sub>115

-continued
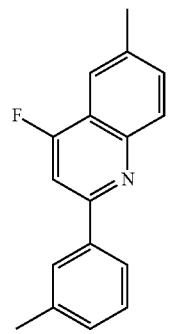
L_b116
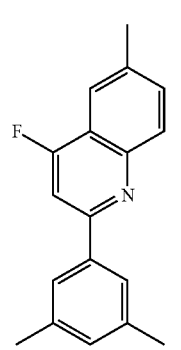
L_b117
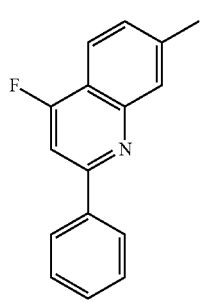
L_b118
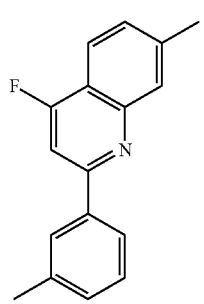
L_b119
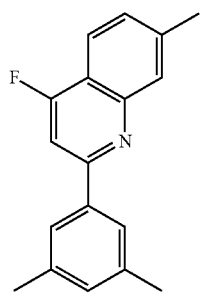
L_b120
-continued
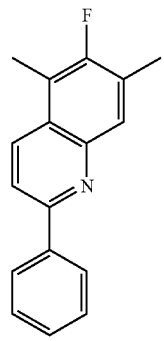
L_b121
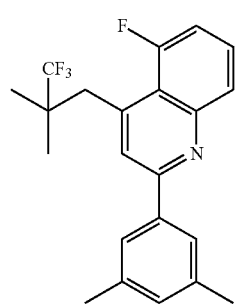
L_b122
L_b123
L_b124

-continued
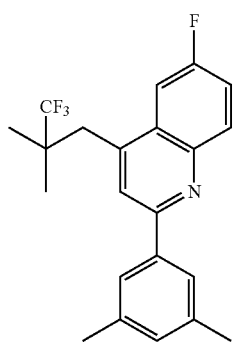 $L_{b125}$
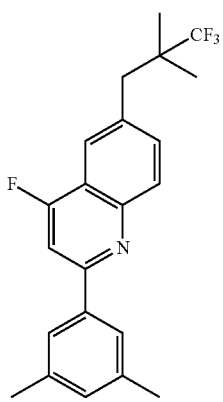 $L_{b126}$
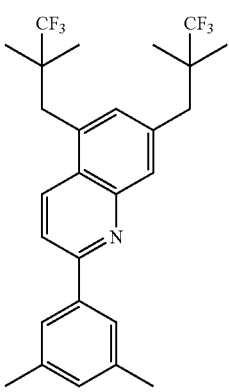 $L_{b127}$
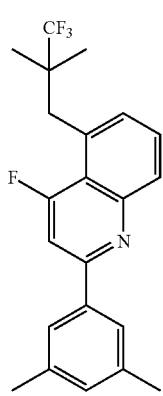 $L_{b128}$
-continued
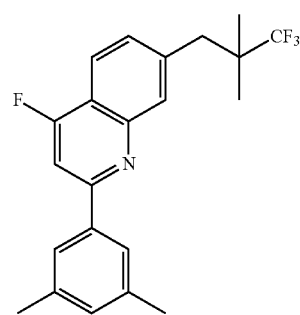 $L_{b129}$
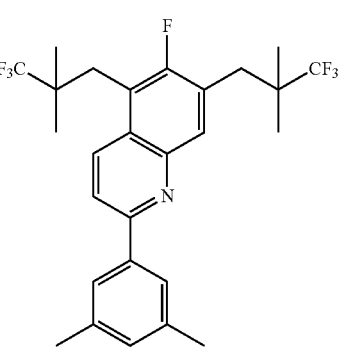 $L_{b130}$
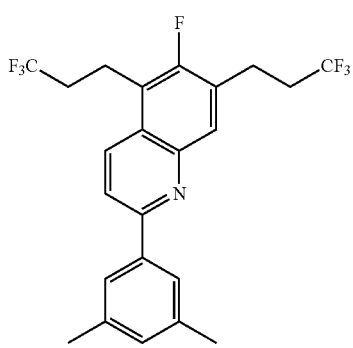 $L_{b131}$
$L_{b132}$

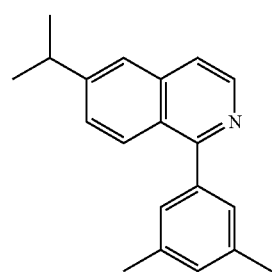
L_b133
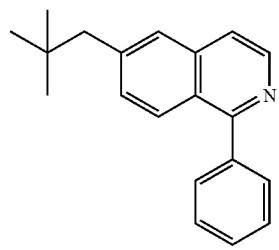
L_b139
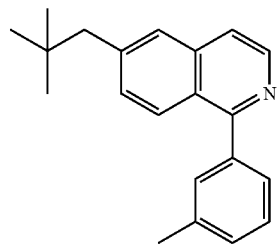
L_b140
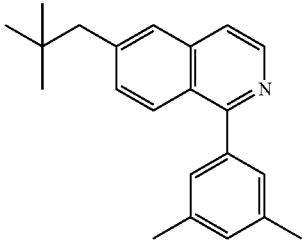
L_b141
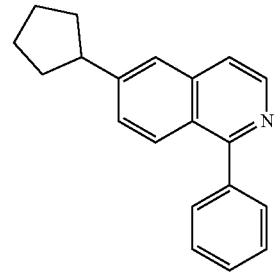
L_b142
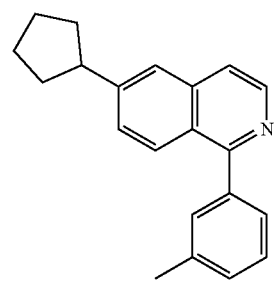
L_b143
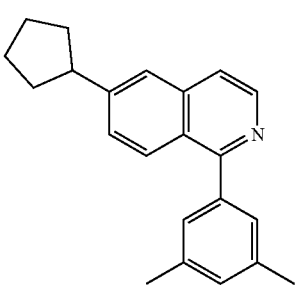
L_b144

L<sub>b</sub>145
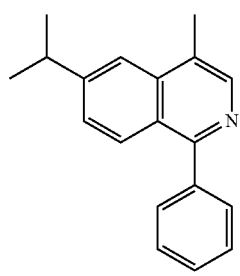
L<sub>b</sub>146
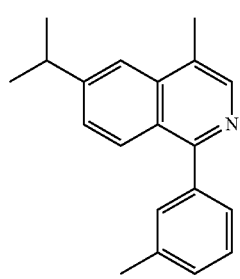
L<sub>b</sub>147
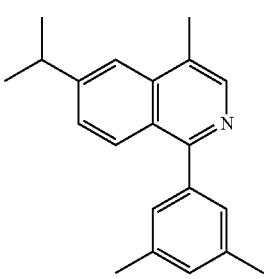
L<sub>b</sub>148
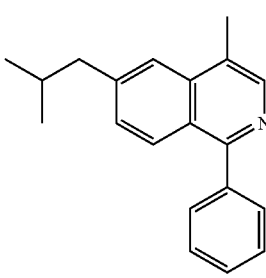
L<sub>b</sub>149
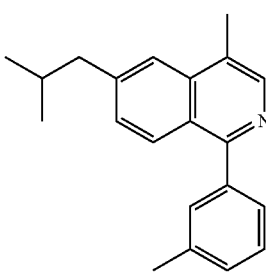
L<sub>b</sub>150
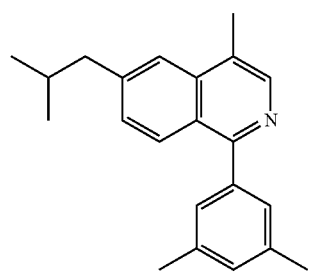
L<sub>b</sub>151
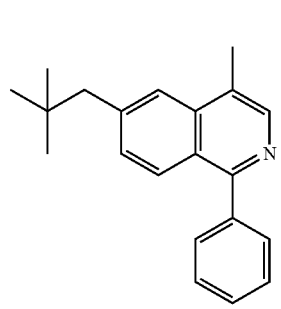
L<sub>b</sub>152
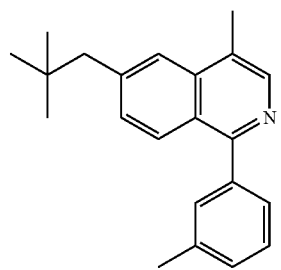
L<sub>b</sub>153
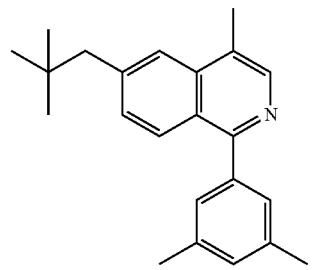
L<sub>b</sub>154
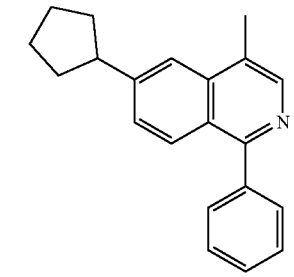

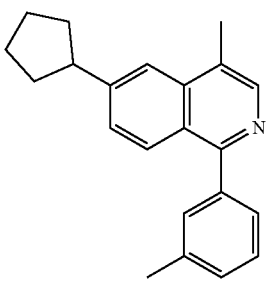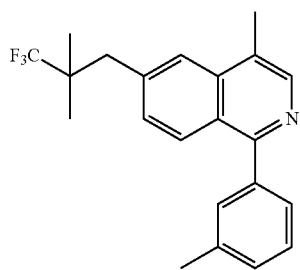

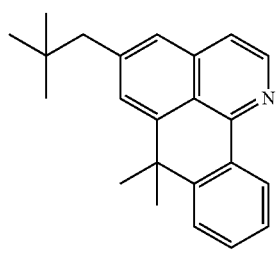 L<sub>b167</sub>
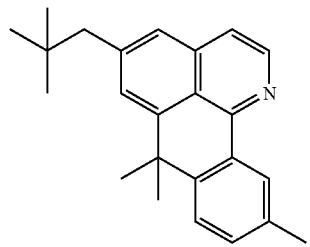 L<sub>b168</sub>
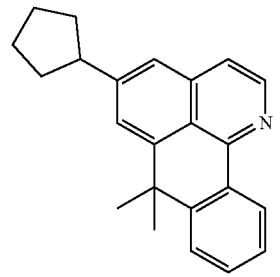 L<sub>b169</sub>
L<sub>b170</sub>
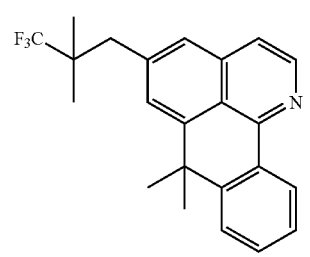 L<sub>b171</sub>
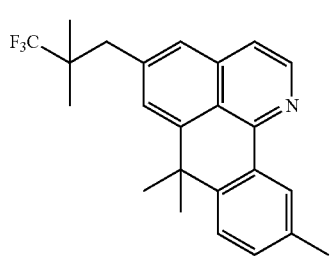 L<sub>b172</sub>
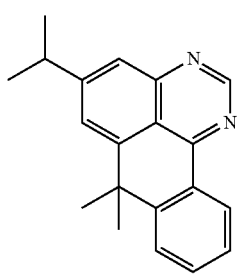 L<sub>b173</sub>
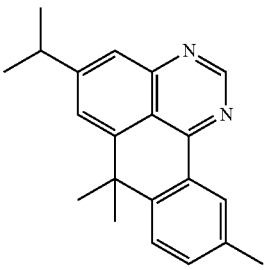 L<sub>b174</sub>
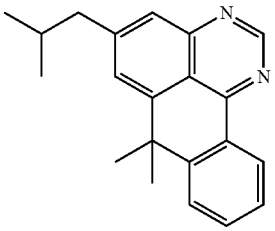 L<sub>b175</sub>
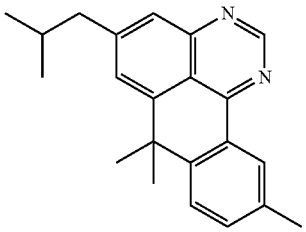 L<sub>b176</sub>
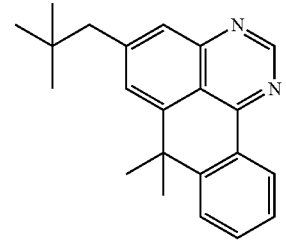 L<sub>b177</sub>
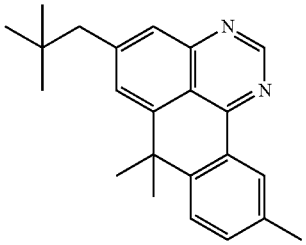 L<sub>b178</sub>

-continued
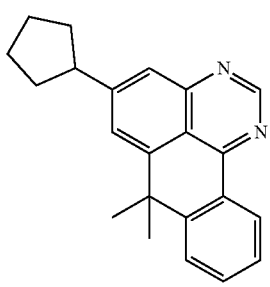
L<sub>b179</sub>
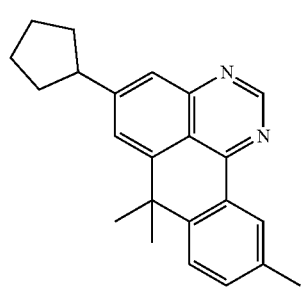
L<sub>b180</sub>
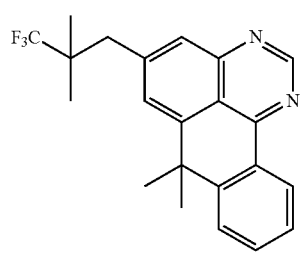
L<sub>b181</sub>
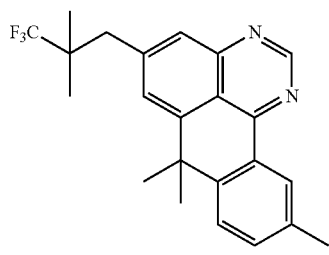
L<sub>b182</sub>
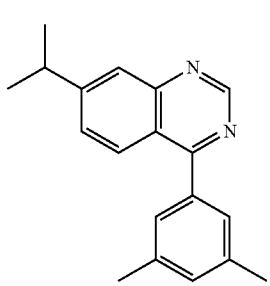
L<sub>b183</sub>
-continued
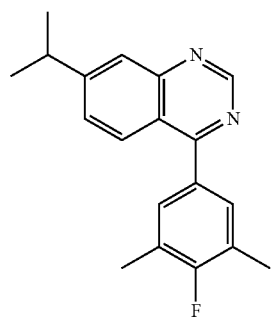
L<sub>b184</sub>
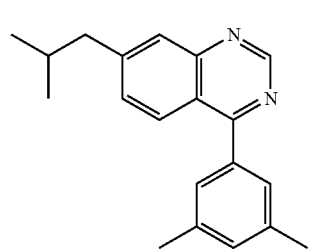
L<sub>b185</sub>
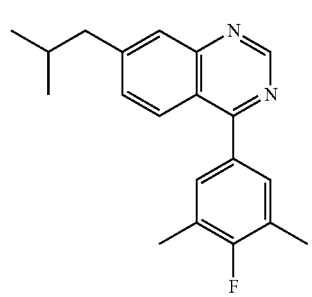
L<sub>b186</sub>
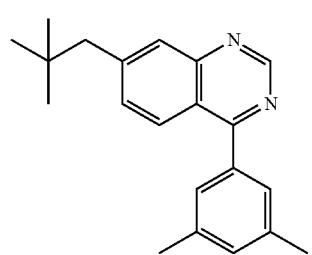
L<sub>b187</sub>
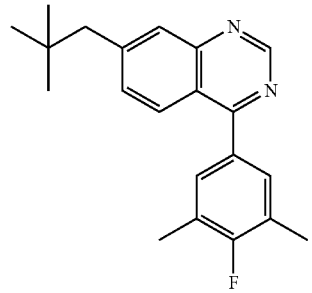
L<sub>b188</sub>

-continued
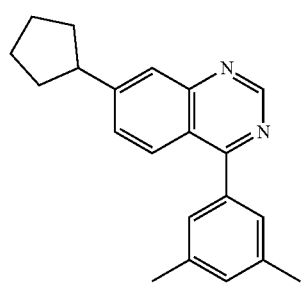
L_b189
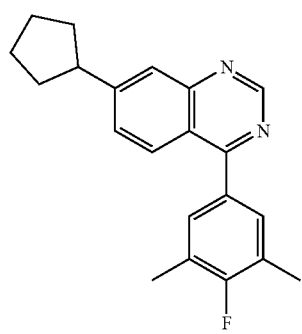
L_b190
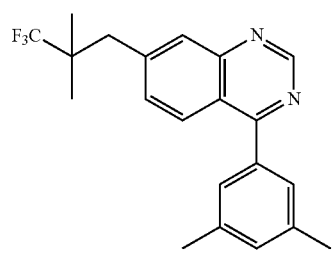
L_b191
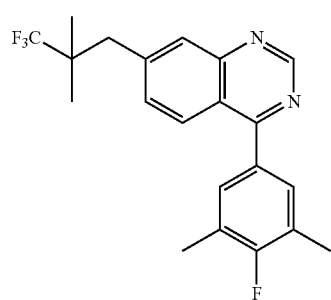
L_b192
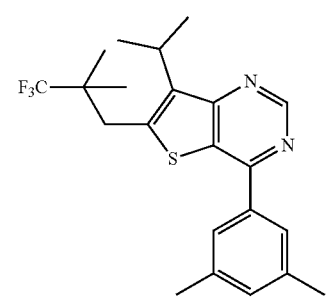
L_b193
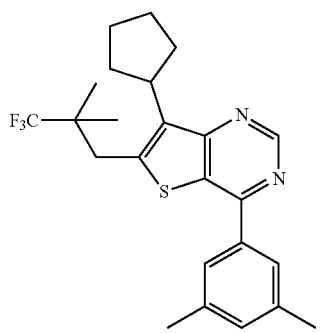
L_b194
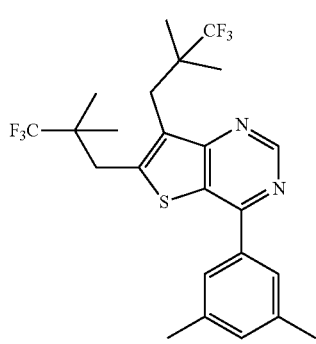
L_b195
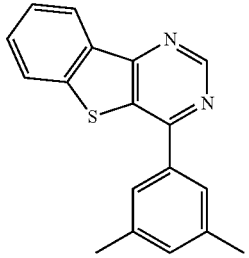
L_b196
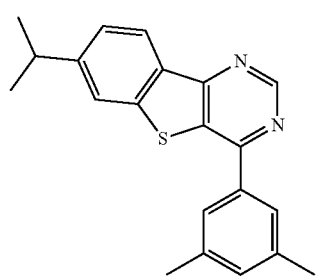
L_b197
L_b198

L_{b199}

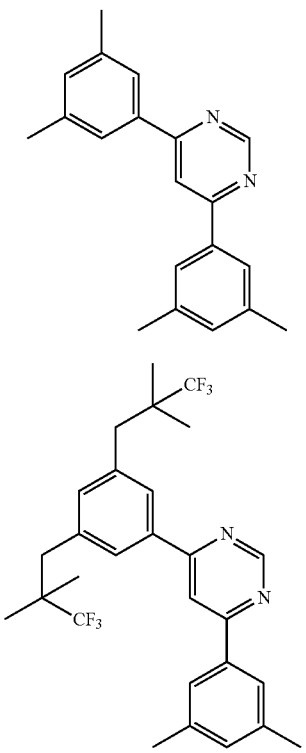

L_{b200}

In one embodiment, wherein $L_a$ and $L_b$ can be partially or fully deuterated.

In one embodiment, the metal complex has the formula of $Ir(L_a)(L_b)_2$, wherein $L_a$ is selected from any one of $L_{a1}$ to $L_{a74}$, and $L_b$ is selected from any one of $L_{b1}$ to $L_{b200}$, or any combination of two of $L_{b1}$ to $L_{b200}$.

According to another embodiment, an electroluminescent device is disclosed. The electroluminescent device comprises: an anode, a cathode, and an organic layer, disposed between the anode and the cathode, comprising a meal complex comprising a ligand $L_a$ with formula 1:

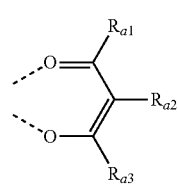

Formula 1

Wherein $R_{a1}$, $R_{a2}$, and $R_{a3}$ are each independently selected from the group consisting of hydrogen, deuterium, halogen, a substituted or unsubstituted alkyl group having 1 to 20 carbon atoms, a substituted or unsubstituted cycloalkyl group having 3 to 20 ring carbon atoms, a substituted or unsubstituted heteroalkyl group having 1 to 20 carbon atoms, a substituted or unsubstituted arylalkyl group having 7 to 30 carbon atoms, a substituted or unsubstituted alkoxy group having 1 to 20 carbon atoms, a substituted or unsubstituted aryloxy group having 6 to 30 carbon atoms, a substituted or unsubstituted alkenyl group having 2 to 20 carbon atoms, a substituted or unsubstituted aryl group having 6 to 30 carbon atoms, a substituted or unsubstituted heteroaryl group having 3 to 30 carbon atoms, a substituted or unsubstituted alkylsilyl group having 3 to 20 carbon atoms, a substituted or unsubstituted arylsilyl group having 6 to 20 carbon atoms, a substituted or unsubstituted amino group having 0 to 20 carbon atoms, an acyl group, a carbonyl group, a carboxylic acid group, an ester group, a nitrile group, an isonitrile group, a sulfanyl group, a sulfinyl group, a sulfonyl group, a phosphino group, and combinations thereof;

At least one of $R_{a1}$, $R_{a2}$, and $R_{a3}$ has a structure represented by formula 2:

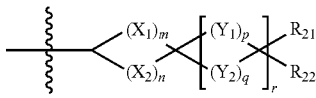

Formula 2

Wherein $X_1$, $X_2$, $Y_1$, $Y_2$ are each independently selected from the group consisting of CRR', NR, O, S, and combinations thereof;

m, n, p, q are 1, 2, 3, or 4;

When m, n, p, q are each independently selected from 2, 3 or 4, the corresponding plurality of $X_1$ can be the same or different, the corresponding plurality of $X_2$ can be the same or different, the corresponding plurality of $Y_1$ can be the same or different, the corresponding plurality of $Y_2$ can be the same or different;

r is 0, 1, 2, 3;

R, R', $R_{21}$ and $R_{22}$ are each independently selected from the group consisting of hydrogen, deuterium, halogen, a substituted or unsubstituted alkyl group having 1 to 20 carbon atoms, a substituted or unsubstituted cycloalkyl group having 3 to 20 ring carbon atoms, a substituted or unsubstituted heteroalkyl group having 1 to 20 carbon atoms, a substituted or unsubstituted arylalkyl group having 7 to 30 carbon atoms, a substituted or unsubstituted alkoxy group having 1 to 20 carbon atoms, a substituted or unsubstituted aryloxy group having 6 to 30 carbon atoms, a substituted or unsubstituted alkenyl group having 2 to 20 carbon atoms, a substituted or unsubstituted aryl group having 6 to 30 carbon atoms, a substituted or unsubstituted heteroaryl group having 3 to 30 carbon atoms, a substituted or unsubstituted alkylsilyl group having 3 to 20 carbon atoms, a substituted or unsubstituted arylsilyl group having 6 to 20 carbon atoms, a substituted or unsubstituted amino group having 0 to 20 carbon atoms, an acyl group, a carbonyl group, a carboxylic acid group, an ester group, a nitrile group, an isonitrile group, a sulfanyl group, a sulfinyl group, a sulfonyl group, a phosphino group, and combinations thereof;

When r is 0, at least one of $R_{21}$ and $R_{22}$ is not hydrogen or deuterium.

In one embodiment, wherein the organic layer is the emissive layer and the metal complex is the emitter.

In one embodiment, wherein the device emits red light.

In one embodiment, wherein the organic layer further comprises a host compound.

In one embodiment, wherein the organic layer further comprises a host compound, and the host compound comprises a donor part and an acceptor part.

In one embodiment, wherein the organic layer further comprises a host compound, wherein the host compound comprises at least one chemical group selected from the group consisting of carbazole, azacarbazole, indolocarbazole, dibenzothiophene, dibenzofuran, triphenylene, naphthalene, phenanthrene, triazine, quinazoline, quinoxaline, azadibenzothiophene, azadibenzofuran and the combinations thereof.

According to yet another embodiment, a formulation comprising a metal complex having a ligand $L_a$ represented by Formula 1 is also disclosed. The metal complex having a ligand $L_a$ represented by Formula 1 is described in any of the above embodiments.

Combination with Other Materials

The materials described herein as useful for a particular layer in an organic light emitting device may be used in combination with a wide variety of other materials present in the device. The combinations of these materials are described in more detail in U.S. Pat. App. No. 20160359122 at paragraphs 0132-0161, which are incorporated by reference in its entirety. The materials described or referred to the disclosure are non-limiting examples of materials that may be useful in combination with the compounds disclosed herein, and one of skill in the art can readily consult the literature to identify other materials that may be useful in combination.

The materials described herein as useful for a particular layer in an organic light emitting device may be used in combination with a variety of other materials present in the device. For example, emissive dopants disclosed herein may be used in combination with a wide variety of hosts, transport layers, blocking layers, injection layers, electrodes and other layers that may be present. The combination of these materials is described in detail in paragraphs 0080-0101 of U.S. Pat. App. No. 20150349273, which are incorporated by reference in its entirety. The materials described or referred to the disclosure are non-limiting examples of materials that may be useful in combination with the compounds disclosed herein, and one of skill in the art can readily consult the literature to identify other materials that may be useful in combination.

In the embodiments of material synthesis, all reactions were performed under nitrogen protection unless otherwise stated. All reaction solvents were anhydrous and used as received from commercial sources. Synthetic products were structurally confirmed and tested for properties using one or more conventional equipment in the art (including, but not limited to, nuclear magnetic resonance instrument produced by BRUKER, liquid chromatograph produced by SHIMADZU, liquid chromatography-mass spectrometer produced by SHIMADZU, gas chromatography-mass spectrometer produced by SHIMADZU, differential Scanning calorimeters produced by SHIMADZU, electrochemical workstation produced by WUHAN CORRTEST, and sublimation apparatus produced by ANHUI BEQ, etc.) by methods well known to the persons skilled in the art. In the embodiments of the device, the characteristics of the device were also tested using conventional equipment in the art (including, but not limited to, evaporator produced by ANGSTROM ENGINEERING, optical testing system produced by SUZHOU FATAR, life testing system produced by SUZHOU FATAR, and ellipsometer produced by BEIJING ELLITOP, etc.) by methods well known to the persons skilled in the art. As the persons skilled in the art are aware of the above-mentioned equipment use, test methods and other related contents, the inherent data of the sample can be obtained with certainty and without influence, so the above related contents are not further described in this patent.

Material Synthesis Example

The method for preparing the compounds (including the ligand $L_a$, the metal complex, and the ligand $L_b$) of the present invention is not limited. The compound $Ir(L_{a7})(L_{b18})_2$ is exemplified as a typical but non-limiting example, and its synthesis route and preparation method are as follows:

Synthesis of Compound $Ir(L_{a7})(L_{b18})_2$

Step 1:

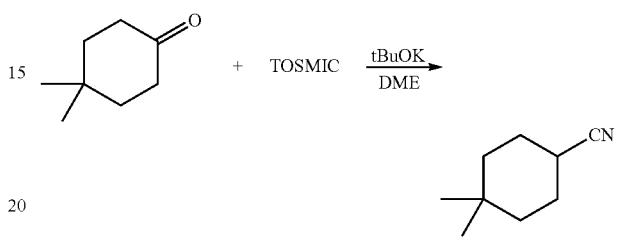

Synthesis of 4,4-dimethylcyclohexanecarbonitrile. At 0° C., to a solution of 4,4-dimethylcyclohexanone (64 g, 507 mmol) in dimethoxyethane (1 L) was added potassium tert-butoxide (114 g, 1.01 mol) and 1-[(isocyanomethyl)sulfonyl]-4-methyl-benzene (99 g, 507 mmol) successively. The resulting mixture was then stirred at room temperature for 2 h. The reaction mixture was filtered to remove insoluble solid, which was rinsed with DME (400 mL×3). The solvent was removed under reduced pressure and the residue was purified by flash chromatography eluting with 100% petroleum ether and followed by vacuum distillation to yield 4,4-dimethylcyclohexanecarbonitrile as colorless oil (24 g, 34%). Product structure was confirmed by NMR and GCMS.

Step 2:

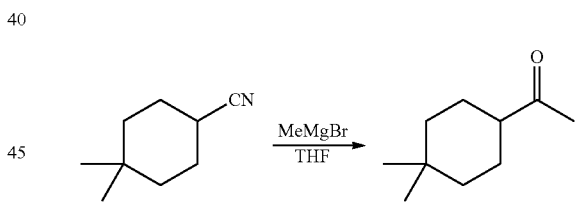

Synthesis of 1-(4,4-dimethylcyclohexyl)ethanone. 4,4-dimethylcyclohexanecarbonitrile (6.86 g, 50 mmol) was dissolved in 50 mL anhydrous THF in a 250 mL two-neck round bottom flask. The solution was purged with nitrogen for 5 min and then cooled in an ice-water bath. 22 mL of 3 M methyl magnesium bromide THF solution was added dropwise and the resulting mixture was heated under reflux for 3 h. The reaction was then cooled to 0° C. and 30 mL of 3 M HCl was added slowly. After that the reaction mixture was allowed to warm up to room temperature and stirred at room temperature for 1 h and then extracted with ethyl acetate. The organic layer was collected, washed with brine and dried over anhydrous sodium sulfate. The solvent was removed under reduced pressure and the residue was purified by flash chromatography (eluent: ethyl acetate/petroleum ether=1/100) to give 1-(4,4-dimethylcyclohexyl)ethanone as light yellow oil (3.1 g, 40%). Product structure was confirmed by NMR and GCMS.

Step 3:

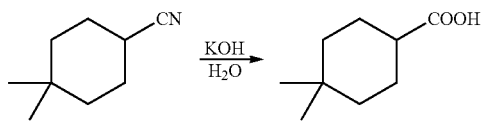

Synthesis of 4,4-dimethylcyclohexanecarboxylic acid. 4,4-dimethylcyclohexanecarbonitrile (6.86 g, 50 mmol) was added to 200 mL of 5 M aqueous potassium hydroxide solution in a 500 mL, round bottom flask. The resulting mixture was then heated to reflux for 24 h. After cooling to room temperature, the reaction mixture was washed with diethyl ether (200 mL×2) and the aqueous phase was neutralized with 2 M aq. HCl carefully. The resulting solution was then extracted with diethyl ether (200 mL×2) and the combined organic phase was washed with brine and dried over Na$_2$SO$_4$. The solvent was removed under reduced pressure to give 4,4-dimethylcyclohexanecarboxylic acid as white solid (7.37 g, 94%) which was used in next step without further purification. Product structure was confirmed by NMR and GCMS.

Step 4:

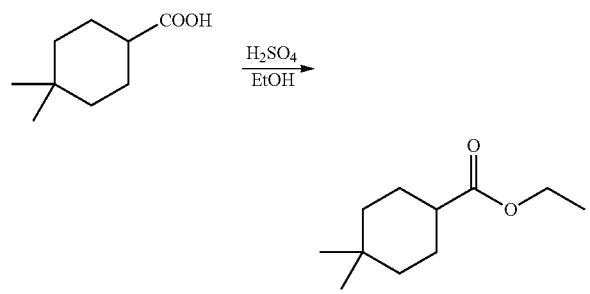

Synthesis of ethyl 4,4-dimethylcyclohexane-1-carboxylate. To a solution of 4,4-dimethylcyclohexanecarboxylic acid (7.37 g, 47.1 mmol) in ethanol (300 mL) was added catalytic amount of H$_2$SO$_4$ carefully at room temperature. The resulting mixture was then stirred at 70° C. for 2 h. After cooling, the solvent was removed under reduced pressure to give ethyl 4,4-dimethylcyclohexane-1-carboxylate as light yellow oil (7.78 g, 90%) which was used in next step without further purification.

Step 5:

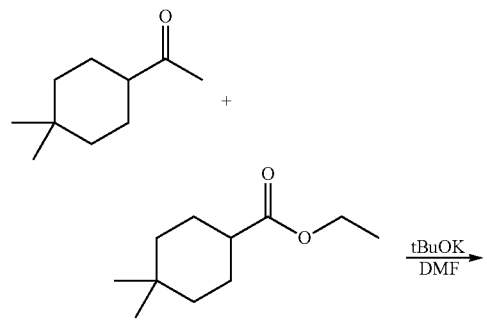

-continued

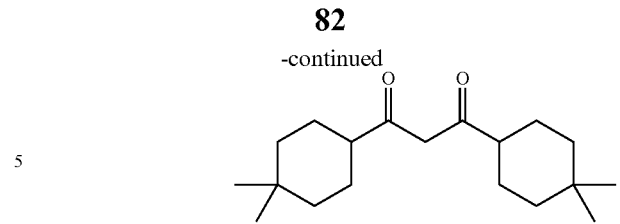

Synthesis of 1,3-bis(4,4-dimethylcyclohexyl)propane-1,3-dione. Potassium tert-butoxide (2.83 g, 25.2 mmol) was added to 9 mL DMF in a 50 mL two-neck round bottom flask under room temperature. The resulting mixture was purged with nitrogen for 5 min and then heated to 55° C. until potassium tert-butoxide fully dissolved. 1-(4,4-dimethylcyclohexyl)ethan-1-one (1.3 g, 8.4 mmol) in 4 mL DMF and ethyl 4,4-dimethylcyclohexane-1-carboxylate (1.86 g, 10.1 mmol) in 4 mL DMF were then added successively and the resulting solution was stirred under 55° C. overnight. After cooling to room temperature, 30 mL saturated aqueous NH$_4$Cl was added and precipitate formed. The solid was collected via filtration and washed with water several times to give yellow crude product which was then recrystallized in hot ethanol to yield pure 1,3-bis(4,4-dimethylcyclohexyl)propane-1,3-dione as colorless crystal (1.8 g, 73%). Product structure was confirmed by NMR and GCMS.

Step 6:

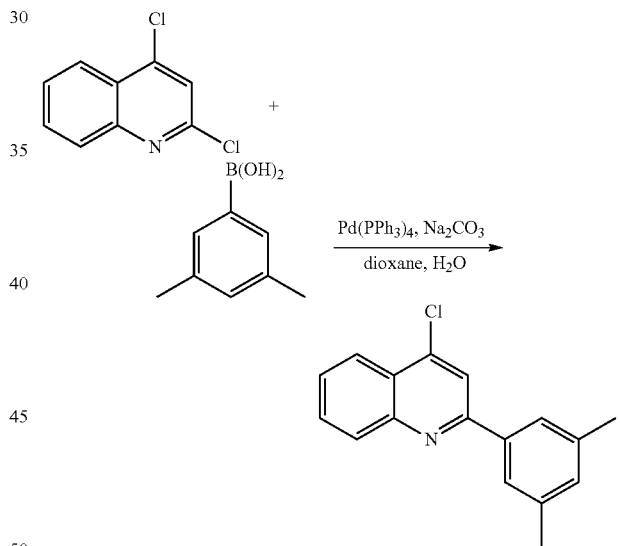

Synthesis of 4-chloro-2-(3,5-dimethylphenyl)quinoline. 2,4-dichloroquinoline (24 g, 121 mmol), 3,5-dimethylphenyl)boronic acid (18.2 g, 121 mmol), tetrakis(triphenylphosphine)palladium(0) (Pd(PPh$_3$)$_4$)(6.99 g, 6.05 mmol) and sodium carbonate (19.2 g, 181.5 mmol) were added to 480 mL 1,4-dioxane and 120 mL water in a 1 L three-neck round bottom flask under room temperature. The resulting mixture was purged with nitrogen for 5 min and refluxed overnight under nitrogen. After cooling to room temperature, the reaction mixture was filtrated through Celite and The Celite was washed with water and ethyl acetate. The layers were separated and the aqueous layer was extracted with ethyl acetate. The organic layer was then collected, dried over anhydrous Na$_2$SO$_4$ and evaporated to residue. The residue was purified by flash chromatography (eluent: ethyl acetate/petroleum ether=1/100, v/v) to give the crude product which was further recrystallized from ethanol to give pure 4-chloro-2-(3,5-dimethylphenyl)quinolone as white crystal (8.3 g, 26%). Product structure was confirmed by NMR and GCMS.

Step 7:

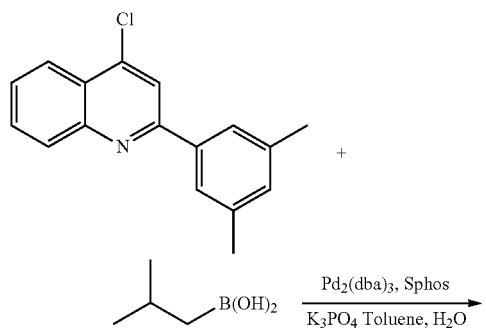

Synthesis of 2-(3,5-dimethylphenyl)-4-isobutylquinoline. 4-chloro-2-(3,5-dimethylphenyl)quinolone (8.3 g, 31 mmol), isobutylboronic acid (6.32 g, 62 mmol), tris(dibenzylideneacetone)dipalladium(0) (284 mg, 0.31 mmol), 2-dicyclohexylphosphino-2',6'-dimethoxy-1,1'-biphenyl (Sphos) (509 mg, 1.24 mmol) and potassium phosphate (19.7 g, 93 mmol) were added to 150 mL toluene and 50 mL water in a 500 mL three-neck round bottom flask under room temperature. The resulting mixture was purged with nitrogen for 5 min and refluxed overnight under nitrogen. After cooling to room temperature, the reaction mixture was filtrated through Celite and The Celite was washed with water and ethyl acetate. The layers were separated and the aqueous layer was extracted with ethyl acetate. The organic layer was then collected, dried over anhydrous $Na_2SO_4$ and evaporated to residue. The residue was purified by flash chromatography (eluent: ethyl acetate/petroleum ether=1/100, v/v) to give 2-(3,5-dimethylphenyl)-4-isobutylquinoline as colorless oil (8.5 g, 95%). Product structure was confirmed by NMR and GCMS.

Step 8:

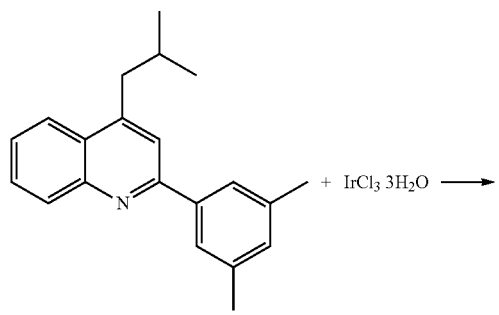

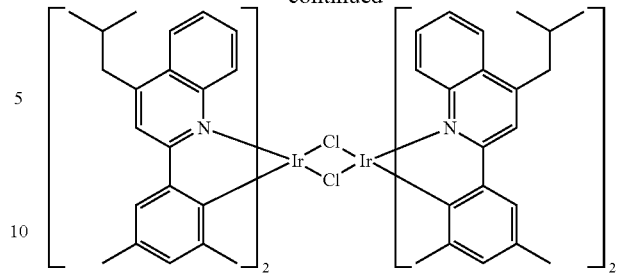

Synthesis of iridium dimer. A mixture of 2-(3,5-dimethylphenyl)-4-isobutylquinoline (3.5 g, 12 mmol), $IrCl_3 \cdot 3H_2O$ (853 mg, 2.4 mmol), 2-ethoxyethanol (27 mL) and water (9 mL) was refluxed under nitrogen for 24 h. After cooling to room temperature, the solvent was removed under reduced pressure to give the iridium dimer that was used in next step without further purification.

Step 9:

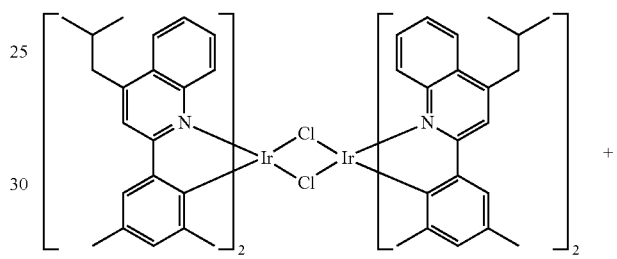

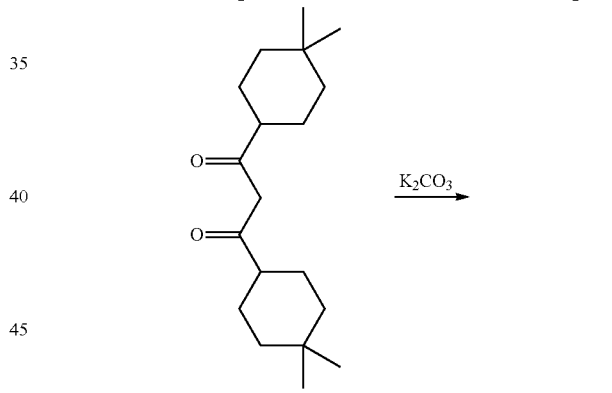

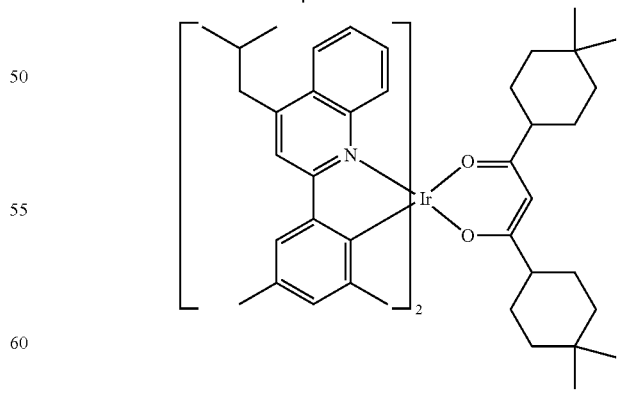

Synthesis of Compound $Ir(L_{a7})(L_{b18})_2$. Dimer (1.2 mmol), 1,3-bis(4,4-dimethylcyclohexyl)propane-1,3-dione (1.4 g, 4.8 mmol), $K_2CO_3$ (1.66 g, 12 mmol), and 2-ethoxyethanol (36 mL) was stirred at room temperature under nitrogen for 24 h. The precipitate was filtrated through Celite and washed with ethanol. Dichloromethane was added to the solid and the filtrate was collected. Then ethanol was added and the resulting solution was concentrated, but not to dryness. 1.8 g product was obtained after filtration. LCMS showed product molecular weight of 1060, identified as the target product.

The persons skilled in the art should know that the above preparation method is only an illustrative example, and the persons skilled in the art can obtain the structure of other compounds of the present invention by modifying the above preparation method. For example, the raw material 4,4-dimethylcyclohexanone in Step 1 may be replaced with other commercially available raw materials, including replacing the dimethyl substitution position with the corresponding substituent, and/or replacing the cyclohexanone with cyclobutanone, and the structure of the other ligand $L_a$ of the present invention can be obtained. For another example, for the $L_a$ ligand with asymmetric structure of the present invention, an ester having a corresponding structure can be directly purchased as the raw material of Step 5 instead of Steps 3 and 4.

Device Examples:

A glass substrate with 120 nm thick indium-tin-oxide (ITO) anode was first cleaned and then treated with oxygen plasma and UV ozone. After the treatments, the substrate was baked dry in a glovebox to remove moisture. The substrate was then mounted on a substrate holder and loaded into a vacuum chamber. The organic layers specified below were deposited in sequence by thermal vacuum deposition on the ITO anode at a rate of 0.2-2 Å/s at a vacuum of around $10^{-8}$ torr. Compound HI was used as the hole injection layer (HIL). Compound HT was used as the hole transporting layer (HTL). Compound EB was used as the electron blocking layer (EBL). Then the inventive compound or the comparative compound was doped in the host Compound RH as the emitting layer (EML). On the emitting layer, a mixture of Compound ET and 8-Hydroxyquinolinolato-lithium (Liq) was deposited as the electron transporting layer (ETL). Finally, 10 Å-thick Liq was deposited as the electron injection layer and 1000 Å of Al was deposited as the cathode. The device was then transferred back to the glovebox and encapsulated with a glass lid and a moisture getter to complete the device.

The detailed device layer structure and thicknesses are shown in the table below. The materials used for EML and ETL were obtained by doping different compounds in the stated weight ratios.

TABLE 1

Device structure of device examples

| Device ID | HIL | HTL | EBL | EML | ETL |
|---|---|---|---|---|---|
| Example 1 | Compound HI (100 Å) | Compound HT (400 Å) | Compound EB (50 Å) | Compound RH:Compound Ir($L_{a7}$)($L_{b18}$)$_2$ (97:3) (400 Å) | Compound ET:Liq (35:65) (350 Å) |
| Comparative Example 1 | Compound HI (100 Å) | Compound HT (400 Å) | Compound EB (50 Å) | Compound RH:Compound A (97:3) (400 Å) | Compound ET:Liq (35:65) (350 Å) |

The structures of the materials used in the devices are shown below:

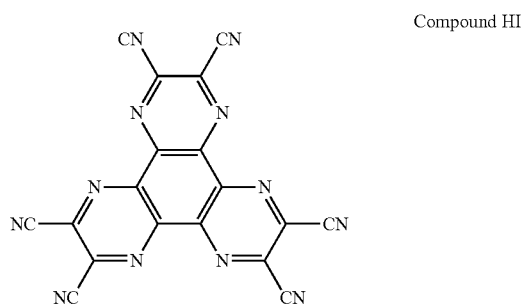

Compound HI

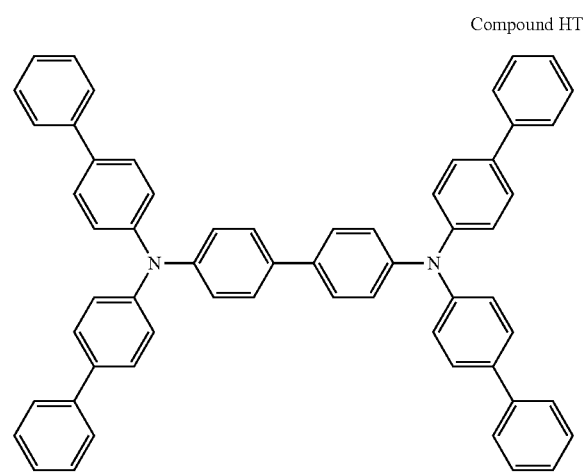

Compound HT

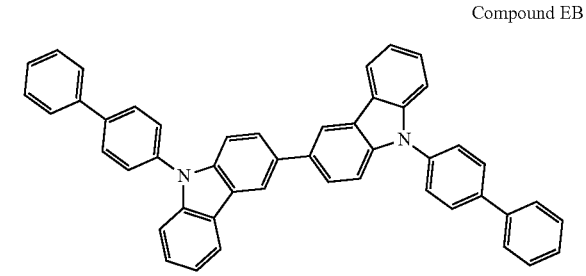

Compound EB

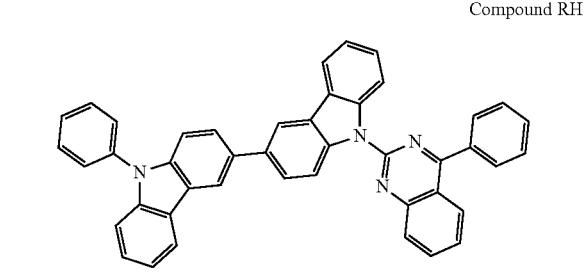

Compound RH

-continued

Compound ET

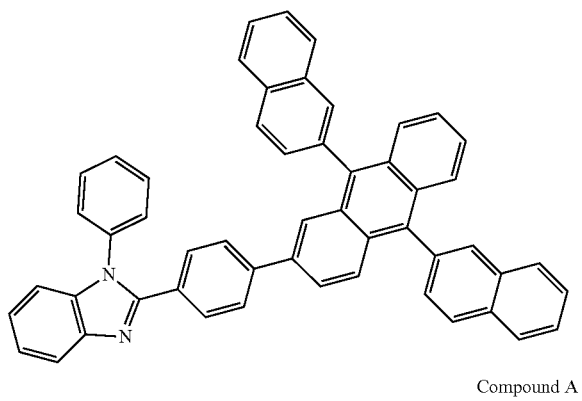

Compound A

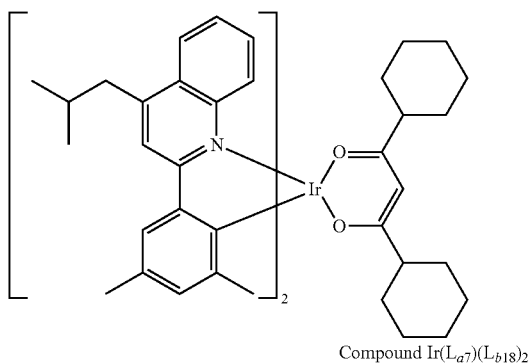

Compound Ir(L$_{a7}$)(L$_{b18}$)$_2$

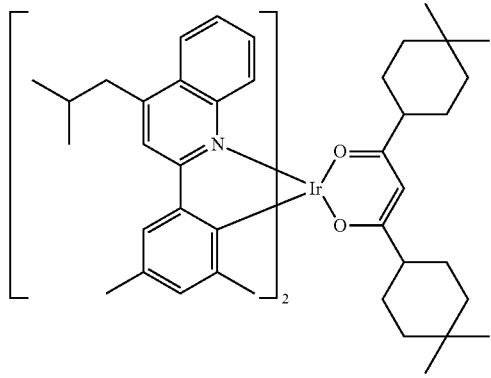

The IVL and lifetime characteristics of the devices were measured at various current densities and voltages. The luminance efficiency (LE), external quantum efficiency (EQE), λmax, full width at half maximum (FWHM), voltage (V) and CIE data were measured at 1000 nits. The lifetime was tested at a constant current from an initial brightness of 7500 nits. The sublimation temperature (Sub T) of the material was tested.

TABLE 2

Device data

| Device ID | Sub T (° C.) | CIE (x, y) | λmax (nm) | FWHM (nm) | Voltage (V) | EQE (%) | LT95 (h) |
|---|---|---|---|---|---|---|---|
| Example 1 | 200 | (0.640, 0.359) | 607 | 52 | 3.4 | 27 | 1005 |
| Comparative Example 1 | 210 | (0.636, 0.363) | 606 | 53 | 3.4 | 28 | 835 |

Discussion

From the device data in table 2, the IVL characteristics of the inventive compound and comparative compound were similar. They both showed red color with narrow FWHM and high efficiency. However, the inventive compound showed unexpected lower sublimation temperature, although the molecular weight of the inventive compound is much higher than the comparative compound. In general, the lower the sublimation temperature, the less decomposition during the long term thermal stress for mass production. Moreover, the device lifetime with inventive compound is significantly longer than that of the comparative compound (1005 h vs. 835 h). Therefore, this invention provides better red emitters for commercial applications.

It is understood that the various embodiments described herein are by way of example only and are not intended to limit the scope of the invention. The present invention as claimed may therefore include variations from the particular examples and preferred embodiments described herein, as will be apparent to one of skill in the art. Many of the materials and structures described herein may be substituted with other materials and structures without deviating from the spirit of the invention. It is understood that various theories as to why the invention works are not intended to be limiting.

What is claimed is:
1. A metal complex comprising a ligand L$_a$ represented by Formula 1:

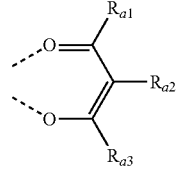

Formula 1

Wherein
R$_{a1}$, R$_{a2}$, and R$_{a3}$ are each independently selected from the group consisting of hydrogen, deuterium, halogen, a substituted or unsubstituted alkyl group having 1 to 20 carbon atoms, a substituted or unsubstituted cycloalkyl group having 3 to 20 ring carbon atoms, a substituted or unsubstituted heteroalkyl group having 1 to 20 carbon atoms, a substituted or unsubstituted arylalkyl group having 7 to 30 carbon atoms, a substituted or unsubstituted alkoxy group having 1 to 20 carbon atoms, a substituted or unsubstituted aryloxy group having 6 to 30 carbon atoms, a substituted or unsubstituted alkenyl group having 2 to 20 carbon atoms, a substituted or unsubstituted aryl group having 6 to 30 carbon atoms, a substituted or unsubstituted heteroaryl group having 3 to 30 carbon atoms, a substituted or unsubstituted alkylsilyl group having 3 to 20 carbon atoms, a substituted or unsubstituted arylsilyl group having 6 to 20 carbon atoms, a substituted or unsubstituted amino group having 0 to 20 carbon atoms, an acyl group, a carbonyl group, a carboxylic acid group, an ester group, a nitrile group, an isonitrile group, a sulfanyl group, a sulfinyl group, a sulfonyl group, a phosphino group, and combinations thereof;
At least one of R$_{a1}$, R$_{a2}$, and R$_{a3}$ has a structure represented by formula 2:

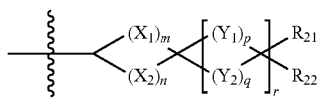

Formula 2

Wherein $X_1$, $X_2$, $Y_1$, $Y_2$ are each independently selected from the group consisting of CRR', NR", O, S, and combinations thereof;

m, n, p, q are each independently selected from 1, 2, 3, or 4;

When m, n, p, q are each independently selected from 2, 3 or 4, the corresponding plurality of $X_1$ may be the same or different, the corresponding plurality of $X_2$ may be the same or different, the corresponding plurality of $Y_1$ may be the same or different, the corresponding plurality of $Y_2$ may be the same or different;

r is 0, 1, 2, or 3;

R, R', R", $R_{21}$ and $R_{22}$ are each independently selected from the group consisting of hydrogen, deuterium, halogen, a substituted or unsubstituted alkyl group having 1 to 20 carbon atoms, a substituted or unsubstituted cycloalkyl group having 3 to 20 ring carbon atoms, a substituted or unsubstituted heteroalkyl group having 1 to 20 carbon atoms, a substituted or unsubstituted arylalkyl group having 7 to 30 carbon atoms, a substituted or unsubstituted alkoxy group having 1 to 20 carbon atoms, a substituted or unsubstituted aryloxy group having 6 to 30 carbon atoms, a substituted or unsubstituted alkenyl group having 2 to 20 carbon atoms, a substituted or unsubstituted aryl group having 6 to 30 carbon atoms, a substituted or unsubstituted heteroaryl group having 3 to 30 carbon atoms, a substituted or unsubstituted alkylsilyl group having 3 to 20 carbon atoms, a substituted or unsubstituted arylsilyl group having 6 to 20 carbon atoms, a substituted or unsubstituted amino group having 0 to 20 carbon atoms, an acyl group, a carbonyl group, a carboxylic acid group, an ester group, a nitrile group, an isonitrile group, a sulfanyl group, a sulfinyl group, a sulfonyl group, a phosphino group, and combinations thereof;

When r is 0, at least one of $R_{21}$ and $R_{22}$ is not hydrogen or deuterium; and Wherein the metal is selected from the group consisting of Ag, Au, Ru, Rh, Pd, Pt, Os, and Ir.

2. An electroluminescent device comprising an anode, a cathode, and an organic layer disposed between the anode and the cathode, the device comprising the metal complex according to claim 1.

3. The metal complex of claim 1, wherein the metal is selected from the group consisting of Pt and Ir.

4. The metal complex of claim 1, wherein $X_1$, $X_2$, $Y_1$, and $Y_2$ are CRR'.

5. The metal complex of claim 1, wherein r is 0.

6. The metal complex of claim 1, wherein r is 1.

7. The metal complex of claim 1, wherein $R_{21}$ and $R_{22}$ are each independently selected from the group consisting of a substituted or unsubstituted alkyl group having 1 to 20 carbon atoms, a substituted or unsubstituted cycloalkyl group having 3 to 20 ring carbon atoms, a substituted or unsubstituted heteroalkyl group having 1 to 20 carbon atoms, and combinations thereof.

8. The metal complex of claim 1, wherein $R_{21}$ and $R_{22}$ are selected from the group consisting of methyl, ethyl, propyl, isopropyl, isobutyl, trifluoromethyl, and neopentyl.

9. The metal complex of claim 1, wherein the complex has the formula of $M(L_a)_u(L_b)_v(L_c)_w$, wherein $L_b$ and $L_c$ are the second and third ligand coordinating to M, $L_b$ and $L_c$ can be the same of different;

$L_a$, $L_b$, and $L_c$ can be optionally joined to form a multidentate ligand;

Wherein u is 1, 2, or 3, v is 0, 1, or 2, w is 0, 1, or 2; u+v+w is the oxidation state of M;

Wherein $L_b$ and $L_c$ are independently selected from the group consisting of:

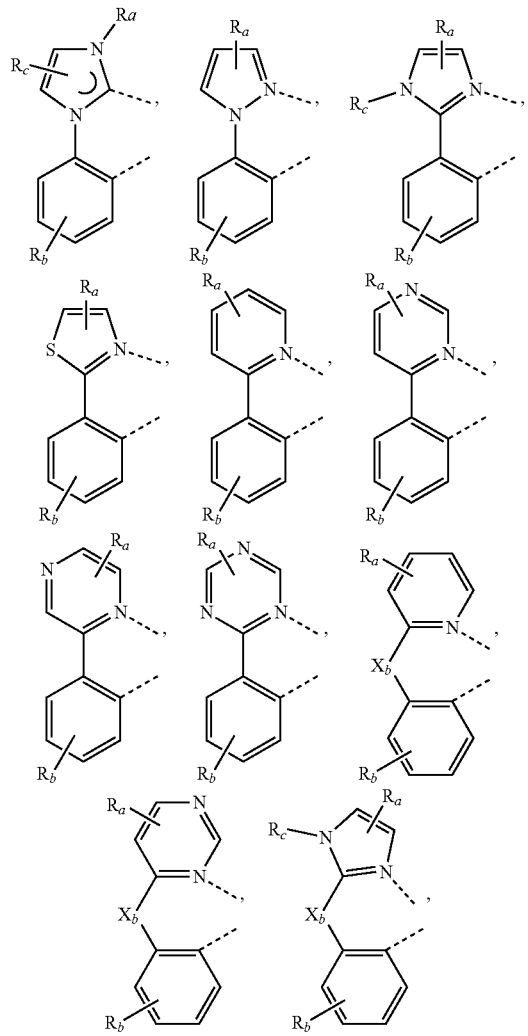

Wherein $R_a$, $R_b$, and $R_c$ can represent mono, di, tri, or tetra substitution or no substitution;

$R_a$, $R_b$, and $R_c$ are each independently selected from the group consisting of hydrogen, deuterium, halogen, a substituted or unsubstituted alkyl group having 1 to 20 carbon atoms, a substituted or unsubstituted cycloalkyl group having 3 to 20 ring carbon atoms, a substituted or unsubstituted heteroalkyl group having 1 to 20 carbon atoms, a substituted or unsubstituted arylalkyl group having 7 to 30 carbon atoms, a substituted or unsubstituted alkoxy group having 1 to 20 carbon atoms, a substituted or unsubstituted aryloxy group having 6 to 30 carbon atoms, a substituted or unsubstituted alkenyl group having 2 to 20 carbon atoms, a substituted or unsubstituted aryl group having 6 to 30 carbon atoms, a substituted or unsubstituted heteroaryl group having 3 to 30 carbon atoms, a substituted or unsubstituted alkylsilyl group having 3 to 20 carbon atoms, a substituted or unsubstituted arylsilyl group having 6 to 20 carbon atoms, a substituted or unsubstituted amino group having 0 to 20 carbon atoms, an acyl group, a carbonyl group, a carboxylic acid group, an ester group, a nitrile group, an isonitrile group, a sulfanyl group, a sulfinyl group, a sulfonyl group, a phosphino group, and combinations thereof;

two adjacent substituents are optionally joined to form a ring;

$X_b$ is selected from the group consisting of O, S, Se, $NR_{N1}$, and $CR_{C1}R_{C2}$;

$R_{N1}$, $R_{C1}$ and $R_{C2}$ are each independently selected from the group consisting of hydrogen, deuterium, halogen, a substituted or unsubstituted alkyl group having 1 to 20 carbon atoms, a substituted or unsubstituted cycloalkyl group having 3 to 20 ring carbon atoms, a substituted or unsubstituted heteroalkyl group having 1 to 20 carbon atoms, a substituted or unsubstituted arylalkyl group having 7 to 30 carbon atoms, a substituted or unsubstituted alkoxy group having 1 to 20 carbon atoms, a substituted or unsubstituted aryloxy group having 6 to 30 carbon atoms, a substituted or unsubstituted alkenyl group having 2 to 20 carbon atoms, a substituted or unsubstituted aryl group having 6 to 30 carbon atoms, a substituted or unsubstituted heteroaryl group having 3 to 30 carbon atoms, a substituted or unsubstituted alkylsilyl group having 3 to 20 carbon atoms, a substituted or unsubstituted arylsilyl group having 6 to 20 carbon atoms, a substituted or unsubstituted amino group having 0 to 20 carbon atoms, an acyl group, a carbonyl group, a carboxylic acid group, an ester group, a nitrile group, an isonitrile group, a sulfanyl group, a sulfinyl group, a sulfonyl group, a phosphino group, and combinations thereof.

10. The metal complex of claim 9, wherein the complex has the formula of $Ir(L_a)(L_b)_2$.

11. The metal complex of claim 9, wherein the ligand $L_a$ is selected from the group consisting of:

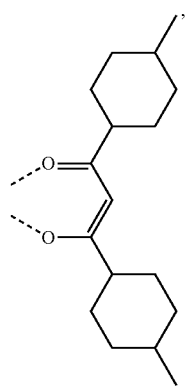

$L_{a1}$

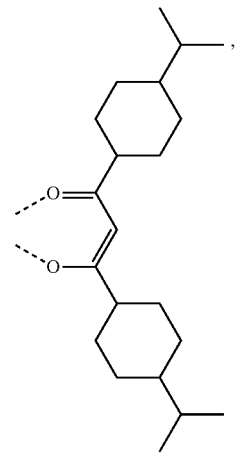

$L_{a2}$

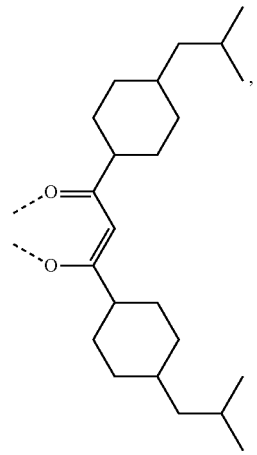

$L_{a3}$

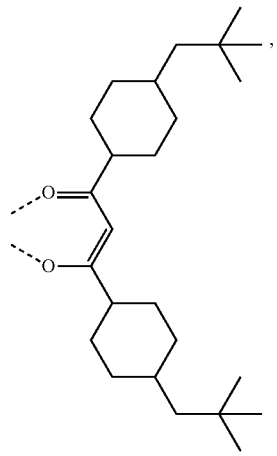

$L_{a4}$

L_{a5}
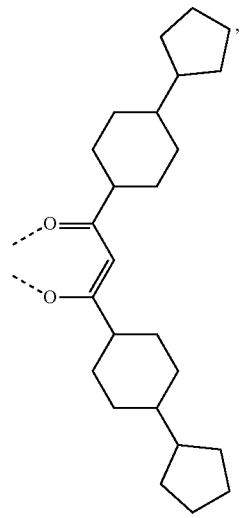
L_{a6}
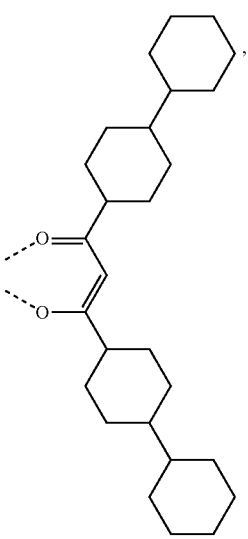
L_{a7}
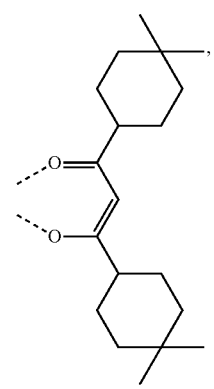
L_{a8}
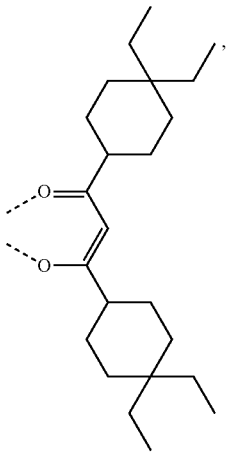
L_{a9}
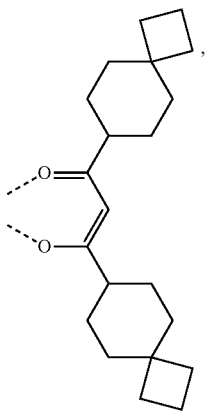
L_{a10}
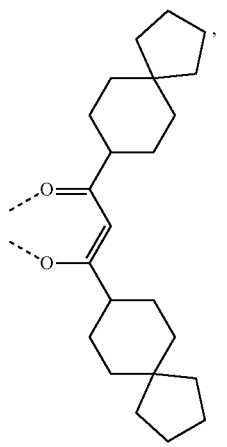

$L_{a11}$
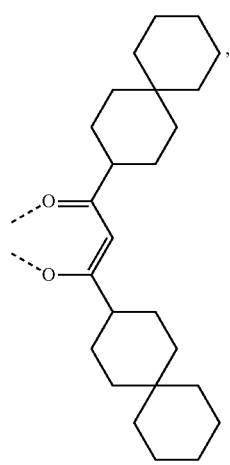
$L_{a12}$
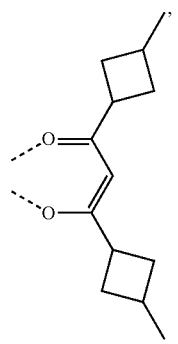
$L_{a13}$
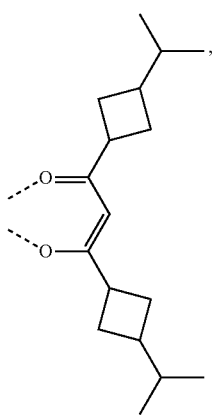
$L_{a14}$
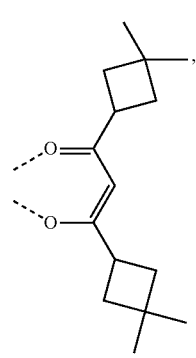
$L_{a15}$
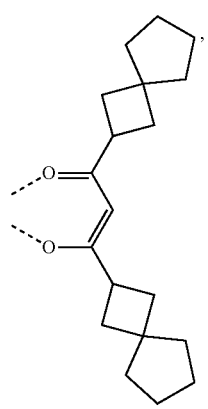
$L_{a16}$
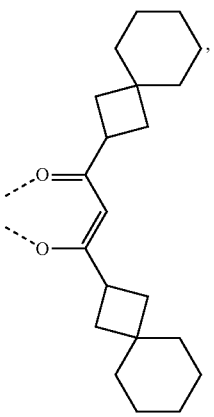
$L_{a17}$
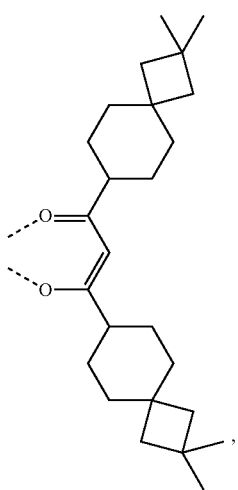

97
-continued
L_{a18}
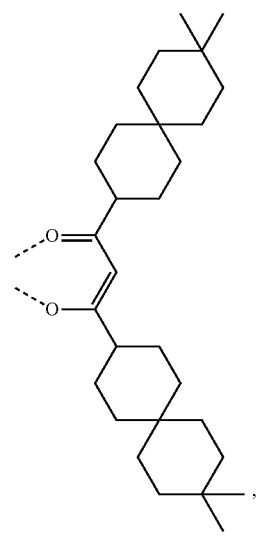
L_{a19}
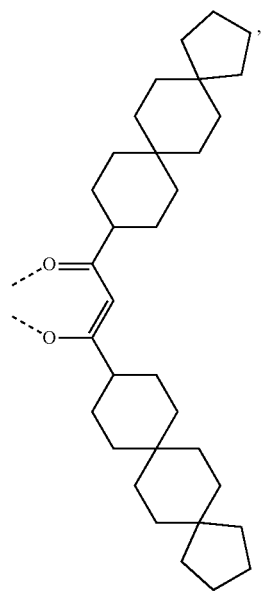
98
-continued
L_{a20}
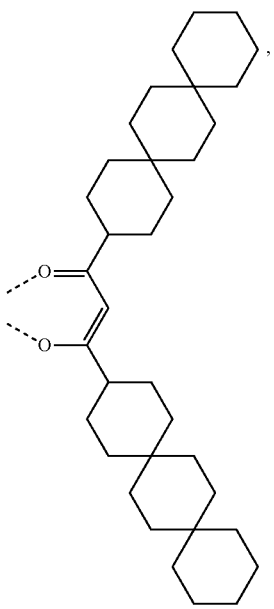
L_{a21}
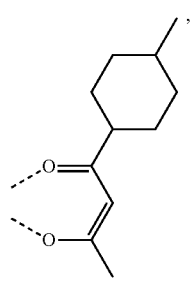
L_{a22}
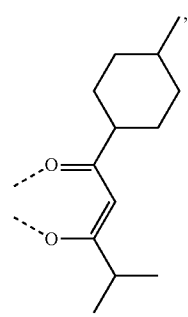
L_{a23}
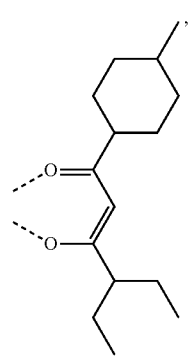

L$_{a24}$ 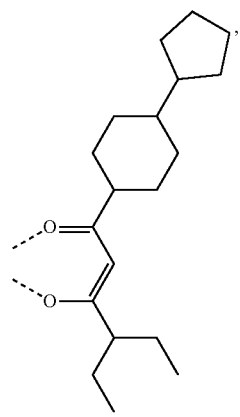
L$_{a25}$ 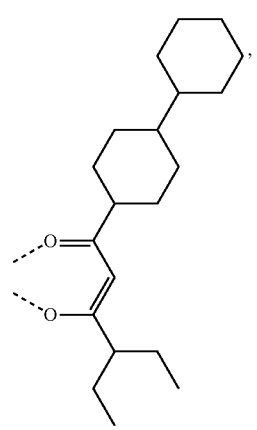
L$_{a26}$ 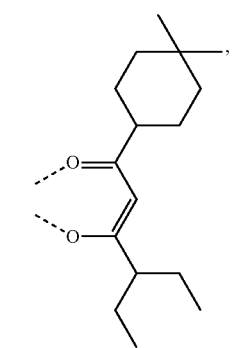
L$_{a27}$ 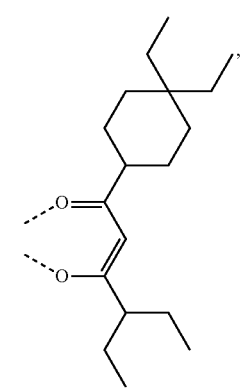
L$_{a28}$ 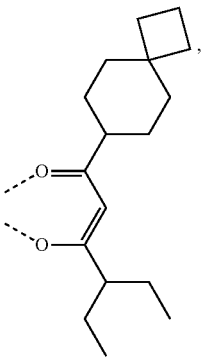
L$_{a29}$ 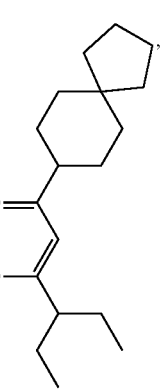
L$_{a30}$ 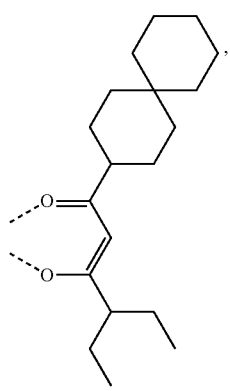
L$_{a31}$ 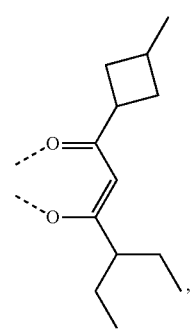

101
-continued
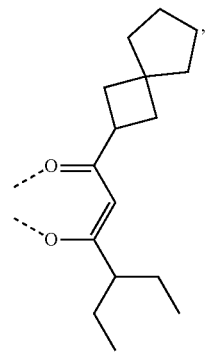
L_{a32}
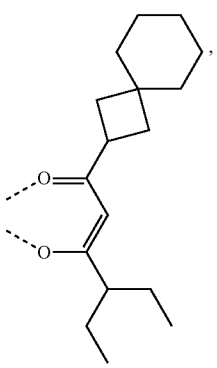
L_{a33}
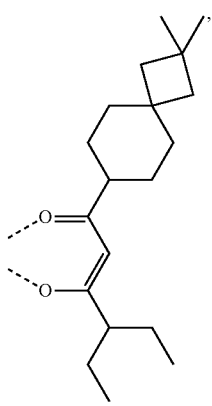
L_{a34}
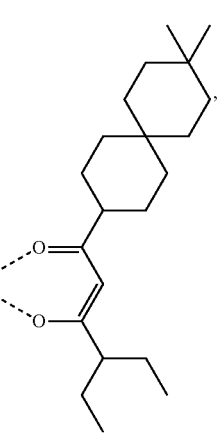
L_{a35}
102
-continued
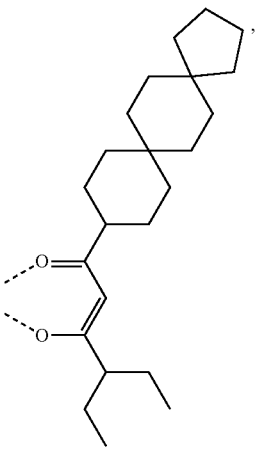
L_{a36}
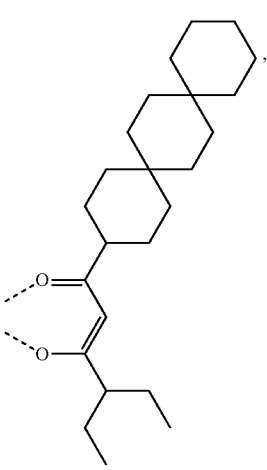
L_{a37}
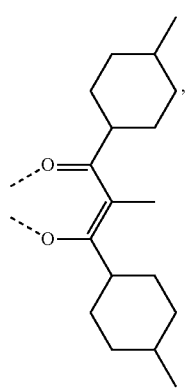
L_{a38}

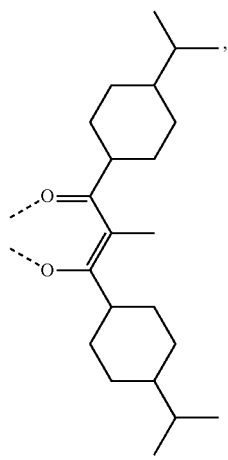 L<sub>a39</sub>
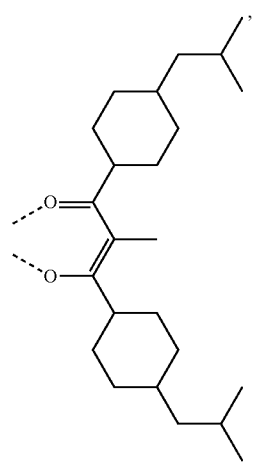 L<sub>a40</sub>
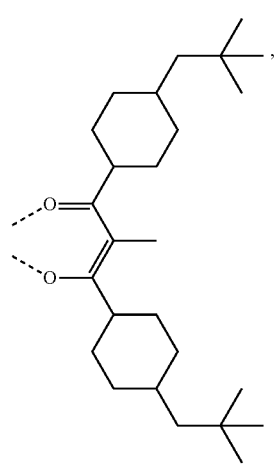 L<sub>a41</sub>
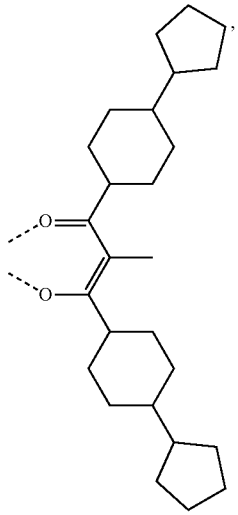 L<sub>a42</sub>
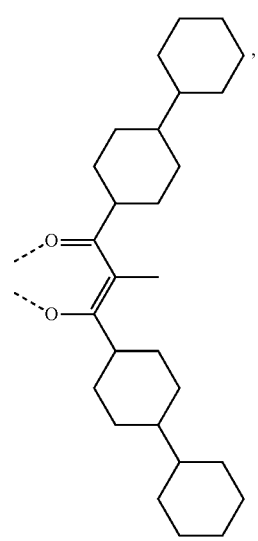 L<sub>a43</sub>
L<sub>a44</sub>

L<sub>a45</sub>
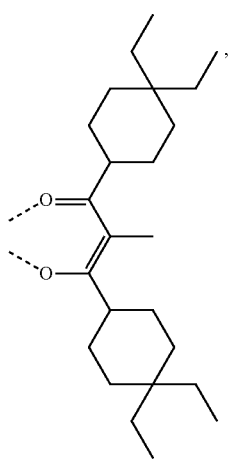
L<sub>a46</sub>
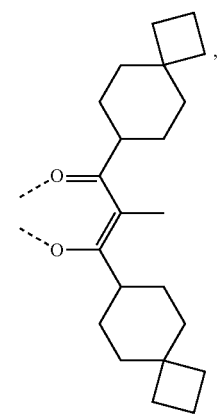
L<sub>a47</sub>
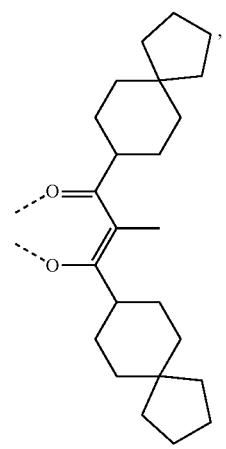
L<sub>a48</sub>
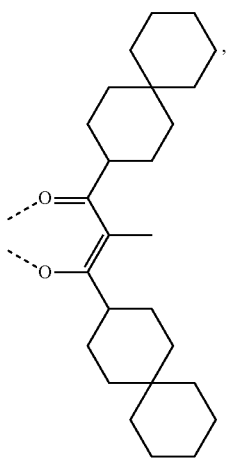
L<sub>a49</sub>
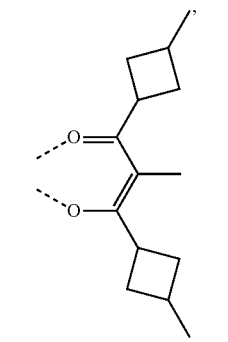
L<sub>a50</sub>
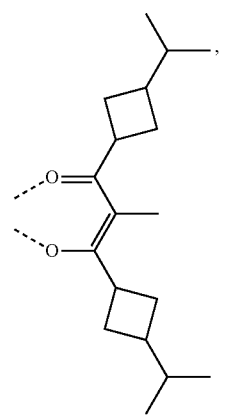
L<sub>a51</sub>
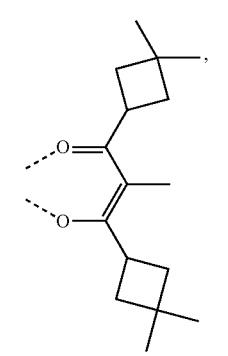

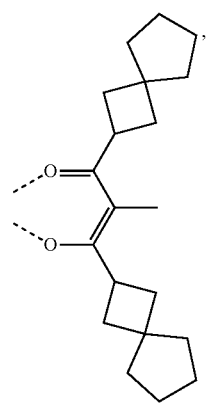 L_{a52}
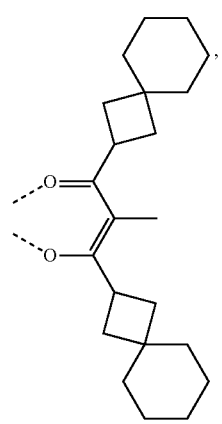 L_{a53}
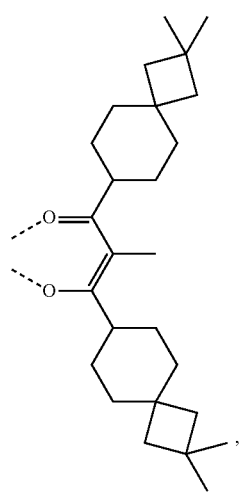 L_{a54}
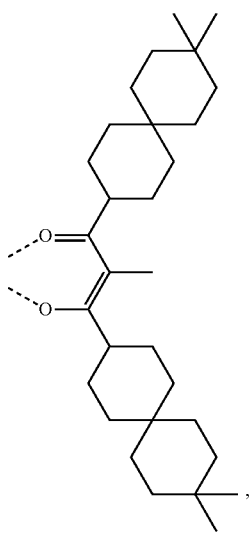 L_{a55}
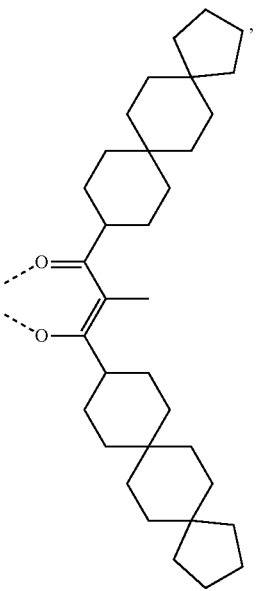 L_{a56}

L_{a57} 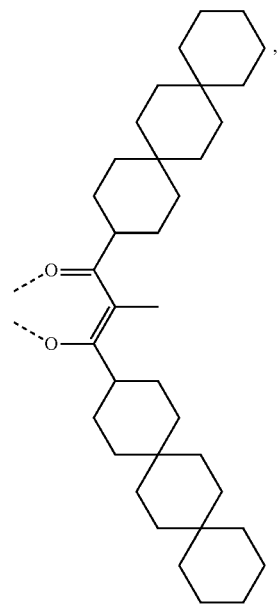
L_{a58} 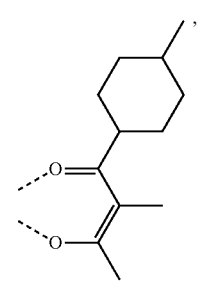
L_{a59} 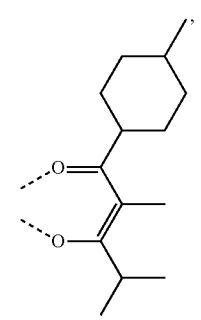
L_{a60} 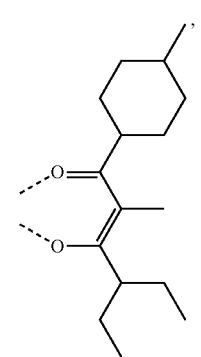
L_{a61} 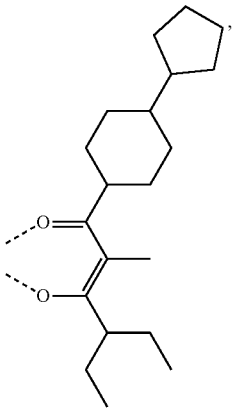
L_{a62} 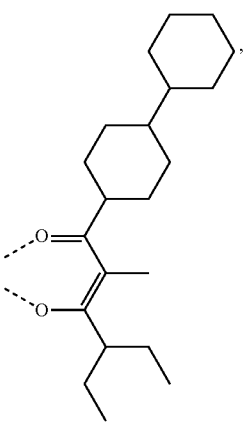
L_{a63} 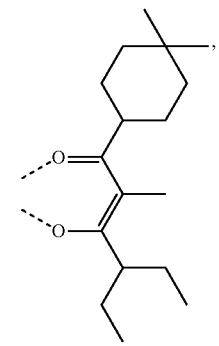
L_{a64} 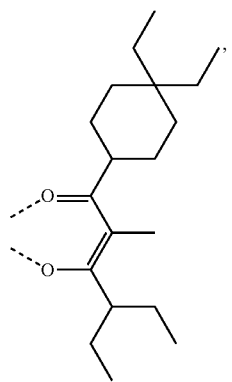

L_{a65}
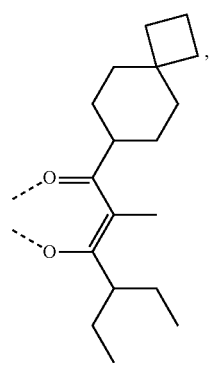
L_{a66}
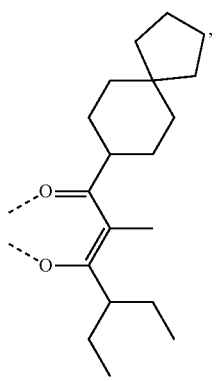
L_{a67}
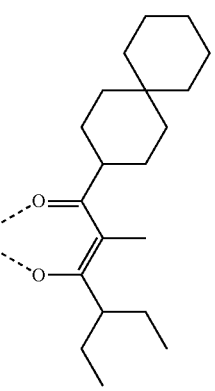
L_{a68}
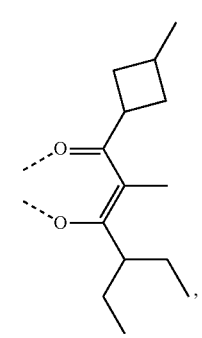
L_{a69}
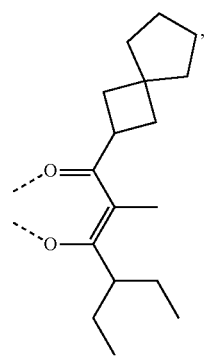
L_{a70}
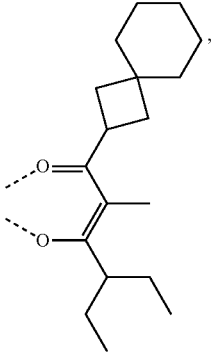
L_{a71}
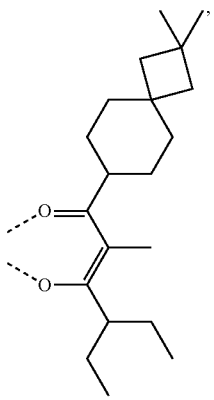
L_{a72}
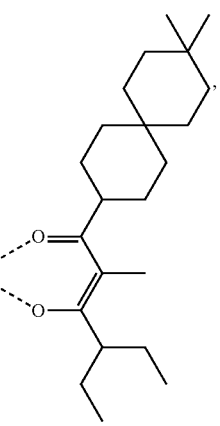

-continued
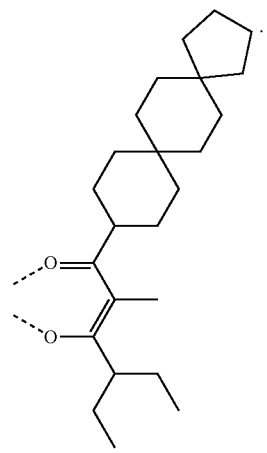
L_{a73}
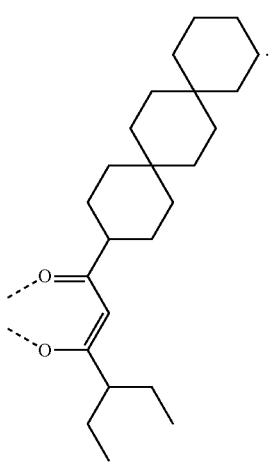
L_{a74}
12. The metal complex of claim 9, wherein the ligand $L_b$ is selected from the group consisting of:
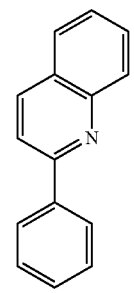
L_{b1}
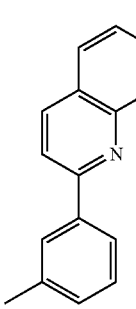
L_{b2}
-continued
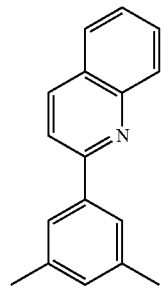
L_{b3}
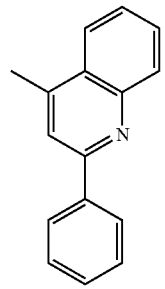
L_{b4}
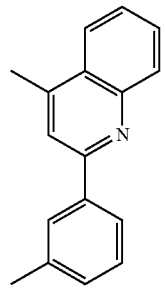
L_{b5}
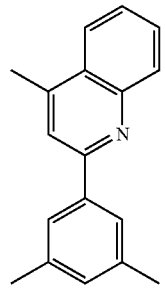
L_{b6}
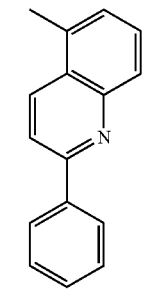
L_{b7}

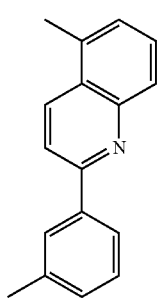
L_{b8}
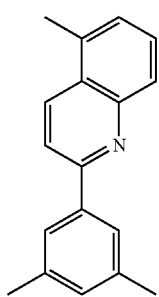
L_{b9}
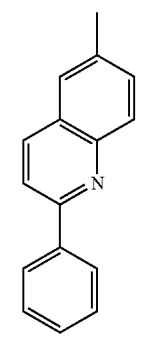
L_{b10}
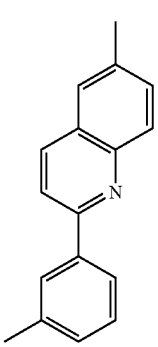
L_{b11}
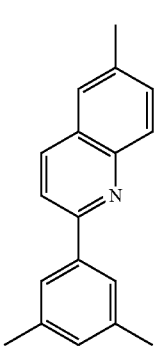
L_{b12}
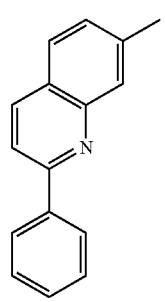
L_{b13}
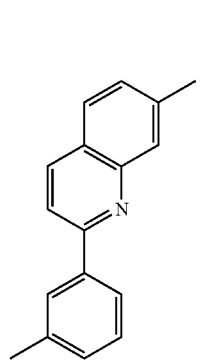
L_{b14}
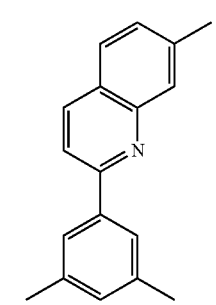
L_{b15}
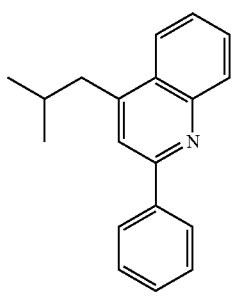
L_{b16}
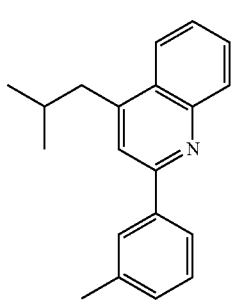
L_{b17}

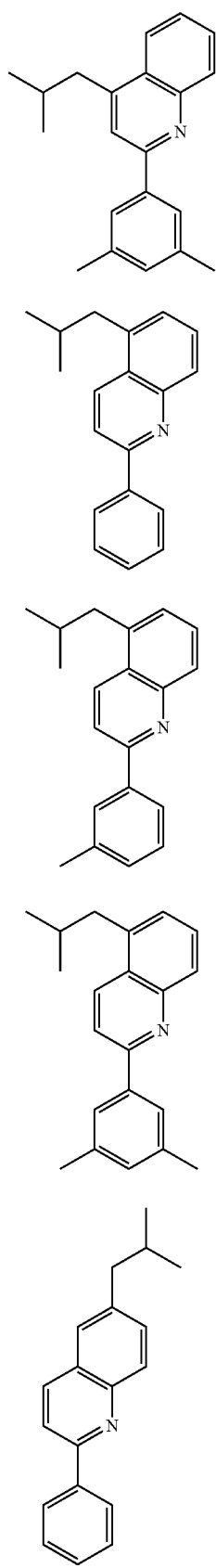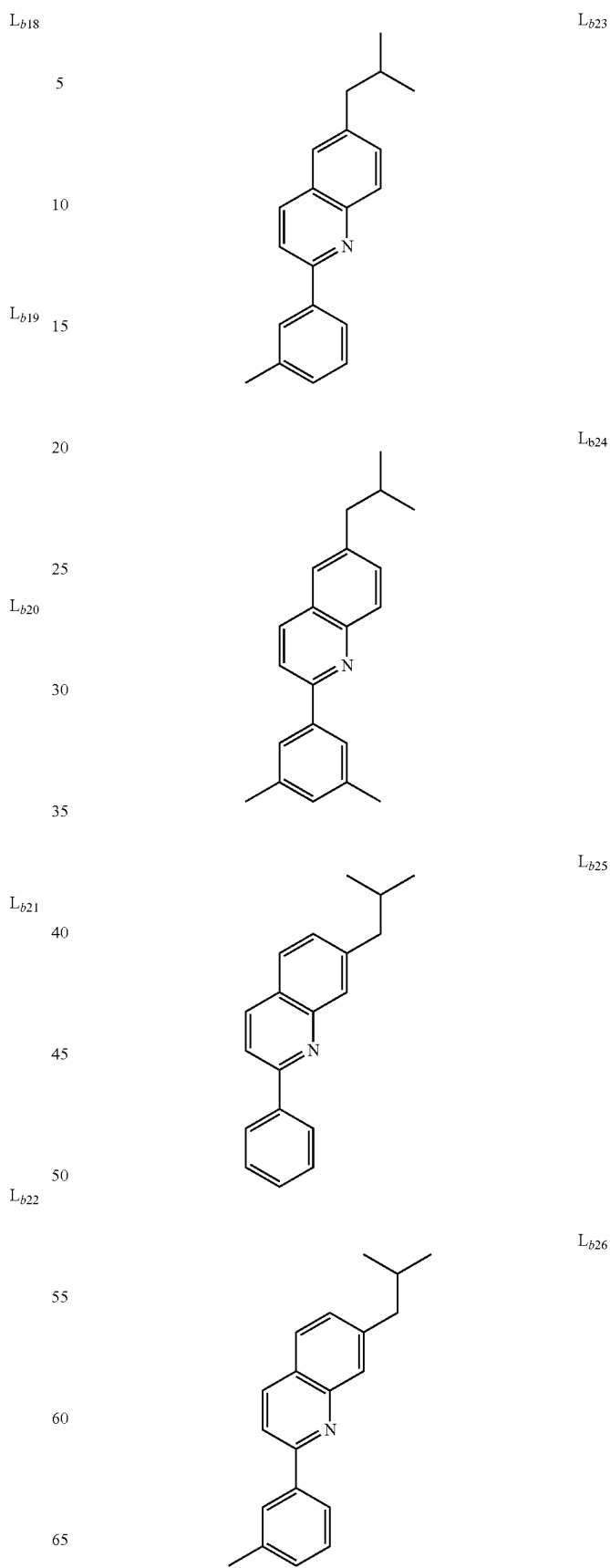

-continued
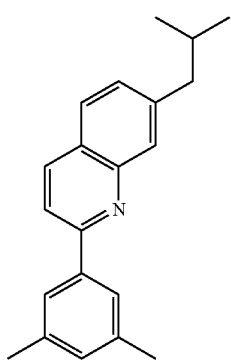 L$_{b27}$
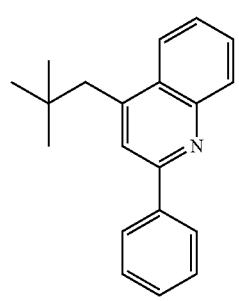 L$_{b28}$
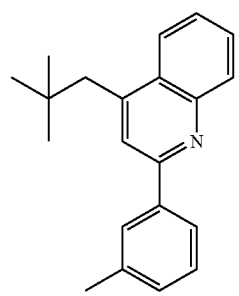 L$_{b29}$
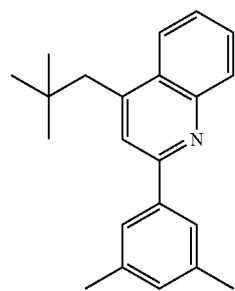 L$_{b30}$
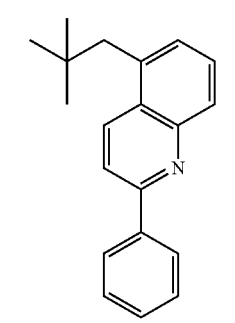 L$_{b31}$
-continued
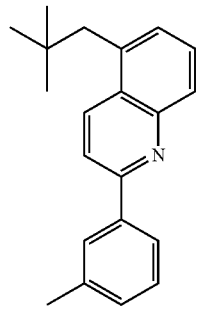 L$_{b32}$
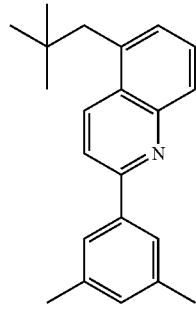 L$_{b33}$
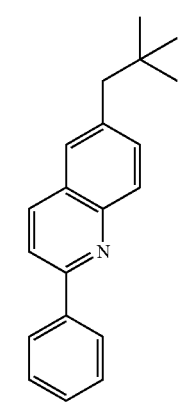 L$_{b34}$
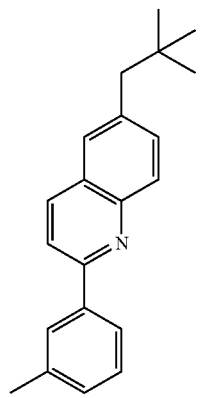 L$_{b35}$ L<sub>b36</sub>
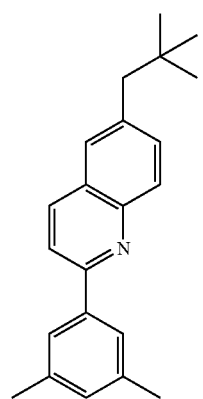
L<sub>b37</sub>
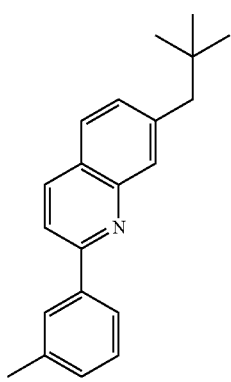
L<sub>b38</sub>
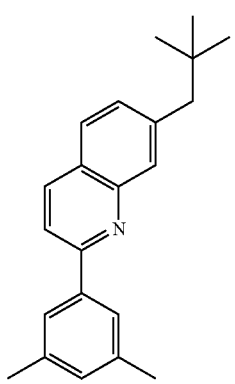
L<sub>b39</sub>
L<sub>b40</sub>
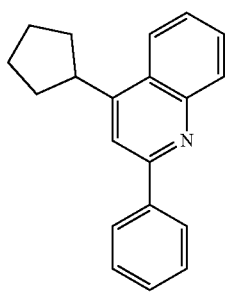
L<sub>b41</sub>
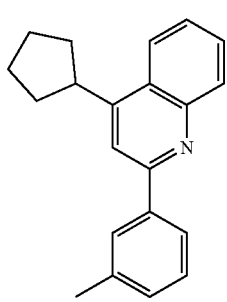
L<sub>b42</sub>
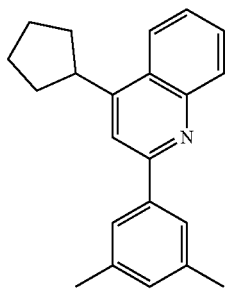
L<sub>b43</sub>
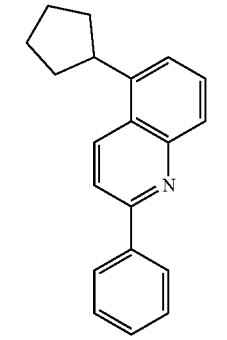
L<sub>b44</sub>
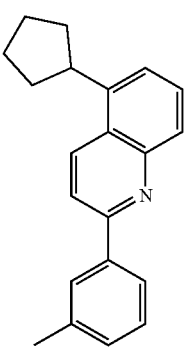

-continued
L<sub>b45</sub>
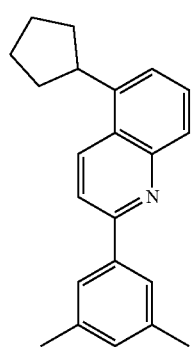
L<sub>b46</sub>
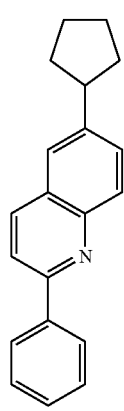
L<sub>b47</sub>
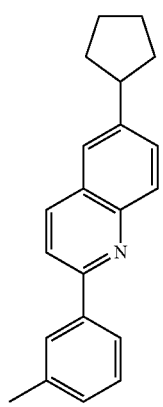
L<sub>b48</sub>
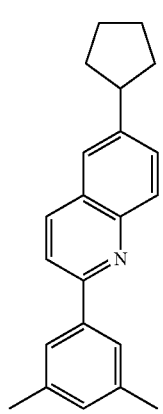
-continued
L<sub>b49</sub>
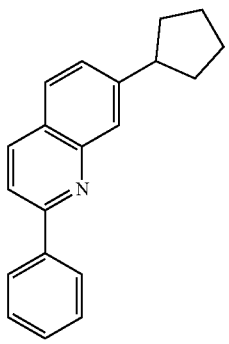
L<sub>b50</sub>
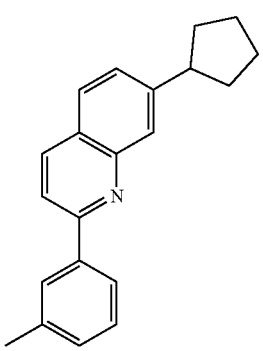
L<sub>b51</sub>
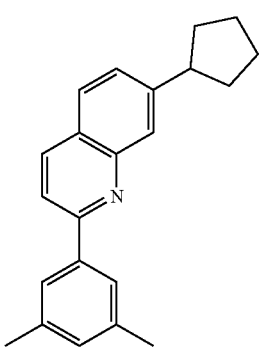
L<sub>b52</sub>
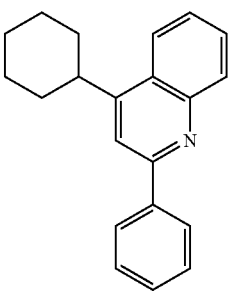
L<sub>b53</sub>
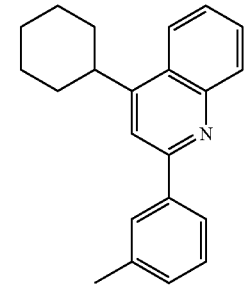

-continued
L$_{b54}$
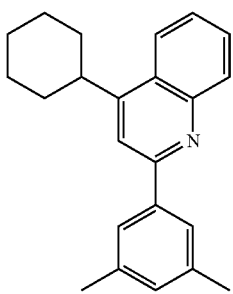
L$_{b55}$
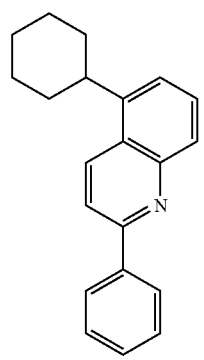
L$_{b56}$
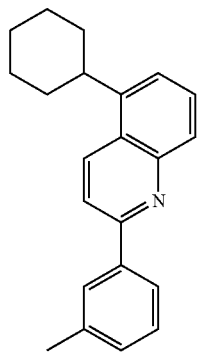
L$_{b57}$
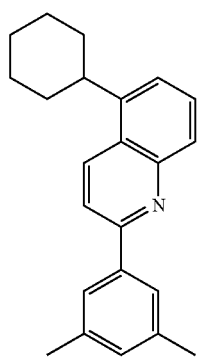
-continued
L$_{b58}$
L$_{b59}$
L$_{b60}$
L$_{b61}$
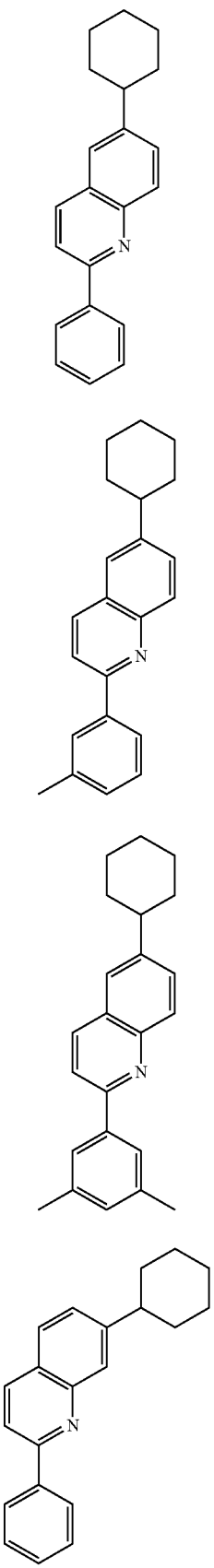

| | |
|---|---|
| L_{b62} 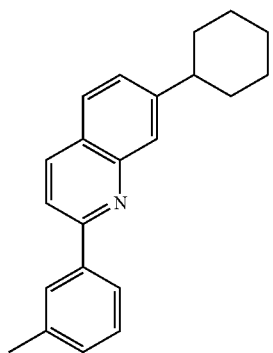 | L_{b67} 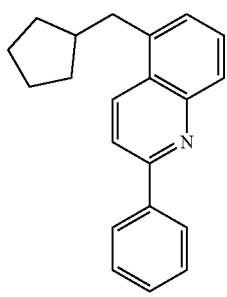 |
| L_{b63} 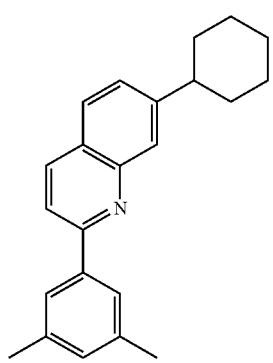 | L_{b68} 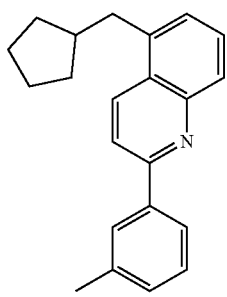 |
| L_{b64} 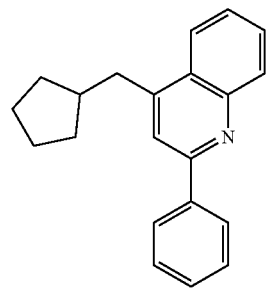 | L_{b69} 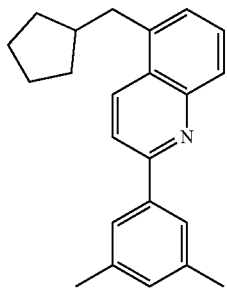 |
| L_{b65} 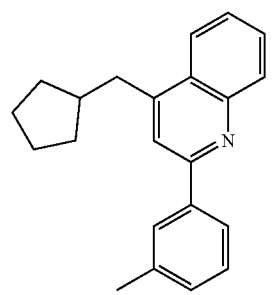 | L_{b70} 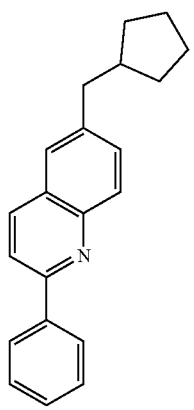 |
| L_{b66} 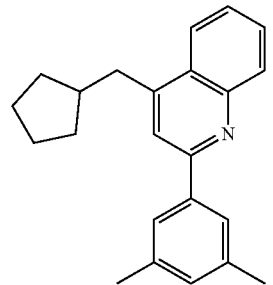 | |

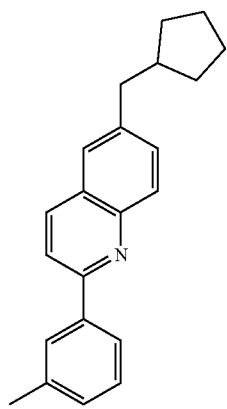 L_{b71}
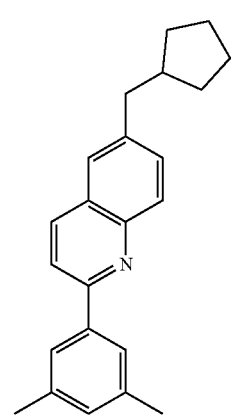 L_{b72}
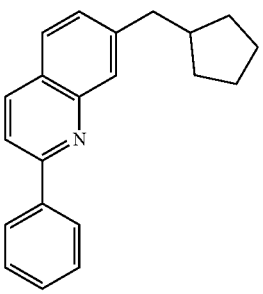 L_{b73}
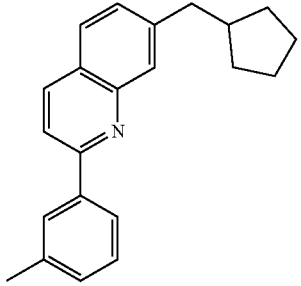 L_{b74}
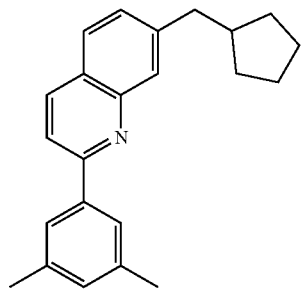 L_{b75}
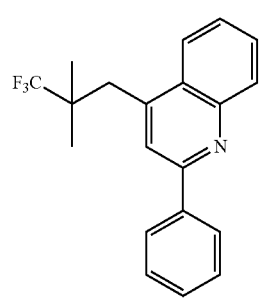 L_{b76}
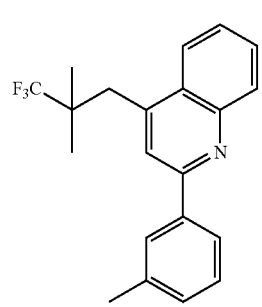 L_{b77}
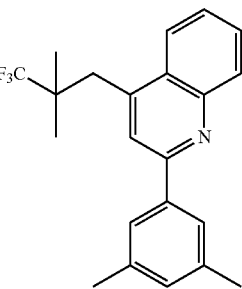 L_{b78}
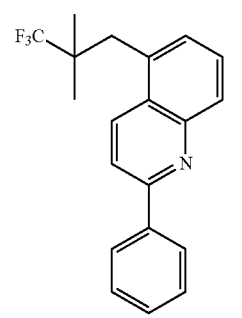 L_{b79}

L*b*80
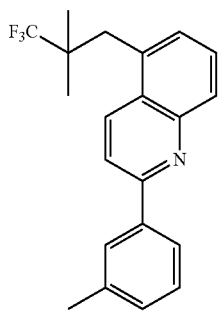
L*b*81
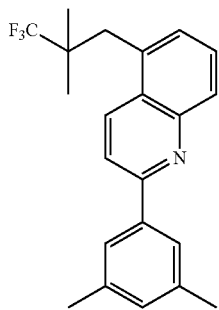
L*b*82
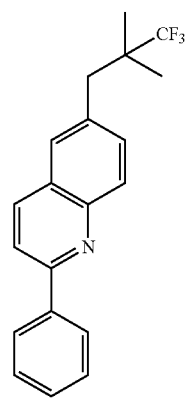
L*b*83
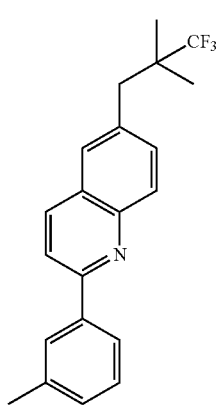
L*b*84
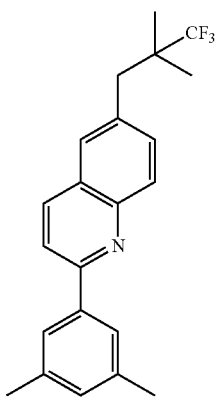
L*b*85
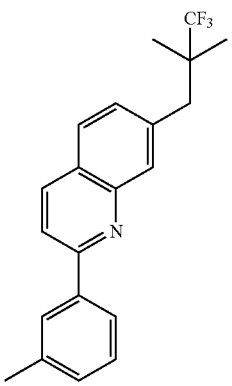
L*b*86
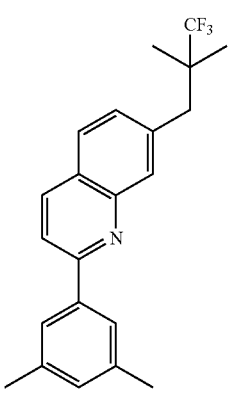
L*b*87

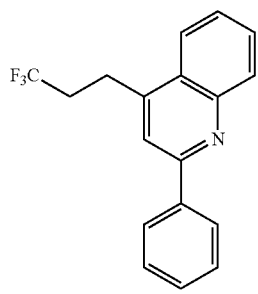 L<sub>b88</sub>
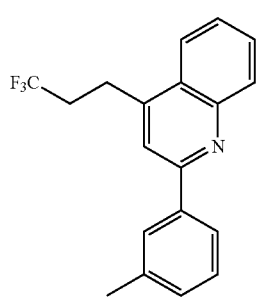 L<sub>b89</sub>
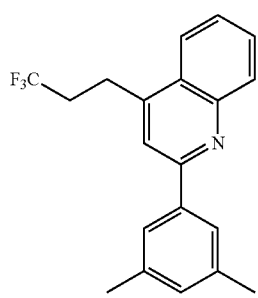 L<sub>b90</sub>
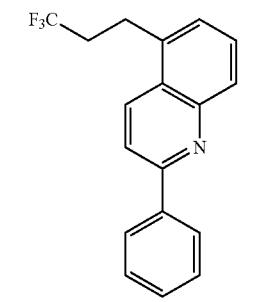 L<sub>b91</sub>
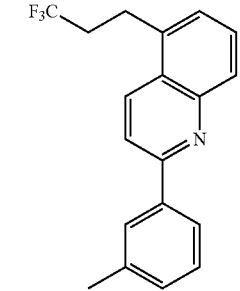 L<sub>b92</sub>
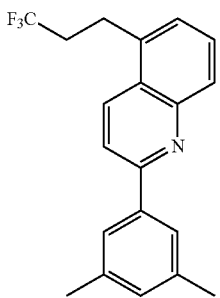 L<sub>b93</sub>
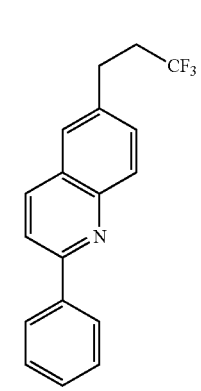 L<sub>b94</sub>
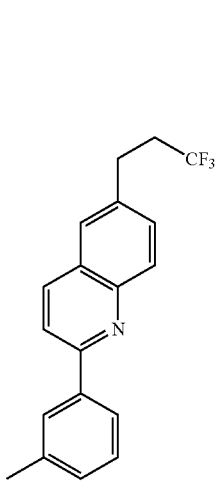 L<sub>b95</sub>
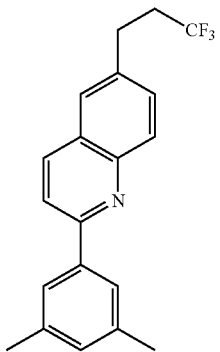 L<sub>b96</sub>

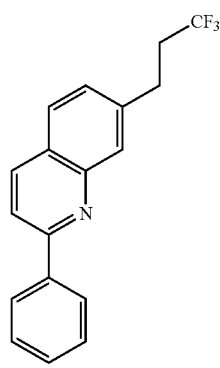 L<sub>b97</sub>
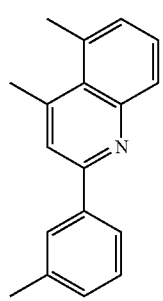 L<sub>b101</sub>
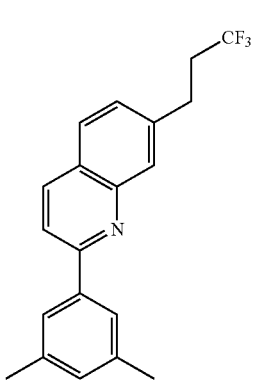 L<sub>b98</sub>
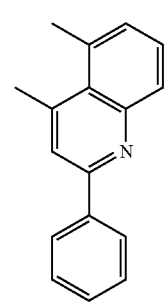 L<sub>b99</sub>

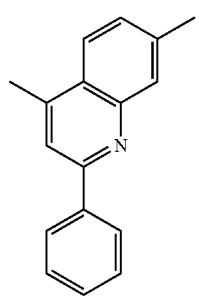
L_b106
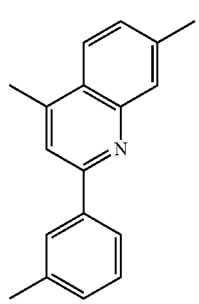
L_b107
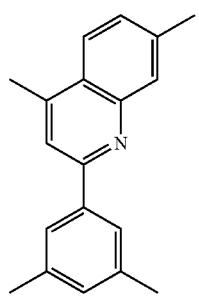
L_b108
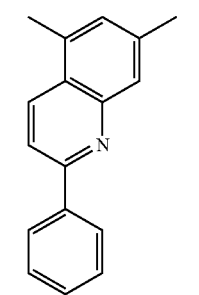
L_b109
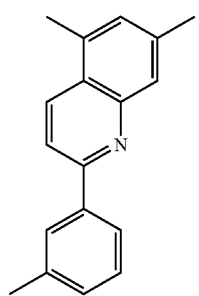
L_b110
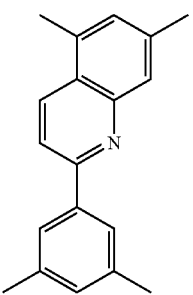
L_b111
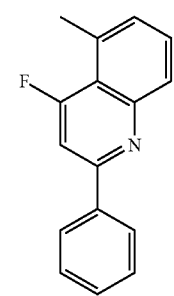
L_b112
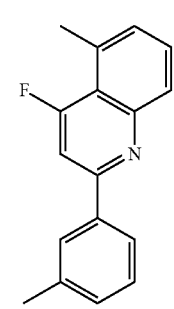
L_b113
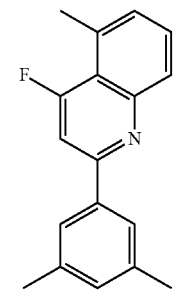
L_b114
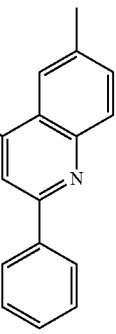
L_b115

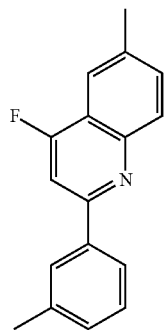 L<sub>b116</sub>
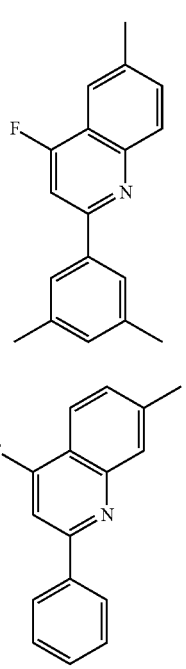
L<sub>b117</sub>
L<sub>b118</sub>
L<sub>b119</sub>
L<sub>b120</sub>
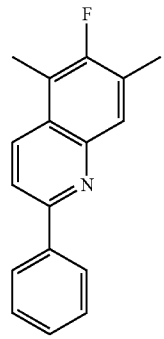 L<sub>b121</sub>
L<sub>b122</sub>
L<sub>b123</sub>
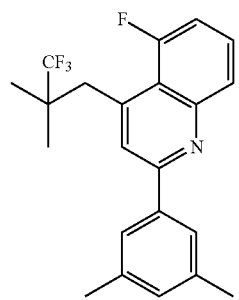 L<sub>b124</sub>

L<sub>b125</sub>
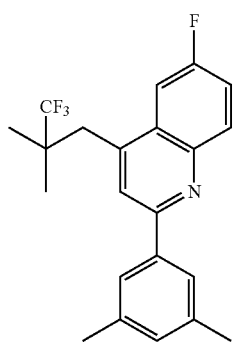
L<sub>b126</sub>
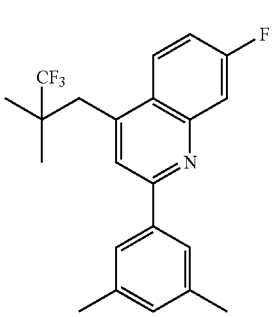
L<sub>b127</sub>
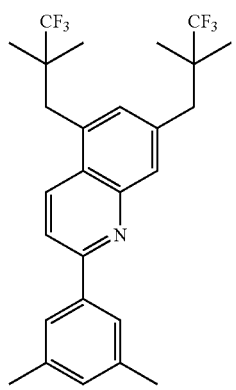
L<sub>b128</sub>
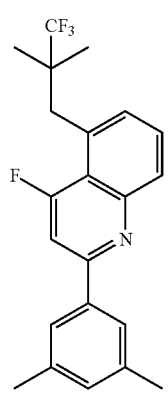
L<sub>b129</sub>
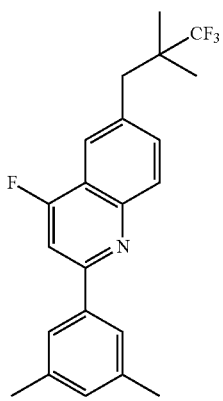
L<sub>b130</sub>
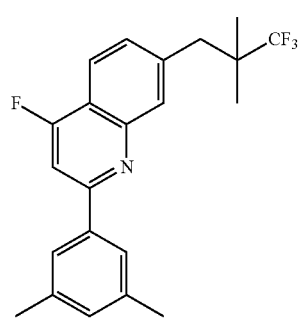
L<sub>b131</sub>
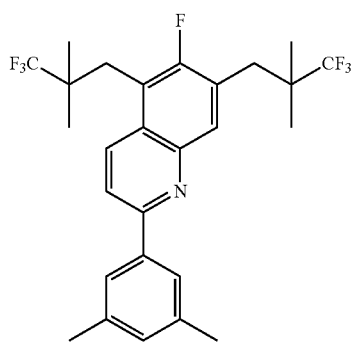
L<sub>b132</sub>
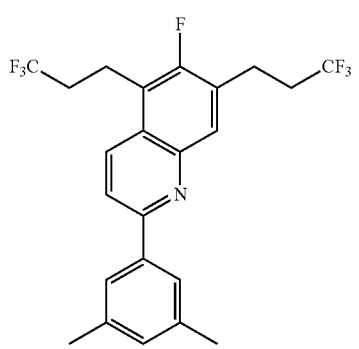

143
-continued
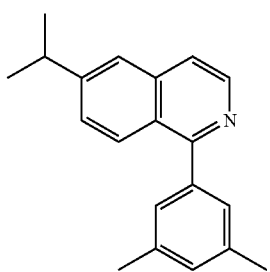
L<sub>b</sub>133
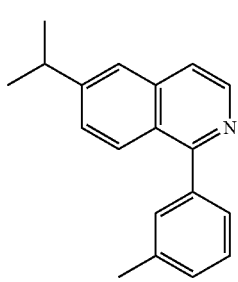
L<sub>b</sub>134
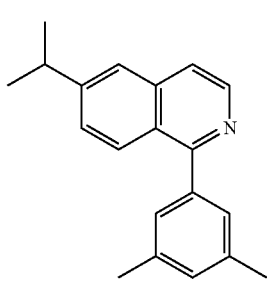
L<sub>b</sub>135
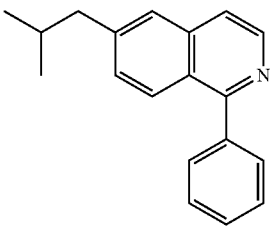
L<sub>b</sub>136
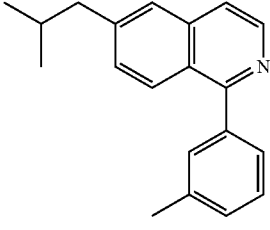
L<sub>b</sub>137
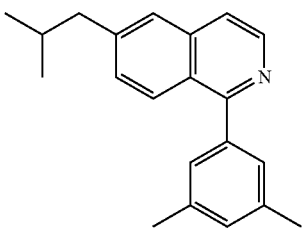
L<sub>b</sub>138
144
-continued
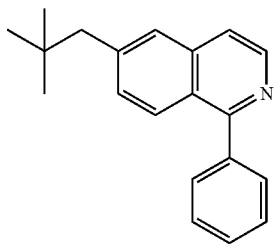
L<sub>b</sub>139
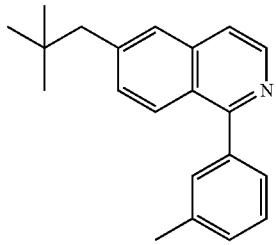
L<sub>b</sub>140
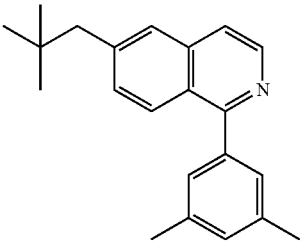
L<sub>b</sub>141
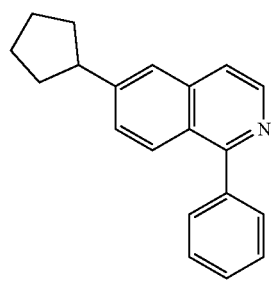
L<sub>b</sub>142
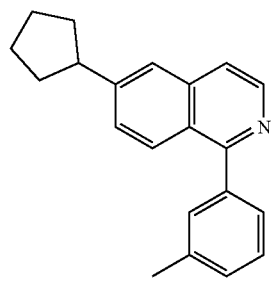
L<sub>b</sub>143
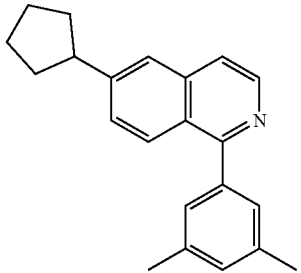
L<sub>b</sub>144

-continued
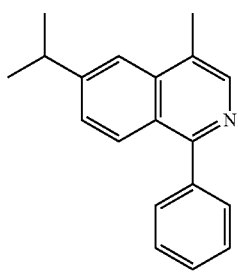
L$_{b}$145
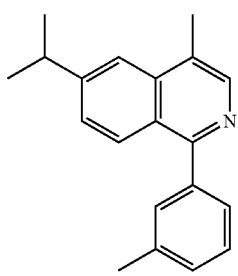
L$_{b}$146
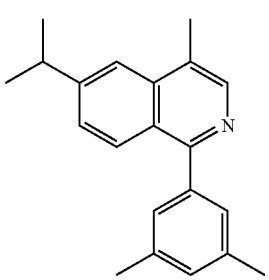
L$_{b}$147
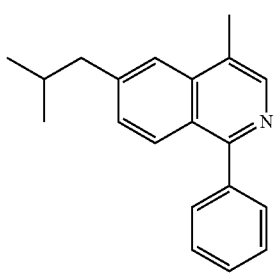
L$_{b}$148
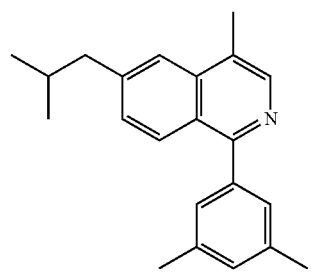
L$_{b}$150
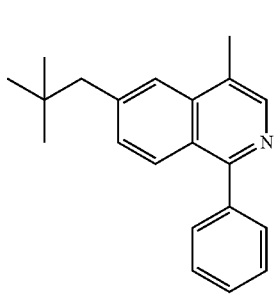
L$_{b}$151
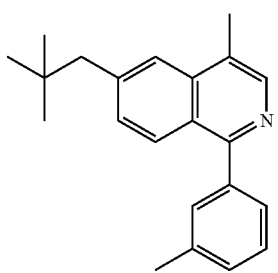
L$_{b}$152
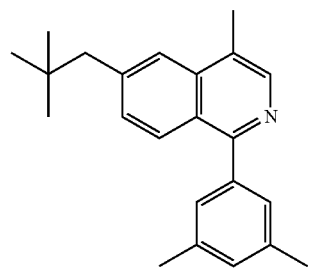
L$_{b}$153
L$_{b}$149
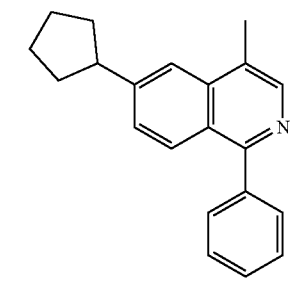
L$_{b}$154

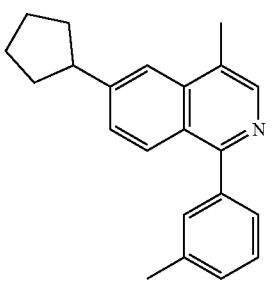 L_b155
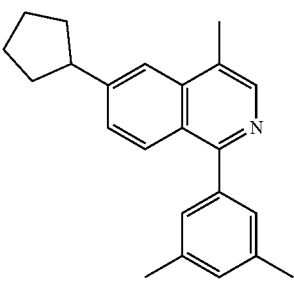 L_b156
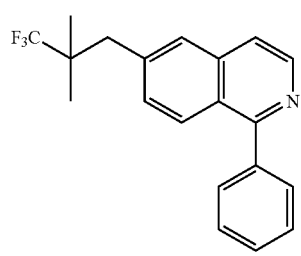 L_b157
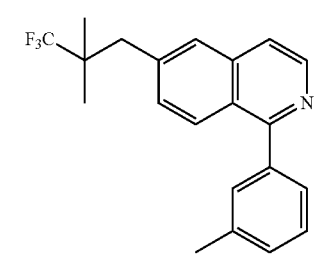 L_b158
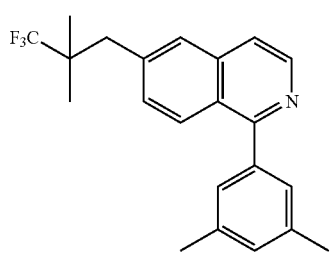 L_b159
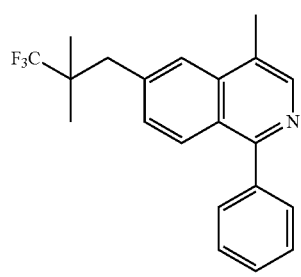 L_b160
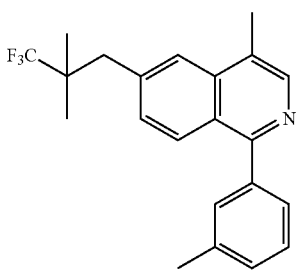 L_b161
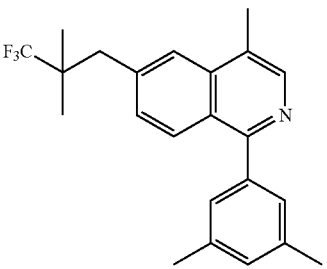 L_b162
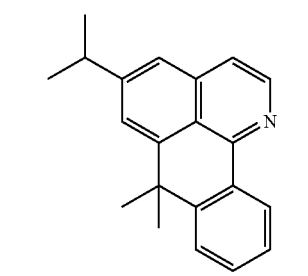 L_b163
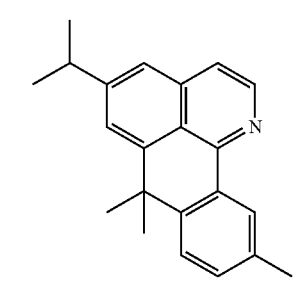 L_b164
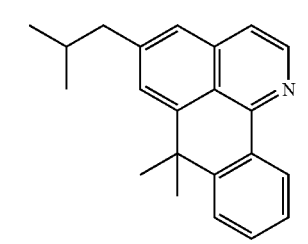 L_b165
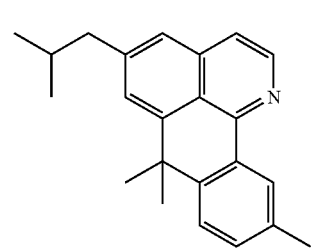 L_b166

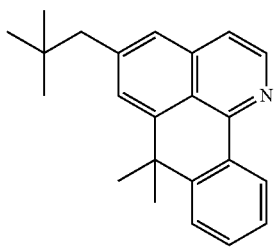 L*b*167
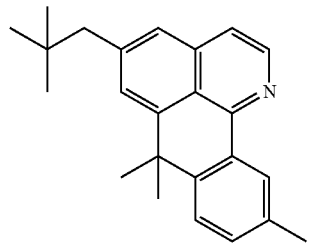 L*b*168
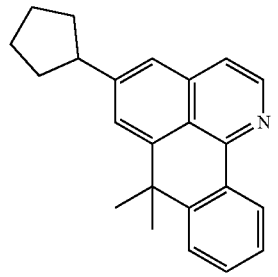 L*b*169
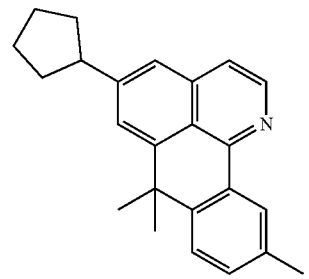 L*b*170
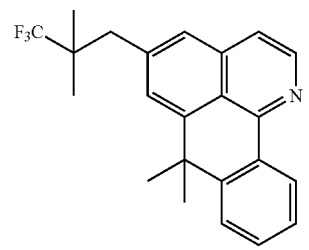 L*b*171
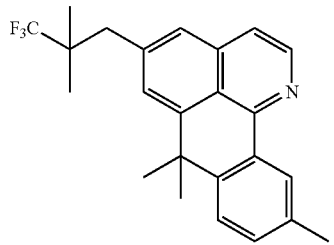 L*b*172
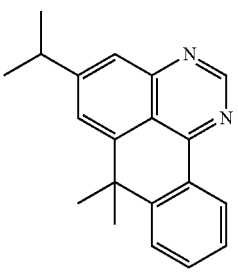 L*b*173
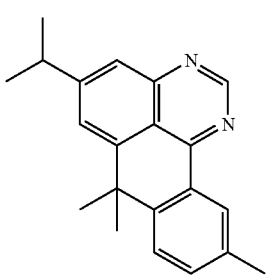 L*b*174
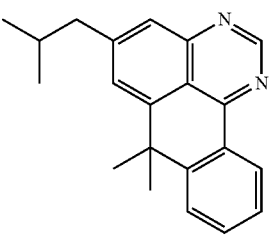 L*b*175
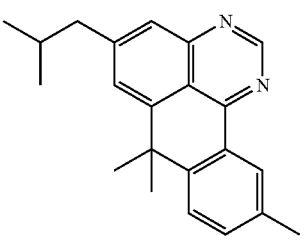 L*b*176
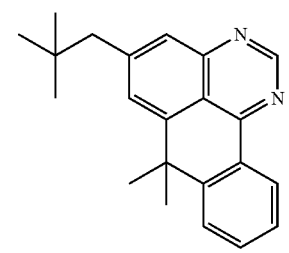 L*b*177
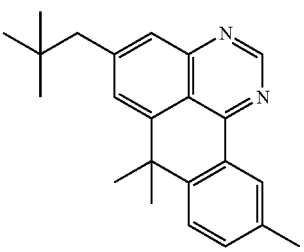 L*b*178

-continued
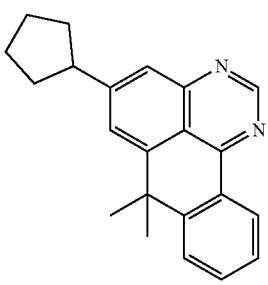
L_b179
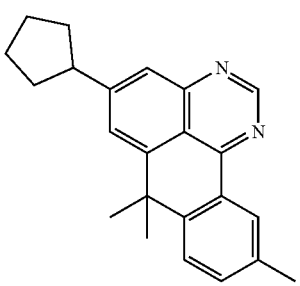
L_b180
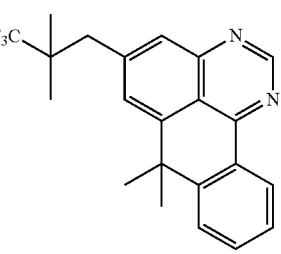
L_b181
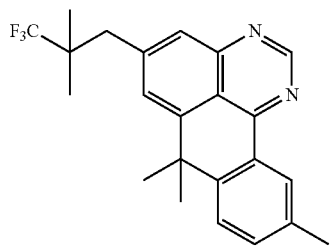
L_b182
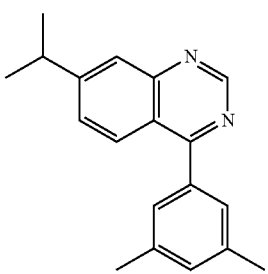
L_b183
-continued
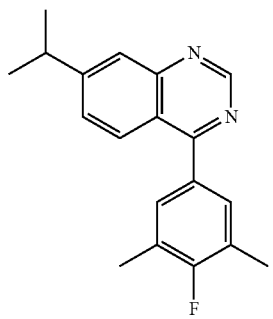
L_b184
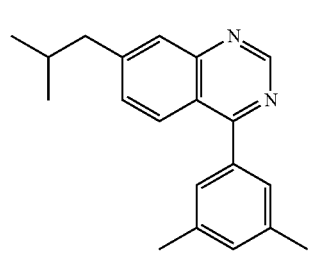
L_b185
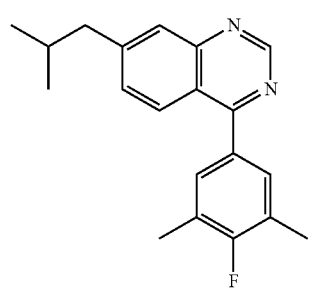
L_b186
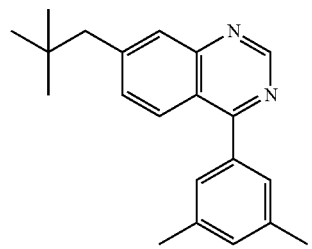
L_b187
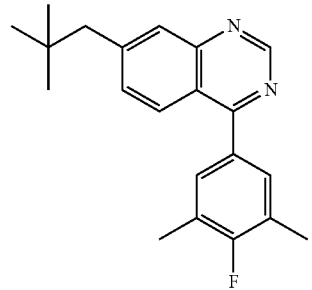
L_b188

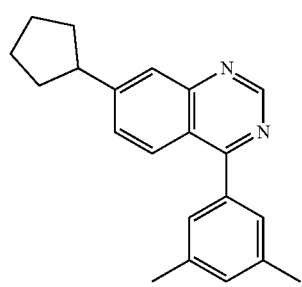
L<sub>b189</sub>
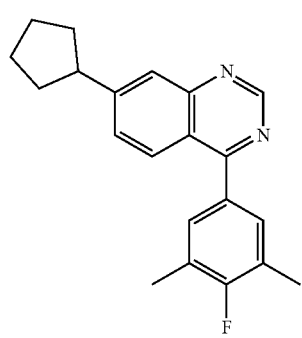
L<sub>b190</sub>
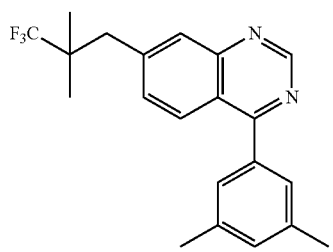
L<sub>b191</sub>
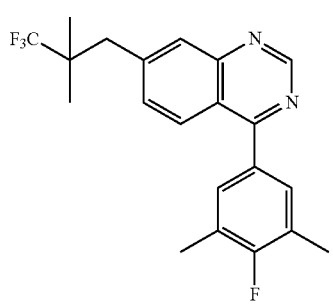
L<sub>b192</sub>
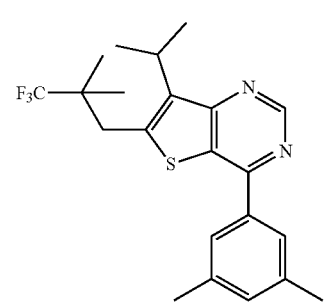
L<sub>b193</sub>
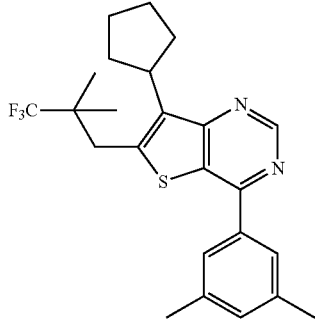
L<sub>b194</sub>
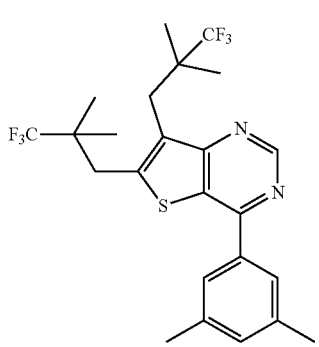
L<sub>b195</sub>
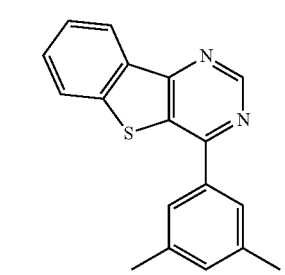
L<sub>b196</sub>
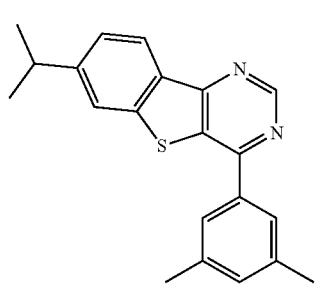
L<sub>b197</sub>
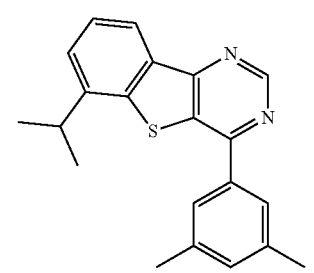
L<sub>b198</sub>

-continued $L_{b199}$
$L_{b200}$

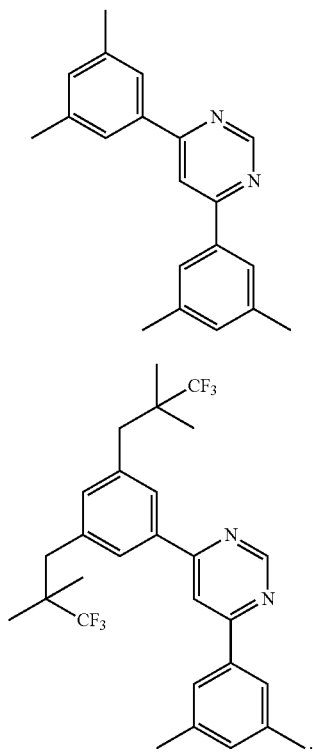

13. The metal complex of claim 10, wherein $L_a$ and $L_b$ can be partially or fully deuterated.

14. A formulation comprising the metal complex of claim 1.

15. The electroluminescent device according to claim 2, wherein the metal is selected from the group consisting of Pt and Ir.

16. The formulation of claim 14, wherein the metal is selected from the group consisting of Pt and Ir.

17. The device of claim 15, wherein the organic layer is the emissive layer and the metal complex is the emitter.

18. The device of claim 15, wherein the device emits red light.

19. The device of claim 15, wherein the organic layer further comprises a host compound.

20. The device of claim 19, wherein the host compound comprises a donor part and an acceptor part.

21. The device of claim 19, wherein the host compound comprises at least one chemical group selected from the group consisting of carbazole, azacarbazole, indolocarbazole, dibenzothiophene, dibenzofuran, triphenylene, naphthalene, phenanthrene, triazine, quinazoline, quinoxaline, azadibenzothiophene, azadibenzofuran and the combinations thereof.

* * * * *